United States Patent
Hardin et al.

(10) Patent No.: US 10,696,851 B2
(45) Date of Patent: Jun. 30, 2020

(54) PRINT-ON PASTES FOR MODIFYING MATERIAL PROPERTIES OF METAL PARTICLE LAYERS

(71) Applicant: Hitachi Chemical Co., Ltd., Tokyo (JP)

(72) Inventors: Brian E. Hardin, San Carlos, CA (US); Erik Sauar, Oslo (NO); Dhea Suseno, Oakland, CA (US); Jesse J. Hinricher, Pipestone, MN (US); Jennifer Huang, Saratoga, CA (US); Tom Yu-Tang Lin, Berkeley, CA (US); Stephen T. Connor, San Francisco, CA (US); Daniel J. Hellebusch, Oakland, CA (US); Craig H. Peters, Belmont, CA (US)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 15/360,955

(22) Filed: Nov. 23, 2016

(65) Prior Publication Data

US 2017/0145224 A1    May 25, 2017

Related U.S. Application Data

(60) Provisional application No. 62/423,020, filed on Nov. 16, 2016, provisional application No. 62/371,236, (Continued)

(51) Int. Cl.
*C09D 5/24* (2006.01)
*H01L 31/0224* (2006.01)
(Continued)

(52) U.S. Cl.
CPC ............... *C09D 5/24* (2013.01); *B05D 1/02* (2013.01); *B23K 1/0016* (2013.01); (Continued)

(58) Field of Classification Search
CPC .... C09D 5/24; C03C 8/16; C03C 8/18; C03C 2205/00; H01L 31/022425
(Continued)

(56) References Cited

U.S. PATENT DOCUMENTS

| | | |
|---|---|---|
| 2,580,773 A | 1/1952 | Heiman |
| 2,662,831 A | 12/1953 | R |

(Continued)

FOREIGN PATENT DOCUMENTS

| | | |
|---|---|---|
| CN | 101359564 A | 2/2009 |
| CN | 101353230 B | 6/2012 |

(Continued)

OTHER PUBLICATIONS

Translation of DE 10 2011 104 396.
(Continued)

*Primary Examiner* — Khanh T Nguyen
(74) *Attorney, Agent, or Firm* — R'Sue Popowich Caron

(57) ABSTRACT

Intercalation pastes for use with semiconductor devices are disclosed. The pastes contain precious metal particles, intercalating particles, and an organic vehicle and can be used to improve the material properties of metal particle layers. Specific formulations have been developed to be screen-printed directly onto a dried metal particle layer and fired to make a fired multilayer stack. The fired multilayer stack can be tailored to create a solderable surface, high mechanical strength, and low contact resistance. In some embodiments, the fired multilayer stack can etch through a dielectric layer to improve adhesion to a substrate. Such pastes can be used to increase the efficiency of silicon solar cells, specifically (Continued)

multi- and mono-crystalline silicon back-surface field (BSF), and passivated emitter and rear contact (PERC) photovoltaic cells. Other applications include integrated circuits and more broadly, electronic devices.

26 Claims, 31 Drawing Sheets

Related U.S. Application Data filed on Aug. 5, 2016, provisional application No. 62/318,556, filed on Apr. 5, 2016, provisional application No. 62/259,636, filed on Nov. 24, 2015.

(51) Int. Cl.
| | |
|---|---|
| C03C 8/18 | (2006.01) |
| C03C 8/16 | (2006.01) |
| C09D 1/00 | (2006.01) |
| H02S 40/34 | (2014.01) |
| B23K 1/00 | (2006.01) |
| B23K 35/02 | (2006.01) |
| B23K 35/28 | (2006.01) |
| B23K 35/30 | (2006.01) |
| B23K 35/36 | (2006.01) |
| H01L 31/02 | (2006.01) |
| B33Y 10/00 | (2015.01) |
| B05D 1/02 | (2006.01) |
| H01L 31/18 | (2006.01) |
| H01L 31/049 | (2014.01) |
| H01L 31/0203 | (2014.01) |

(52) U.S. Cl.
CPC .......... *B23K 35/025* (2013.01); *B23K 35/286* (2013.01); *B23K 35/3006* (2013.01); *B23K 35/3612* (2013.01); *B33Y 10/00* (2014.12); *C03C 8/16* (2013.01); *C03C 8/18* (2013.01); *C09D 1/00* (2013.01); *H01L 31/0201* (2013.01); *H01L 31/0203* (2013.01); *H01L 31/022425* (2013.01); *H01L 31/022433* (2013.01); *H01L 31/022441* (2013.01); *H01L 31/049* (2014.12); *H01L 31/1804* (2013.01); *H02S 40/34* (2014.12); *C03C 2205/00* (2013.01); *Y02E 10/50* (2013.01)

(58) Field of Classification Search
USPC ........................................................ 252/500
See application file for complete search history.

(56) References Cited

U.S. PATENT DOCUMENTS

| | | | |
|---|---|---|---|
| 2,852,366 | A | 9/1958 | Jenkins |
| 3,489,657 | A | 1/1970 | R et al. |
| 3,744,121 | A | 7/1973 | Nagano et al. |
| 3,909,209 | A | 9/1975 | Kruper et al. |
| 3,930,093 | A * | 12/1975 | Short .................. H01B 1/16 428/208 |
| 3,949,118 | A | 4/1976 | Nagano et al. |
| 4,001,146 | A | 1/1977 | Horowitz |
| 4,045,245 | A | 8/1977 | Coleman et al. |
| 4,122,232 | A | 10/1978 | Kuo |
| 4,130,854 | A | 12/1978 | Hertz |
| 4,137,361 | A | 1/1979 | Deffeyes et al. |
| 4,347,165 | A | 8/1982 | Matheson |
| 4,397,812 | A | 8/1983 | Mallory |
| 4,485,153 | A | 11/1984 | Janikowski et al. |
| 4,492,812 | A | 1/1985 | Lindmayer |
| 4,635,701 | A | 1/1987 | Sare et al. |
| 4,800,065 | A | 1/1989 | Christodoulou et al. |
| 4,833,040 | A | 5/1989 | Fishman |
| 4,873,148 | A | 10/1989 | Kemp et al. |
| 5,118,362 | A | 6/1992 | Angelo et al. |
| 5,162,062 | A | 11/1992 | Carroll et al. |
| 5,178,685 | A | 1/1993 | Borenstein et al. |
| 5,279,682 | A | 1/1994 | Wald et al. |
| 5,320,684 | A | 6/1994 | Amick et al. |
| 5,645,765 | A | 7/1997 | Asada et al. |
| 5,714,238 | A | 2/1998 | Komagata et al. |
| 5,840,432 | A | 11/1998 | Hirai et al. |
| 6,059,952 | A | 5/2000 | Kang et al. |
| 6,084,175 | A | 7/2000 | Perry et al. |
| 6,156,237 | A | 12/2000 | Kubota et al. |
| 6,180,869 | B1 | 1/2001 | Meier et al. |
| 6,262,359 | B1 | 7/2001 | Meier et al. |
| 6,372,158 | B1 | 4/2002 | Hashimoto et al. |
| 6,632,730 | B1 | 10/2003 | Meier et al. |
| 6,710,239 | B2 | 3/2004 | Tanaka |
| 6,770,369 | B1 | 8/2004 | Oyamada |
| 7,384,447 | B2 | 6/2008 | Kodas et al. |
| 7,470,416 | B2 | 12/2008 | Ishida |
| 7,718,093 | B2 | 5/2010 | Konno |
| 8,093,491 | B2 | 1/2012 | Sridharan et al. |
| 8,597,397 | B2 | 12/2013 | Kunze et al. |
| 8,610,289 | B2 | 12/2013 | Wildpanner et al. |
| 8,696,946 | B2 | 4/2014 | Matsumoto et al. |
| 8,696,948 | B2 | 4/2014 | Hang et al. |
| 8,697,476 | B2 | 4/2014 | Borland |
| 8,748,327 | B2 | 6/2014 | Park et al. |
| 8,884,277 | B2 | 11/2014 | Neidert et al. |
| 9,275,772 | B2 | 3/2016 | Pham et al. |
| 9,349,883 | B2 | 5/2016 | Wang |
| 9,484,484 | B2 | 11/2016 | Morad et al. |
| 2004/0155227 | A1 | 8/2004 | Bechtloff et al. |
| 2006/0022173 | A1 | 2/2006 | Yamakawa et al. |
| 2006/0042681 | A1 | 3/2006 | Korman |
| 2006/0231802 | A1 | 10/2006 | Konno |
| 2006/0289055 | A1 | 12/2006 | Sridharan et al. |
| 2007/0056403 | A1 | 3/2007 | Kubota |
| 2007/0138659 | A1 | 6/2007 | Konno |
| 2007/0209697 | A1 | 9/2007 | Karakida et al. |
| 2008/0143785 | A1 | 6/2008 | Houjou |
| 2008/0230119 | A1 | 9/2008 | Akimoto |
| 2009/0029057 | A1 * | 1/2009 | Brown .................. B22F 1/0003 427/383.5 |
| 2009/0211626 | A1 | 8/2009 | Akimoto |
| 2010/0120191 | A1 | 5/2010 | Borden et al. |
| 2010/0154875 | A1 | 6/2010 | Borland et al. |
| 2010/0163101 | A1 | 7/2010 | Kumar et al. |
| 2010/0227433 | A1 | 9/2010 | Konno |
| 2010/0243048 | A1 | 9/2010 | Laudisio et al. |
| 2010/0269893 | A1 | 10/2010 | Prince et al. |
| 2011/0048527 | A1 | 3/2011 | Irizarry et al. |
| 2011/0140226 | A1 | 6/2011 | Jin et al. |
| 2011/0192457 | A1 | 8/2011 | Nakayama et al. |
| 2011/0197960 | A1 | 8/2011 | Pham et al. |
| 2011/0223713 | A1 | 9/2011 | Akimoto |
| 2011/0232747 | A1 | 9/2011 | Mikeska et al. |
| 2011/0303898 | A1 | 12/2011 | Tian et al. |
| 2011/0315217 | A1 | 12/2011 | Gee |
| 2012/0082948 | A1 | 4/2012 | Huh et al. |
| 2012/0085401 | A1 | 4/2012 | Borland et al. |
| 2012/0186634 | A1 | 7/2012 | Jee et al. |
| 2012/0279563 | A1 | 11/2012 | Meier et al. |
| 2012/0312369 | A1 | 12/2012 | Hang et al. |
| 2013/0098431 | A1 | 4/2013 | Chen et al. |
| 2013/0125951 | A1 | 5/2013 | Sakuma et al. |
| 2013/0247972 | A1 | 9/2013 | Mungekar et al. |
| 2013/0248777 | A1 | 9/2013 | Sgriccia et al. |
| 2013/0256606 | A1 | 10/2013 | Matsumoto et al. |
| 2013/0270489 | A1 | 10/2013 | Wang et al. |
| 2013/0277624 | A1 | 10/2013 | Yang et al. |
| 2013/0284250 | A1 | 10/2013 | Hang et al. |
| 2013/0319496 | A1 | 12/2013 | Karpowich et al. |
| 2014/0020743 | A1 | 1/2014 | Konno |
| 2014/0026953 | A1 | 1/2014 | Zhang et al. |
| 2014/0048116 | A1 | 2/2014 | Schulz et al. |
| 2014/0124027 | A1 | 5/2014 | Teshima et al. |
| 2014/0174527 | A1 | 6/2014 | Borland et al. |

(56) References Cited

U.S. PATENT DOCUMENTS

| | | | |
|---|---|---|---|
| 2014/0175340 A1 | 6/2014 | Choi et al. | |
| 2014/0178671 A1 | 6/2014 | Dreezen et al. | |
| 2014/0210073 A1 | 7/2014 | Tanaka | |
| 2014/0239238 A1 | 8/2014 | Tsunoda et al. | |
| 2014/0374669 A1 | 12/2014 | Hardin et al. | |
| 2015/0035137 A1 | 2/2015 | Nishimoto et al. | |
| 2015/0060742 A1 | 3/2015 | Glicksman et al. | |
| 2015/0083213 A1 | 3/2015 | Hardin et al. | |
| 2015/0090326 A1 | 4/2015 | Sewell | |
| 2015/0099182 A1* | 4/2015 | Singh | H01M 4/366 429/231.6 |
| 2015/0194546 A1* | 7/2015 | Sun | H01B 1/22 136/256 |
| 2015/0221789 A1 | 8/2015 | Hang et al. | |
| 2015/0243810 A1 | 8/2015 | Raskar et al. | |
| 2015/0243812 A1 | 8/2015 | Hardin et al. | |
| 2016/0040271 A1* | 2/2016 | Ogi | H05K 1/092 252/514 |
| 2016/0049531 A1 | 2/2016 | König et al. | |
| 2016/0225926 A1 | 8/2016 | Schmitt et al. | |

FOREIGN PATENT DOCUMENTS

| | | | |
|---|---|---|---|
| CN | 101931013 B | 6/2012 | |
| CN | 102969039 A | 3/2013 | |
| CN | 103680673 A | 3/2014 | |
| CN | 104867536 A | 8/2015 | |
| CN | 104778988 B | 10/2017 | |
| DE | 102011104396 A1 | 12/2012 | |
| EP | 2196514 A1 | 6/2010 | |
| EP | 1732137 B1 | 10/2011 | |
| EP | 2787511 A1 | 10/2014 | |
| EP | 2896602 A1 | 7/2015 | |
| TW | 201243865 | 1/2012 | |
| TW | 201445582 A | 8/2014 | |
| TW | 201442961 A | 11/2014 | |
| TW | 201523897 A | 6/2015 | |
| TW | 201533750 A | 12/2016 | |
| WO | 2009032429 A1 | 3/2009 | |
| WO | 2013036510 A1 | 3/2013 | |
| WO | 2013090570 A1 | 6/2013 | |
| WO | 2013158857 A1 | 10/2013 | |
| WO | 2014174984 A1 | 10/2014 | |
| WO | WO 2015163570 A1 * | 10/2015 | B22F 1/02 |
| WO | 2016099562 A1 | 6/2016 | |

OTHER PUBLICATIONS

Zhu, "Coating different thickness nickel—boron nanolayers onto boron carbide particles," Surface & Coatings Technology 202 (2008) 2927-2934. (Available online Dec. 3, 2007).

A. Ebong, N. Chen, "Metallization of crystalline silicon solar cells: A review", High Capacity Optical Networks and Enabling Technologies (HONET), 2012 9th International Conference on Dec 12-14, pp. 102-109. DOI: 10.1109/HONET.2012.6421444.

Aihua Wang, "High Efficiency Perc and Perl Silicon Solar Cells," A thesis submitted to the University of New South Wales in fulfilment of the requirements for the degree of Doctor of Philosophy. Nov. 1992.

Chandrasekaran, "20% n-Type Silicon Solar Cell Fabricated by a Simple Process with an Aluminum Alloy Rear Junction and Extended Emitter," Presented at the 43rd IEEE Photovoltaic Specialists Conference, Jun. 5-10, 2016, Portland, OR.

D. L. Meier, E. A. Good, A. Garcia, B. L. Bingham, S. Yamanaka, V. Chandrasekaran, C. Bucher, "Determining components of series resistance from measurements on a finished cell", Proc. 4th World Conf. PVSEC, vol. 2, pp. 1315-1318, 2006. DOI: 10.1109/WCPEC. 2006.279656.

D. L. Meier, H. P. Davis, R. A. Garcia, J. A. Jessup, A. F. Carroll, "Self-doping contacts to silicon using silver coated with a dopant source." Proc. IEEE Photovoltaic Specialists Conf., pp. 69-74, 2000. DOI: 10.1109/PVSC.2000.915755.

Davis, K. O., et. al. "Manufacturing metrology for c-Si module reliability and durability Part II: cell manufacturing." Renewable and Sustainable Energy Reviews 59 (2016) 225-252. DOI: 10.1016/j.rser.2015.12.217.

F. Sirotti et al., Nickel-based air-firable thick-film conductors, Journal of Materials Science, 1990, pp. 4688-4693, vol. 25, USA.

Goodrich, A., et. al. "A wafer-based monocrystalline silicon photovoltaics road map: Utilizing known technology improvement opportunities for further reductions in manufacturing costs." Solar Energy Materials and Solar Cells 114 (Jul. 2013): 110-35. DOI: 10.1016/j.solmat.2013.01.030.

Halm, A., et. al., "The Zebra Cell Concept—Large Area n-Type Interdigitated Back Contact Solar Cells and One-Cell Modules Fabricated Using Standard Industrial Processing Equipment", Proc. the 27th EU Photovoltaic Specialists Conference, pp. 567-570, (2012). DOI: 10.4229/27thEUPVSEC2012-2AO.2.1.

International Search Report and Written Opinion for International application No. PCT/US16/48097 dated Dec. 28, 2016.

International Search Report and Written Opinion of the International Searching Authority for PCT/US2014/043521, dated Dec. 23, 2014.

K.Y. Lin et al., Synthesis of Invay alloy powders by electroless plating, Material Science and Engineering A, 2006, pp. 226-231, vol. 416, USA.

Karabacak, T., et. al. "Stress reduction in tungsten films usuing nanostructured compliant layers." J. Appl. Phys. 2004, 96 (10), 5740-5746. DOI: 10.1063/1.1803106.

Kholostov, K., et. al. "Electroplated nickel/tim solder pads for rear metallization of solar cells." IEEE J. Photovolt. 6 (2) 2016, p. 404-411. DOI: 10.1109/JPHOTOV.2015.2506408.

M. Amirjan et al., Preparation of tungsten base composite powder by electroless nickel plating, Powder Metallurgy, 2010, pp. 218-222, vol. 53, No. 3, USA.

N. Hedgecock et al., On the Structure and Electrical Properties of Electroless Ni—B Films, Journal of the Electrochemical Society, 1975, pp. 866-869, vol. 122, No. 7, USA.

P. Schmitt, D. Eberlein, C. Ebert, M. Tranitz, U. Eitner, H. Wirth. "Adhesion of Al-metallization in ultra-sonic soldering on the Al-rear side of solar cells." Energy Procedia, 38 (2013), pp. 380-386. DOI: 10.1016/j.egypro.2013.07.293.

Popovich, Vera (2013). "Microstructure and Mechanical Aspects of Multicrystalline Silicon Solar Cells" (Doctoral dissertation). (Retrieved from private correspondence).

Rauer, M. (2015). "Alloying from Screen-printed Aluminum Pastes for Silicon Solar Cell Applications" (Doctoral dissertation). (Retrieved from http://www.ub.uni-konstanz.de/a-z/d-e/dissertationen/)).

Saga, T. "Advances in crystalline silicon solar cell technology for industrial mass production." NPG Asia Mater. 2, 96-102 (2010). doi: 10.1038/asiamat.2010.82.

Schneller, E. J., et. al. "Manufacturing metrology for c-Si module reliability and durability Part III: module manufacturing." Renewable and Sustainable Energy Reviews 59 (2016) 992-1016. DOI: 10.1016/j.rser.2015.12.215.

Search Report for PCT/US/2014/071608, dated May 14, 2015.

Snowdon D., et. al. "Composite curved laminates for the UNSW sunswift II solar array." In: Proceedings of solar world congress; 2001.

Wang, A. (1992). "High efficiency PERC and PERL silicon solar cells" (Doctoral dissertation). (Retrieved from http://www.unsworks.unsw.edu.au).

WO2014174984_MachineTranslation.

International Search Report and Written Opinion of the International Searching Authority for PCT application PCT/US16/63696, received Apr. 6, 2017.

(Amstel, et al.) A multiscale model of the aluminum layer at the rear side of a solar cell. 24th European Photovoltaic Solar Energy Conference and Exhibition, Hamburg, Germany, Sep. 21-25, 2009; pp. 2-3.

Office Action received from Taiwan patent office for corresponding Application No. 105138569. This was reported to Applicant on Dec. 7, 2017.

(56) References Cited

OTHER PUBLICATIONS

English translation of Office Action received from Taiwan patent office for corresponding Application No. 105138569. This was reported to Applicant on Dec. 7, 2017.
Office Action received from Taiwan Patent Office for Application No. TW105138567. Original followed by English translation from Foreign Associate.
English translation of Office Action for CN application Application No. 201611044245.X. Received on Jan. 22, 2018.
Office Action for CN application Application No. 201611044245.X. Received on Dec. 21, 2017.
Second Office Action for CN application Application No. 201611044245.X. Original. Received on Aug. 6, 2018 (dated Aug. 1, 2018).
Translation of Second Office Action for CN application Application No. 201611044245.X. Received on Aug. 6, 2018.
WIPO translation of D5_CN101931013.
WIPO translation of D6_CN102969039.
WIPO translation of D7_CN101359564.
International Search Report for PCT/US2018/032159 dated Jul. 12, 2018.
CN10360673A machine translation—English.
CN104778988A machine translation—English.
Search Report and Written Opinion from Intellectual Property Office of Singapore for Patent Application No. 11201804392W, Title of invention: Fired Multilayer Stacks for Use in Integrated Circuits and Solar Cells, dated Jan. 21, 2019.

\* cited by examiner

PRINT-ON PASTES FOR MODIFYING MATERIAL PROPERTIES OF METAL PARTICLE LAYERS

CROSS-REFERENCE TO RELATED APPLICATIONS

This application claims priority to U.S. Provisional Patent Application 62/259,636, filed Nov. 24, 2015, filed Apr. 5, 2016, U.S. Provisional Patent Application 62/318,566, filed Apr. 5, 2016, U.S. Provisional Patent Application 62/371,236, filed Aug. 5, 2016, and U.S. Provisional Patent Application 62/423,020, filed Nov. 16, 2016 all of which are incorporated by reference herein.

STATEMENT OF GOVERNMENT SUPPORT

This invention has been made with Government support under contract number IIP-1430721 awarded by the NSF. The Government may have certain rights in this invention.

BACKGROUND OF THE INVENTION

Field of the Invention

This invention relates to intercalation pastes that contain precious metal particles, intercalating particles and organic vehicle.

Intercalation pastes may be used to improve the power conversion efficiency of solar cells. Silver based intercalation pastes are printed on aluminum layers that have moderate peel strength after firing and subsequent soldering to a tabbing ribbon. Such pastes may be especially well-suited for use in silicon based solar cells that use aluminum back-surface fields (BSF). Typically, between 85-92% of the rear surface area of the silicon wafer of commercially produced mono- and multi-crystalline silicon solar cells is covered by an aluminum particle layer, which forms a back-surface field and makes ohmic contact to the silicon. The remaining 5-10% of the rear silicon surface is covered by the silver rear tabbing layer, which does not produce a field and does not make ohmic contact to the silicon wafer. The rear tabbing layer is primarily used to solder tabbing ribbons to electrically connect solar cells.

It is estimated that the power conversion efficiency of the solar cells is reduced by 0.1% to 0.2% on an absolute basis when a silver layer makes direct contact to the silicon substrate on the rear side of a solar cell instead of contacting the aluminum particle layer on the substrate. Therefore, it is highly desirable to cover the entire back portion of the solar cell with an aluminum particle layer and still be able to connect solar cells together using tabbing ribbons. In the past, researchers have tried printing silver pastes directly on top of the aluminum particle layer, but during firing in air at high temperatures the aluminum and silver layers interdiffuse, and the resulting layer surface becomes oxidized and loses solderability. Some researchers have attempted to change the atmospheric conditions to reduce oxidation; however, the front side silver pastes perform best in oxidizing atmospheres such as dry air, and overall solar cell efficiency is reduced after processing in inert atmospheres. Other researchers have attempted to lower the peak firing temperature of the wafer to reduce interdiffusion, but front side silver pastes require high peak firing temperatures (i.e., more than 650° C.) to fire through silicon nitride to make ohmic contact to the silicon substrate. Recently, researchers have used ultrasonic soldering of tin alloys directly on top of aluminum to create a solderable surface. This technique has achieved adequate peel strength (i.e., 1-1.5 N/mm) but requires additional equipment and uses a large quantity of tin, which adds cost. Furthermore, using ultrasonic soldering on brittle materials such as aluminum and silicon wafer can increase wafer breakage and decrease processing yields.

There is a need to develop printable pastes that can modify the material properties of underlying metal particle layers during firing. For example, precious metal containing pastes that can be directly printed on aluminum and fired using standard solar cell processing conditions could improve solar cell efficiency. These pastes should reduce Ag/Al interdiffusion in order to remain solderable to the tabbing ribbon. It is desirable for the paste to be screen-printable and act as a drop-in replacement, which would result in no additional capital expenses and can be immediately integrated into existing production lines.

BRIEF DESCRIPTION OF THE DRAWINGS

The foregoing aspects and others will be readily appreciated by the skilled artisan from the following description of illustrative embodiments when read in conjunction with the accompanying drawings. The figures are not drawn to scale. The drawings are illustrative only and are not intended to be exhaustive or to limit the invention.

SUMMARY

Figure 1:
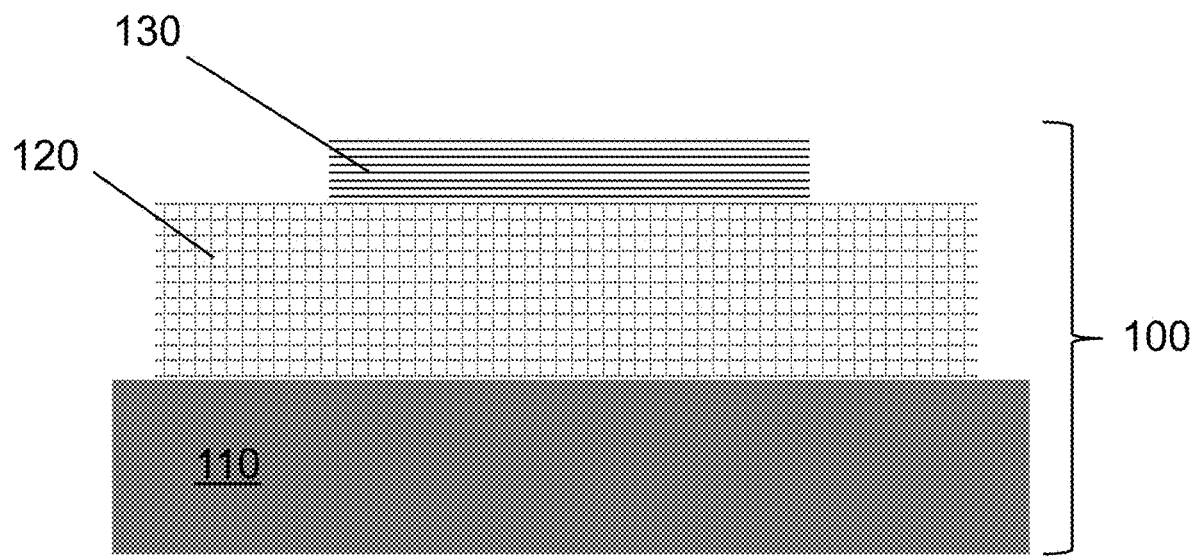
FIG. 1 is a schematic cross-section drawing of multilayer stack prior to firing, according to an embodiment of the invention.

A fired multilayer stack is disclosed. In one embodiment of the invention, the stack has a substrate, a metal particle layer on at least a portion of the substrate surface, a modified metal particle layer on at least a portion of the substrate surface, and a modified intercalation layer directly on at least a portion of the modified metal particle layer. The modified intercalation layer has a solderable surface that faces away from the substrate. The modified metal particle layer includes the same metal particles that are in the metal particle layer and at least one material from the modified intercalation layer. The modified intercalation layer contain a precious metal and a material selected from the group consisting of antimony, arsenic, barium, bismuth, boron, cadmium, calcium, cerium, cesium, chromium, cobalt, gallium, germanium, hafnium, indium, iron, lanthanum, lead, lithium, magnesium, manganese, molybdenum, niobium, phosphorous, potassium, rhenium, selenium, silicon, sodium, strontium, sulfur, tellurium, tin, vanadium, zinc, zirconium, combinations thereof, and alloys thereof, oxides thereof, composites thereof, and other combinations thereof. In one arrangement, the modified intercalation layer contain a precious metal and a material selected from the group consisting of bismuth, boron, indium, lead, silicon, tellurium, tin, vanadium, zinc, combinations thereof, and alloys thereof, oxides thereof, composites thereof, and other combinations thereof.

In one embodiment of the invention, the modified intercalation layer has two phases: a precious metal phase and an intercalation phase. More than 50% of the solderable surface of the modified intercalation layer may contain the precious metal phase. The modified metal particle layer may include the metal particles discussed above and at least one material from the intercalation phase. The intercalation phase comprises a material selected from the group consisting of antimony, arsenic, barium, bismuth, boron, cadmium, calcium, cerium, cesium, chromium, cobalt, gallium, germanium, hafnium, indium, iron, lanthanum, lead, lithium, magnesium, manganese, molybdenum, niobium, phosphorous, potassium, rhenium, selenium, silicon, sodium, strontium, sulfur, tellurium, tin, vanadium, zinc, zirconium, combinations thereof, and alloys thereof, oxides thereof, composites thereof, and other combinations thereof. The precious metal phase includes at least one material selected from the group consisting of gold, silver, platinum, palladium, rhodium, and alloys, composites, and other combinations thereof.

In another embodiment of the invention, the modified intercalation layer has two sublayers: an intercalation sublayer directly on at least a portion of the modified metal particle layer and a precious metal sublayer directly on at least a portion of the intercalation sublayer. The solderable surface of the modified intercalation layer contains the precious metal sublayer. The modified metal particle layer may include the metal particles discussed above and at least one material from the intercalation sublayer. Possible materials for the intercalation sublayer are the same as were described above for the intercalation phase. Possible materials for the precious metal sublayer are the same as were described above for the precious metal phase.

In another embodiment of the invention, a fired multilayer stack has a modified aluminum particle layer as its modified metal particle layer. It has a modified intercalation layer that has two sublayers: a bismuth-rich sublayer directly on the modified aluminum particle layer; and a silver-rich sublayer directly on the bismuth-rich sublayer. The solderable surface of the modified intercalation layer contains the silver-rich sublayer. The modified aluminum particle contains aluminum particles and may also contain at least one material selected from the group consisting of aluminum oxides, bismuth, and bismuth oxides.

In one arrangement, there is at least one dielectric layer directly on at least a portion of the substrate surface. The dielectric layer includes at least one material selected from the group consisting of silicon, aluminum, germanium, hafnium, gallium, and oxides, nitrides, composites, and combinations thereof. In another arrangement, there is an aluminum oxide dielectric layer directly on at least a portion of the substrate surface and a silicon nitride dielectric layer directly on the aluminum oxide dielectric layer.

In one arrangement, there is a solid (e.g., eutectic) compound layer directly on the substrate surface. The solid compound layer includes one or more metals selected from the group consisting of aluminum, copper, iron, nickel, molybdenum, tungsten, tantalum, titanium and one or more materials selected from the group consisting of silicon, oxygen, carbon, germanium, gallium, arsenic, nitrogen, indium and phosphorous.

A portion of the substrate adjacent to the substrate surface may be doped with at least one material selected from the group consisting of aluminum, copper, iron, nickel, molybdenum, tungsten, tantalum, titanium, steel and combinations thereof.

In one embodiment of the invention, a portion of the fired multilayer stack has variable thickness. The fired multilayer stack may have an average peak to valley height greater than 12 µm.

At least 70 wt % of the solderable surface of the modified intercalation layer may include a material selected from the group consisting of silver, gold, platinum, palladium, rhodium, and alloys, composites, and other combinations thereof.

The substrate may include at least one material selected from the group consisting of silicon, silicon dioxide, silicon carbide, aluminum oxide, sapphire, germanium, gallium arsenide, gallium nitride, and indium phosphide. Alternatively, the substrate may include a material selected from the group consisting of aluminum, copper, iron, nickel, titanium, steel, zinc, and alloys, composites, and other combinations thereof. The metal particle layer may include a material selected from the group consisting of aluminum, copper, iron, nickel, molybdenum, tungsten, tantalum, titanium, steel and alloys, composites, and other combinations thereof. The precious metal may include a material selected from the group consisting of silver, gold, platinum, palladium, rhodium, and alloys, composites, and other combinations thereof.

The metal particle layer may have a thickness between 0.5 µm and 100 µm and/or a porosity between 1 and 50%. The modified intercalation layer may have a thickness between 0.5 µm and 10 µm. The fired multilayer stack may have a contact resistance between 0 and 5 mOhm, as determined by transmission line measurement.

There may also be a tabbing ribbon directly on at least a portion of the solderable surface of the modified intercalation layer. In one arrangement, the peel strength between the tabbing ribbon and the modified intercalation layer is greater than 1 N/mm.

In another embodiment of the invention, a fired multilayer stack has a substrate, a metal particle layer on at least a portion of the substrate, a modified metal particle layer on at least a portion of the substrate, and a modified intercalation layer directly on at least a portion of the modified metal particle layer. The modified intercalation layer has two sublayers: an intercalation sublayer directly on at least a portion of the modified metal particle layer and a precious metal sublayer directly on at least a portion of the intercalation sublayer. The modified metal particle layer includes metal particles and at least one material from the intercalation sublayer. Possible materials for the intercalation sublayer have been described above.

In another embodiment of the invention, a fired multilayer stack has a silicon substrate, an aluminum particle layer on at least a portion of the substrate, a modified aluminum particle layer on at least a portion of the substrate, and a modified intercalation layer directly on the modified aluminum particle layer. The modified intercalation layer has two sublayers: a bismuth-rich sublayer directly on the modified aluminum particle layer and a silver-rich sublayer directly on the bismuth-rich sublayer. The modified aluminum particle layer includes at least one material selected from the group consisting of aluminum, aluminum oxides, bismuth, and bismuth oxides.

In one embodiment of the invention, a solar cell has a silicon substrate, at least one front dielectric layer directly on at least a portion of the front surface of the silicon substrate, a plurality of fine grid lines on a portion of the front surface of the silicon substrate, at least one front busbar layer in electrical contact with at least one of the plurality of fine grid lines, an aluminum particle layer on at least a portion of the rear surface of the silicon substrate, and a rear tabbing layer on a portion of the rear surface of the silicon substrate. The rear tabbing layer includes a modified aluminum particle layer on a portion of the rear surface of the silicon substrate and a modified intercalation layer directly on at least a portion of the modified aluminum particle layer. The modified intercalation layer has a solderable surface that faces away from the silicon substrate. The modified aluminum particle layer includes aluminum particles and at least one material from the modified intercalation layer. Possible materials for the modified intercalation layer have been described above. The aluminum particle layer may have a thickness between 1 µm and 50 µm and/or a porosity between 3 and 20%. The rear tabbing layer may have a thickness between 1 µm and 50 µm. The silicon substrate may be a monocrystalline silicon wafer with either a p-type base or an n-type base. The silicon substrate may be a multi-crystalline silicon wafer with either a p-type base or an n-type base.

In one embodiment of the invention, the modified intercalation layer includes two phases: a precious metal phase and an intercalation phase. More than 50% of the solderable surface may be made up of the precious metal phase. The modified aluminum particle layer includes aluminum particles and at least one material from the intercalation phase. Possible materials for the intercalation phase have been described above. Possible materials for the precious metal phase have been described above.

In another embodiment of the invention, the modified intercalation layer includes two sublayers: an intercalation sublayer directly on at least a portion of the modified metal particle layer, and a precious metal sublayer directly on at least a portion of the intercalation sublayer. The solderable surface contains the precious metal sublayer. The modified aluminum particle layer includes aluminum particles and at least one material from the intercalation sublayer. Possible materials for the intercalation sublayer have been described above. Possible materials for the precious metal sublayer have been described above.

In another embodiment of the invention, the modified intercalation layer comprises two sublayers: a bismuth-rich sublayer directly on the modified aluminum particle layer, and a silver-rich sublayer directly on the bismuth-rich sublayer. The modified aluminum particle layer further includes at least one material selected from the group consisting of aluminum oxides, bismuth, and bismuth oxides. In one arrangement, modified aluminum particle layer further includes bismuth and/or bismuth oxide and the weight ratio of bismuth to bismuth and aluminum (Bi:(Bi+Al)) is at least 20% higher in the modified aluminum particle layer than in the aluminum particle layer. The bismuth-rich sublayer may have a thickness between 0.01 µm and 5 µm or between 0.25 µm and 5 µm.

In one arrangement, there is at least one rear dielectric layer directly on at least a portion of the rear surface of the silicon substrate. The rear dielectric layer includes one or more of silicon, aluminum, germanium, hafnium, gallium, and oxides, nitrides, composites, and combinations thereof. The rear dielectric layer may contain silicon nitride. In another arrangement, there is an aluminum oxide rear dielectric layer directly on at least a portion of the rear surface of the silicon substrate and a silicon nitride rear dielectric layer directly on the aluminum oxide rear dielectric layer. In one arrangement, there is a solidified aluminum-silicon eutectic layer directly on the silicon substrate. In one arrangement, a portion of the silicon substrate adjacent to the rear surface of the silicon substrate further comprises a rear surface field and the rear surface field is doped p-type to between $10^{17}$ and $10^{20}$ atoms per cm$^3$.

In one embodiment of the invention, a portion of the rear tabbing layer has variable thickness and may have an average peak to valley height greater than 12 μm.

There may be a tabbing ribbon directly on at least a portion of the solderable surface of the modified intercalation layer. The solderable surface may be silver rich. The solderable surface may contain at least 75 wt % silver. A tabbing ribbon soldered to a silver-rich solderable surface may have a peel strength greater than 1 N/mm.

A portion of the modified aluminum particle layer may have variable thickness. A portion of the modified aluminum particle layer may have an average peak to valley height greater than 12 μm. Contact resistance between the rear tabbing layer and the aluminum particle layer may be between 0 and 5 mOhm as determined by transmission line measurement.

In another embodiment of the invention, a solar cell has a silicon substrate, at least one front dielectric layer directly on at least a portion of the front surface of the silicon substrate, a plurality of fine grid lines on a portion of the front surface of the silicon substrate, at least one front busbar layer in electrical contact with at least one of the plurality of fine grid lines, an aluminum particle layer on at least a portion of the rear surface of the silicon substrate, and a rear tabbing layer on a portion of the rear surface of the silicon substrate. The rear tabbing layer has a solderable surface. The rear tabbing layer includes a modified aluminum particle layer on at least a portion of the rear surface of the silicon substrate, a bismuth-rich sublayer directly on at least a portion of the modified aluminum particle layer, and a silver-rich sublayer directly on at least a portion of the bismuth-rich sublayer. The modified aluminum particle layer contains aluminum particles and at least one material selected from the group consisting of aluminum oxides, bismuth, and bismuth oxides.

In another embodiment of the invention, a solar cell module has a front sheet, a front encapsulant layer on the rear surface of the front sheet, and a first silicon solar cell and a second silicon solar cell on the front encapsulant layer. Each silicon solar cell can be any of the silicon solar cells described herein. The solar cell module also has a first cell interconnect that includes a first tabbing ribbon in electrical contact with both the front busbar layer of the first silicon solar cell, and the rear tabbing layer of the second silicon solar cell, a rear sheet, a rear encapsulant layer on the rear surface of the rear sheet. A first portion of the rear encapsulant layer is in contact with the first silicon solar cell and the second solar cell, and a second portion of the rear encapsulant layer is in contact with the front encapsulant layer.

The first cell interconnect may also include a junction box in contact with the rear sheet. The junction box may contain at least one bypass diode. There may also be at least one busbar ribbon connecting to the first tabbing ribbon.

In one embodiment of the invention, a paste is disclosed. The paste contains between 10 wt % and 70 wt % precious metal particles, at least 10 wt % intercalating particles and organic vehicle. The intercalating particles include one or more selected from the group consisting of low temperature base metal particles, crystalline metal oxide particles, and glass frit particles. The weight ratio of the intercalating particles to the precious metal particles may be at least 1:5.

The precious metal particles may include at least one material selected from the group consisting of gold, silver, platinum, palladium, rhodium, and alloys, composites, and other combinations thereof. The precious metal particles may have a D50 between 100 nm and 50 μm and a specific surface area between 0.4 and 7.0 m$^2$/g. A portion of the precious metal particles may have shapes such as a spherical shapes, flake shapes, and/or elongated shapes. The precious metal particles may have a unimodal size distribution or a multimodal size distribution. In one arrangement, the precious metal particles are silver and have a D50 between 300 nm and 2.5 μm and a specific surface area between 1.0 and 3.0 m$^2$/g.

The intercalating particles may have a D50 between 100 nm and 50 μm and a specific surface area between 0.1 and 6.0 m$^2$/g. A portion of the intercalating particles may have shapes such as a spherical shapes, flake shapes, and/or elongated shapes. The intercalating particles may have a unimodal size distribution or a multimodal size distribution.

The low temperature base metal particles may include a material selected from the group consisting of bismuth, tin, tellurium, antimony, lead, and alloys, composites, and other combinations thereof. In one arrangement, the low temperature base metal particles contain bismuth and have a D50 between 1.5 and 4.0 μm and a specific surface area between 1.0 and 2.0 m$^2$/g.

In one embodiment of the invention, at least some of the low temperature base metal particles have a bismuth core particle surrounded by a single shell that includes a material selected from the group consisting of silver, nickel, nickel-boron, tin, tellurium, antimony, lead, molybdenum, titanium, and alloys, composites, and other combinations thereof. In another embodiment, at least some of the low temperature base metal particles have a bismuth core particle surrounded by a single shell that comprises a material selected from the group consisting of silicon oxides, magnesium oxides, boron oxides, and any combination thereof.

The crystalline metal oxide particles may contain oxygen and a metal selected from the group consisting of bismuth, tin, tellurium, antimony, lead, vanadium, chromium, molybdenum, boron, manganese, cobalt, and alloys, composites, and other combinations thereof.

The glass frit particles may contain a material selected from a group consisting of antimony, arsenic, barium, bismuth, boron, cadmium, calcium, cerium, cesium, chromium, cobalt, fluorine, gallium, germanium, hafnium, indium, iodine, iron, lanthanum, lead, lithium, magnesium, manganese, molybdenum, niobium, potassium, rhenium, selenium, silicon, sodium, strontium, tellurium, tin, vanadium, zinc, zirconium, alloys thereof, oxides thereof, composites thereof, and other combinations thereof.

The paste may have a solids loading between 30 wt % and 80 wt %. The intercalating particles may make up at least 15 wt % of the paste. In one arrangement, the paste inlcudes 45 wt % Ag particles, 30 wt % bismuth particles, and 25 wt % organic vehicle. In another arrangement, the paste includes 30 wt % Ag particles, 20 wt % bismuth particles, and 50 wt % organic vehicle. The paste may have a viscosity between 10,000 and 200,000 cP at 25° C. at a sheer rate of 4 sec$^{-1}$.

In one embodiment of the invention, a co-firing method of forming a fired multilayer stack, is described. The method involves the steps of a) applying a wet metal particle layer on at least a portion of a surface of a substrate, b) drying the wet metal particle layer to form a dried metal particle layer, c) applying a wet intercalation layer directly on at least a portion of the dried metal particle layer to form a multilayer stack, d) drying the multilayer stack, and e) co-firing the multilayer stack to form the fired multilayer stack.

In another embodiment of the invention, a sequential method of forming a fired multilayer stack, is described. The method involves the steps of a) applying a wet metal particle layer on at least a portion of a surface of a substrate, b) drying the wet metal particle layer to form a dried metal particle layer, c) firing the dried metal particle layer to form a metal particle layer, d) applying a wet intercalation layer directly on at least a portion of the metal particle layer to form a multilayer stack, e) drying the multilayer stack, and f) firing the multilayer stack to form the fired multilayer stack.

In one arrangement, for both the co-firing method and the sequential method, the wet intercalation layer has between 10 wt % and 70 wt % precious metal particles, at least 10 wt % intercalating particles, and organic vehicle. The intercalating particles may include one or more selected from the group consisting of low temperature base metal particles, crystalline metal oxide particles, and glass frit particles. The wet metal particle layer may include metal particles consisting of a material selected from the group comprising aluminum, copper, iron, nickel, molybdenum, tungsten, tantalum, titanium, steel and alloys, composites, and other combinations thereof.

In one arrangement, for both the co-firing method and the sequential method, there is an additional step before step a). The additional step involves depositing at least one dielectric layer onto at least a portion of the surface of the substrate. In this arrangement, step a) involves applying the wet metal particle layer directly on at least a portion the dielectric layer.

For both the co-firing method and the sequential method, each applying step may involve a method selected from the group consisting of screen printing, gravure printing, spray deposition, slot coating, 3D printing and inkjet printing. In one arrangement, step a) involves screen printing through a patterned screen to produce a wet metal particle layer that has variable thickness.

For both the co-firing method and the sequential method, steps b) and d) may involve drying at a temperature below 500° C. for between 1 second and 90 minutes or at a temperature between 150° C. and 300° C. for between 1 second and 60 minutes. Step e) may involve rapidly heating to a temperature greater than 600° C. for between 0.5 second and 60 minutes in air or rapidly heating to a temperature greater than 700° C. for between 0.5 and 3 seconds in air.

In one arrangement, for both the co-firing method and the sequential method, an additional step f) involves soldering a tabbing ribbon onto a portion of the fired multilayer stack.

Low temperature base metal particles, crystalline metal oxide particles, glass frit particles, and metal particle layers are described in detail above.

In another embodiment of the invention, a method of fabricating a solar cell involves the steps of: a) providing a silicon wafer, b) applying a wet aluminum particle layer on at least a portion of the back surface of the silicon wafer, c) drying the wet aluminum particle layer to form an aluminum particle layer, d) applying a wet intercalation layer directly on at least a portion of the aluminum particle layer to form a multilayer stack, e) drying the multilayer stack, f) applying a plurality of fine grid lines and at least one front busbar layer onto the front surface of the silicon wafer, g) drying the plurality of fine grid lines and the at least one front busbar layer to form a structure, and h) co-firing the structure to form a silicon solar cell.

The wet intercalation layer has been described above.

In one arrangement, there is an additional step between step a) and step b). The additional step involves depositing at least one dielectric layer onto at least a portion of the back surface of the silicon wafer. In this arrangement, step b) involves applying the wet aluminum particle layer directly on at least a portion the dielectric layer.

Each applying step may involve a method selected from the group consisting of screen printing, gravure printing, spray deposition, slot coating, 3D printing and inkjet printing. In one arrangement, step b) involves screen printing through a patterned screen to produce a wet aluminum particle layer that has variable thickness.

For both the co-firing method and the sequential method, steps e) and g) may involve drying at a temperature below 500° C. for between 1 second and 90 minutes or at a temperature between 150° C. and 300° C. for between 1 second and 60 minutes. Step h) may involve rapidly heating to a temperature greater than 600° C. for between 0.5 second and 60 minutes in air or rapidly heating to a temperature greater than 700° C. for between 0.5 and 3 seconds in air.

Low temperature base metal particles, crystalline metal oxide particles, and glass frit particles have been described in detail above.

DETAILED DESCRIPTION

The preferred embodiments are illustrated in the context of fired intercalation pastes on metal particle layers. The skilled artisan will readily appreciate, however, that the materials and methods disclosed herein will have application in a number of contexts where making good electrical contact to semiconducting or conducting materials is desirable, particularly where good adhesion, high performance, and low cost are important.

All publications referred to herein are incorporated by reference in their entirety for all purposes as if fully set forth herein.

Herein is disclosed the composition and use of intercalation pastes comprising precious metal particles and intercalating particles, which can be printed on metal particle layers to alter the properties of the metal particle layers after they have been fired into a fired multilayer stack. In one embodiment of the invention, intercalation pastes are used to provide a solderable surface on a metal particle layer that would not have been solderable by itself. Intercalation pastes may also be used to improve adhesion within a fired multilayer stack or to change the interaction of a metal particle layer with an underlying substrate. Intercalation pastes are widely applicable to many applications including transistors, light emitting diodes, and integrated circuits; however, the majority of examples disclosed below will focus on photovoltaic cells.

Definitions and Methods

Scanning electron microscopy (SEM) and energy dispersive x-ray spectroscopy (EDX) (referred to collectively as SEM/EDX) as used herein were performed using a Zeiss Gemini Ultra-55 analytical field emission scanning electron microscope, equipped with a Bruker) (Flash® 6|60 detector. Details about operating conditions are described for each analysis. Cross-sectional SEM images of the fired multilayer stack were prepared by ion milling. A thin epoxy layer was applied to the top of the fired multilayer stack and dried for at least 30 minutes. The sample was then transferred to a JEOL IB-03010CP ion mill operating at 5 kV and 120 uA for 8 hours to remove 80 microns from the sample edge. Milled samples were stored in a nitrogen glove box prior to SEM/EDX.

The term "drying" describes a thermal treatment at or below a temperature of 500° C., or below 400° C., or below 300° C. for a time period between 1 second and 90 minutes or any range subsumed therein. Pastes are typically applied to a substrate via screen printing or another deposition method to create a "wet" layer. The wet layer may be dried to reduce or remove volatile organic species such as solvents, creating a "dried" layer.

The term "firing" describes heating at a temperature greater than 500° C., greater than 600° C., or greater than 700° C. for a time period between 1 second and 60 minutes, or any range subsumed therein. The term "fired layer" describes a dried layer that has been fired.

The term "multilayer stack" is used herein to describe a substrate that has two or more layers of different materials on it. A "fired multilayer stack" is a multilayer stack whose layers have been dried and fired. There are several ways to fire such a multilayer stack. The term "co-firing" is used to describe the treatment for multilayer stacks that are fired only once. For example, during silicon solar cell fabrication, a layer of aluminum particle paste is first applied to a substrate and dried. Then, a rear tabbing paste layer is applied on a portion of the dried aluminum particle layer then dried, resulting in a dried aluminum particle layer and a dried rear tabbing layer. During co-firing, both dried layers are fired simultaneously in one step. The term "sequential firing" is used to describe the treatment for multilayer stacks that are fired multiple times. During sequential processing a metal particle paste is applied on a substrate, dried and then fired. An intercalation paste is then applied on a portion of the dried and fired metal particle paste (referred to as the metal particle layer). Then, the entire multilayer stack is dried and fired for a second time. It should be noted that embodiments of the invention that describe co-fired multilayer stacks or structures are also appropriate for multilayer stacks or structures that have been fired sequentially.

The term "intercalation" is used herein to describe penetration into a porous material. In the context of the embodiments described herein, the term "intercalation" describes the penetration of material from intercalating particles in an intercalation layer into adjacent porous dry metal particle layer(s) during the firing process, which results in an intercalating particle material coating (partial or full) on at least a portion of the metal particles. The term "modified metal particle layer" is used herein to describe such a fired metal particle layer into which material from intercalating particles has penetrated.

In describing the relationship between adjacent layers, the preposition "on" is used herein to mean that the layers may or may not be in direct physical contact with one another. For example, to say that a layer is on a substrate is to say that the layer is positioned either directly adjacent to or indirectly above or adjacent to the substrate. To say that a particular layer is indirectly above or adjacent to a substrate is to say that there may or may not be one or more additional layers between the particular layer and the substrate. In describing the relationship between adjacent layers, the preposition "directly on" is used herein to mean that the layers are in direct physical contact with one another. For example, to say that a layer is directly on a substrate is to say that the layer is positioned directly adjacent to the substrate.

When a metal particle layer consists mainly of particles of metal A, it can be referred to as a "metal A particle layer." For example, when a metal particle layer consists mainly of aluminum particles, it can be referred to as an aluminum particle layer. When a modified metal particle layer consists mainly of particles of metal A, it can be referred to as a "metal A modified particle layer." For example, when a modified metal particle layer consists mainly of aluminum particles, it can be referred to as a modified aluminum particle layer.

The term "solderable surface" is well known in the art. "Solderable surface" refers to a surface that can be soldered to a soldering ribbon. A person with ordinary skill in the art is familiar with the concept of a solderable surface. Examples of materials that create a solderable surface include, but are not limited to, tin, cadmium, gold, silver, palladium, rhodium, copper, zinc, lead, nickel, alloys thereof, combinations thereof, composites thereof, and mixtures thereof. In one embodiment, a surface is solderable when at least 70 wt % of the surface consists of a material such as silver, gold, platinum, palladium, rhodium, and alloys, composites, and other combinations thereof.

Particles described herein can exhibit a variety of shapes, sizes, specific surface areas, and oxygen contents. Particles may be spheroidal, acicular, angular, dendritic, fibrous, flaky, granular, irregular, and nodular as defined by ISO 3252. It should be understood that the term "spherical" is used herein to refer to generally spherical shapes and may include spheroidal, granular, nodular, and sometimes irregular shapes. The term "flake" refers to flaky, and sometimes angular, fibrous, and irregular shapes. The term "elongated" refers to acicular, and sometimes angular, dendritic, fibrous, and irregular shapes as defined by ISO 3252:1999. Particle shape, morphology, size, and size distribution often depend on synthesis technique. A group of particles may include a combination of particles of different shapes and sizes.

Particles that are spherical or elongated are typically described by their D50, specific surface area and particle size distribution. The D50 value is defined as the value at which half of the particle population has a diameter below and half the particle population has a diameter above the value. Measuring a particle diameter distribution is typically performed with a laser diffraction particle size analyzer such as the Horiba LA-950. For example, spherical particles are dispersed in a solvent in which they are well separated and the scattering of transmitted light is directly correlated to the size distribution from smallest to largest dimensions. A common approach to express laser diffraction results is to report the D50 values based on volume distributions. The statistical distribution of particle sizes can also be measured using a laser diffraction particle size analyzer. It is common for precious metal particles to have either a unimodal or a multimodal particle size distribution. In a unimodal distribution, particle size is monodispersed and the D50 is in the center of a single distribution. Multimodal particle size distributions have more than one mode (or peak) in the particle size distribution. Multimodal particle size distributions can increase the tap density of a powder, which typically results in a higher green film density.

In some embodiments of the invention, particles may have a flake or elongated shape as defined above. The flake may have a diameter between 1 μm and 100 μm or between 1 μm and 15 μm and a thickness between 100 nm and 500 nm. An elongated shape may have a diameter between 200 nm and 1000 nm and a length greater than 1 μm. In another embodiment of the invention, there is no limitation on the shape of the particles; any particle shape can be used, as long as its largest dimension is no larger than 50 µm, 5 µm, or 1 µm.

The specific surface area of particles can be measured using the BET (Brunauer-Emmett-Teller) method according to DIN ISO 9277, 2003-05. The specific surface area of the particles disclosed herein, and in particular of the silver and bismuth particles is determined by the following test method: BET measurement performed using TriStar 3000 (from Micromeritics Instrument Corporation) which operates based on the physical adsorption analytical technique. Sample preparation includes degassing to remove adsorbed molecules. Nitrogen is the analysis gas and helium is used to determine the void volume of the sample tube. Micromeritics provides silica alumina for use as a reference material, along with preparation procedures and testing conditions. The measurement begins by adding a known mass of the reference material to a sample tube and mounting the sample tube on the BET apparatus manifold. The thermally-stable dosing manifold, sample tubes, and dedicated tube for measuring saturation pressure ($P_o$) are evacuated. When sufficient vacuum is achieved, the manifold is filled with helium (a non-absorbing gas) and the sample port is opened to determine the warm free space of the sample at room temperature. The sample tube with the reference material are submerged in liquid nitrogen and cooled to around 77 K, and free space analysis is once again conducted. Saturation pressure of the adsorptive is measured using $P_o$ tube, followed by nitrogen dosing into the manifold above atmospheric pressure. Pressure and temperature of nitrogen are recorded, and then the sample port is open to let nitrogen adsorb onto the sample. After some time, the port is closed to allow adsorption to reach equilibrium. The amount adsorbed is the quantity of nitrogen removed from the manifold minus any residual nitrogen in the sample tube. Measured points along the adsorption isotherm are used to calculate the specific area in $m^2/g$ for the reference material; this procedure is repeated with any sample of interest such as the particles described herein.

Particles described herein have salient thermal properties: melting point and/or softening point, both of which depend on the crystallinity of the material. The melting point of particles can be determined by differential scanning calorimetry with a DSC 2500 differential scanning calorimeter made by TA Instruments and using the method described in ASTM E794-06 (2012). The melting point of crystalline materials can also be determined using a heating stage and x-ray diffraction. As a crystalline material is heated above its melting point, diffraction peaks begin to disappear. The softening point is the temperature at which an amorphous, or glassy particle begins to soften. The softening point of a glass particle may be determined using a dilatometer. The softening point may also be obtained by the fiber elongation method described in ASTM C338-57.

Materials for Making Fired Multilayer Stacks

In one embodiment of the invention, a substrate, metal particle paste, and intercalation paste form a fired multilayer stack. The substrate may be a solid, planar, or rigid material. In one embodiment, a substrate includes at least one material selected from the group consisting of silicon, silicon dioxide, silicon carbide, aluminum oxide, sapphire, germanium, gallium arsenide, gallium nitride and indium phosphide. Such substrates are commonly used for deposition of layers that make up transistors, light emitting diodes, integrated circuits and photovoltaic cells. The substrate may also be electronically conductive and/or flexible. In another embodiment, the substrate includes at least one material selected from the group consisting of aluminum, copper, iron, nickel, titanium, steel, zinc, and alloys, composites, and other combinations thereof.

In one embodiment of the invention, metal particle pastes include metal particles and organic vehicle. In one arrangement, metal particle pastes also include an inorganic binder such as a glass frit. In one arrangement, a common, commercially available metal particle paste is used. Metal pastes containing aluminum commonly used on silicon solar cells are sold by Ruxing Technology (e.g., RX8252H1), Monocrystal (e.g., EFX-39), and GigaSolar Materials (e.g., M7). Metal particles may include at least one of aluminum, copper, iron, nickel, molybdenum, tungsten, tantalum, titanium, or alloys, composites, or other combinations thereof. In various arrangements, metal particles have a D50 between 100 nm and 100 µm, between 500 nm and 50 µm, between 500 nm and 20 µm, or any range subsumed therein. The metal particles may have a spherical, elongated or flake shape and may have a unimodal or multimodal size distribution. Glass frit may be included in metal particle pastes in small quantities (i.e., less than 5 wt %). In one embodiment, a metal particle paste comprises 70 wt % to 80 wt % aluminum particles, less than 2 wt % glass frit, and organic vehicle.

In one embodiment of the invention, an intercalation paste includes precious metal particles, intercalating particles and an organic vehicle. The term "solids loading" can be used in connection with pastes to describe the amount or proportion of precious metal and intercalating particle solids in a paste. The pastes described herein also include an organic vehicle, although that may not always be stated explicitly.

Intercalation Paste Components

In one embodiment of the invention, precious metal particles, as described herein, comprise at least one material selected from the group consisting of gold, silver, platinum, palladium, and rhodium, and alloys, composites, or other combinations thereof. In one embodiment, precious metal particles comprise between 10 wt % and 70 wt % of the paste. In various embodiments, precious metal particles have a D50 between about 100 nm and 50 µm, between 300 nm and 10 µm, between 300 nm and 5 µm, or any range subsumed therein. In various embodiments, precious metal particles have a specific surface area ranging from about 0.4 to 7.0 $m^2/g$ or from about 1 to 5 $m^2/g$ or any range subsumed therein. The precious metals may have up to 2 wt % oxygen content; the oxygen may be mixed uniformly throughout the particle or the oxygen may be found as an oxide shell that has a thickness up to 500 nm. The precious metal particles may have a spherical, elongated or flake shape and have a unimodal or multimodal size distribution. Silver particles are commonly used in metallization pastes in the solar industry. In an exemplary embodiment, at least some precious metal particles are silver with a D50 between 300 nm and 2.5 µm and a specific surface area between 1 and 3 $m^2/g$.

The term "intercalating particles" is used to describe particles that can deform when heated, and, when placed adjacent to a porous layer of other metal particles, can at least partially intercalate into the porous metal particle layer and phase separate from the other metal particles under the influence of heat. In various arrangements, intercalating particles have a D50 between 50 nm and 50 µm, between 50 nm and 10 µm, between 300 nm and 5 µm, or any range subsumed therein. In one embodiment, intercalating particles have a D50 between 300 nm and 3 µm. In various embodiments, intercalating particles have a specific surface area ranging from about 0.1 to 6 $m^2/g$, about 0.5 to 3 $m^2/g$ or about 0.5 to 4 m²/g or any range subsumed therein. According to one embodiment, intercalating particles are flakes and have a specific surface area of about 1.0 to 3.0 m²/g. The intercalating particles may have a spherical, elongated or flake shape and may have a unimodal or multimodal size distribution.

There are three groups of particles that can be used as intercalating particles: low temperature base metal particles (LTBMs), crystalline metal oxide particles, and glass frit particles. In some arrangements, intercalating particles consist solely of low temperature base metal particles, or of crystalline metal oxide particles, or of glass frit particles. In another arrangement, intercalating particles are mixtures of particles from two or more of these groups. It is desirable that the elements of the intercalating particles have low solubility with and do not alloy with elements in adjacent metal particle layers.

In one embodiment, an intercalating particle is a low temperature base metal particle. The term "low temperature base metal particles" (LTBMs) is used herein to describe particles that consist exclusively or essentially of any base metal or metal alloy that has a low-temperature melting point, i.e., a melting point below 450° C. In some arrangements, LTBMs also contain up to 2 wt % oxygen; the oxygen may be mixed uniformly throughout the particle, or the oxygen may be found in an oxide shell that has a thickness up to 500 nm and coats or partially coats the particle. In some arrangements, the melting point of LTMBs is even lower, such as below 350° C. or below 300° C. In one embodiment of the invention, LTBMs are made exclusively or essentially of bismuth, tin, tellurium, antimony, lead, or alloys, composites, or other combinations thereof. In one embodiment, intercalating particles contain only bismuth and have a D50 between 1.5 and 4 µm and a specific surface area between 1 and 2 m²/g.

In another embodiment, a LTBM intercalating particle is a bismuth core particle surrounded by a metal or metal oxide shell. In another embodiment, a LTBM intercalating particle is a bismuth core particle surrounded by a single shell made of silver, nickel, nickel alloy such as nickel boron, tin, tellurium, antimony, lead, molybdenum, titanium, composites, and/or other combinations thereof. In another embodiment, a LTBM intercalating particle is a bismuth core particle surrounded by a single shell that is an oxide of silicon, an oxide of magnesium, an oxide of boron, or any combination thereof. Any of these shells may have a thickness that ranges from 0.5 nm to 1 µm, or 0.5 nm to 200 nm, or any range subsumed therein.

In another embodiment, an intercalating particle is a crystalline metal oxide particle. A metal oxide is any compound that has at least one oxygen atom (anion with an oxidation state of −2) and at least one metal atom. Many metal oxides contain multiple metal atoms that may all be the same or that may include a variety of metals. A wide range of metal to oxygen atom ratios is possible, as would be understood by a person with ordinary skill in the art. When metal oxides form ordered, periodic structures, they are crystalline. Such crystalline metal oxides can diffract x-ray radiation in a pattern of peaks of varying intensities characteristic of their crystal structure. In one embodiment, a crystalline metal oxide particle consists exclusively or essentially of an oxide of at least one of the following metals: bismuth, tin, tellurium, antimony, lead, vanadium, chromium, molybdenum, boron, manganese, cobalt, and alloys, composites or other combinations thereof.

For the structures disclosed herein and described in more detail below, as crystalline metal oxide particles are heated, it is useful if they begin to melt (i.e., reach their melting point ($T_M$)) at a lower temperature than the temperature at which significant interdiffusion can occur within the structure between or among metal particles of different compositions. The melting point of crystalline materials in a mixed layer can be determined using a heating stage and x-ray diffraction; as a sample is heated above its melting point, diffraction peaks diminish and then disappear. In some exemplary embodiments, boron (III) oxide ($B_2O_3$ $T_M$=450° C.), vanadium (V) oxide ($V_2O_5$ $T_M$=690° C.), tellurium (IV) oxide ($TeO_2$ $T_M$=733° C.), and bismuth (III) oxide ($Bi_2O_3$ $T_M$=817° C.) can deform during the firing process and intercalate into an adjacent porous metal particle layer, creating the modified metal particle layer. In an exemplary embodiment, the intercalating particles are crystalline bismuth oxide with a D50 between 50 nm and 2 µm and a specific surface area between 1 and 5 m²/g. In another embodiment, a crystalline metal oxide particle also contains a small amount (i.e., less than 10 wt %) of one or more additional elements that may adjust the melting point of the particle. Such additional elements include, but are not limited to, silicon, germanium, lithium, sodium, potassium, cesium, magnesium, calcium, strontium, barium, zirconium, hafnium, vanadium, niobium, chromium, molybdenum, manganese, rhenium, iron, cobalt, zinc, cadmium, gallium, indium, carbon, nitrogen, phosphorous, arsenic, antimony, sulfur, selenium, fluorine, chlorine, bromine, iodine, lanthanum, and cerium.

In another embodiment, an intercalating particle is a glass frit particle. In one embodiment, a glass frit particle consists exclusively or essentially of the combination of oxygen and at least one of the following elements: silicon, boron, germanium, lithium, sodium, potassium, cesium, magnesium, calcium, strontium, barium, zirconium, hafnium, vanadium, niobium, chromium, molybdenum, manganese, rhenium, iron, cobalt, zinc, cadmium, gallium, indium, carbon, tin, lead, nitrogen, phosphorous, arsenic, antimony, bismuth, sulfur, selenium, tellurium, fluorine, chlorine, bromine, iodine, lanthanum, cerium, oxygen, and alloys, composites, and other combinations thereof. It is useful if the glass frit has a softening point below 900° C. or below 800° C. in order to effectively deform during firing. In an exemplary embodiment, the intercalating particles are bismuth silicate glass frit particles with a D50 between 50 nm and 2 µm and a specific surface area between 1 and 5 m²/g.

The term "organic vehicle" describes mixtures or solutions of organic chemicals or compounds that assist in dissolving, dispersing and/or suspending solid components in a paste. For the intercalation pastes described herein, many different organic vehicle mixtures may be used. Such organic vehicles may or may not contain thixotropes, stabilizers, emulsifiers, thickeners, plasticizers, surfactants and/or other common additives.

Components of organic vehicles are well known to a person with ordinary skill in the art. Major constituents of organic vehicles include one or more binders and one or more solvents. Binders may be polymeric or monomeric organic compounds, or "resins," or a mixture of the two. Polymeric binders may have a variety of molecular weights and a variety of polydispersity indices. Polymeric binders may include a combination of two different monomeric units that are known as copolymers, in which monomeric units may either alternate singly or in large blocks (block copolymers). Poly-sugars are commonly used polymeric binders and include, but are not limited to, alkyl cellulose and alkyl derivatives such as methyl cellulose, ethyl cellulose, propyl cellulose, butyl cellulose, ethylhydroxyethyl cellulose, derivatives and mixtures thereof. Other polymeric binders include, but are not limited to, polyesters, polyethylenes, polypropylenes, polycarbonates, polyurethanes, polyacrylates (including polymethacrylate and polymethymethacrylate), polyvinyls (including polyvinylchloride, polyvinylpyrrolidone, polyvinylbutyral, polyvinyl acetate), polyamides, polyglycols (including polyethylene glycol), phenolic resins, poly-terpenes, derivatives and combinations thereof. An organic vehicle binder may include between 1 and 30 wt % binder.

Solvents are organic species that are usually removed from pastes during processing by thermal means such as vaporization. In general, solvents that can be used in the pastes described herein include, but are not limited to, polar, non-polar, protic, aprotic, aromatic, non-aromatic, chlorinated, and non-chlorinated solvents. Examples of solvents that can be used in the pastes described herein include, but are not limited to, alcohols, di-alcohols (including glycols), multi-alcohols (including glycerol), mono- and poly-ethers, mono- and poly-esters, alcohol ethers, alcohol esters, mono- and di-substituted adipate esters, mono- and poly-acetates, ether acetates, glycol acetates, glycol ethers (including ethylene glycol monobutyl ether, diethylene glycol monobutyl ether, and triethylene glycol monobutyl ether), glycol ether acetates (including ethylene glycol monobutyl ether acetate), linear or branched saturated and unsaturated alkyl chains (including butane, pentane, hexane, octane, and decane), terpenes (including alpha-, beta-, gamma-, and 4-terpineol), 2,2,4-trimethyl-1,3-pentanediol monoisobutyrate (also known as Texanol™), 2-(2-ethoxyethoxy)ethanol (also known as Carbitol™), derivatives, combination, and mixtures thereof.

In one arrangement, an organic vehicle contains between 70 and 100 wt % solvent. The proportion and composition of the binder, solvent, and any additives may be adjusted to achieve a desired dispersion or suspension of paste particles, a desired carbon content, and/or desired rheological properties, as would be understood by a person with ordinary skill in the art. For example, paste rheology can be modified by adding thixatropic agents such as Thixatrol Max®. In another example, the carbon content of the organic vehicle may be increased or decreased by modifying the binder and thixatropic agent and taking into account peak firing temperature, firing profile, and airflow that will occur during thermal annealing. Minor additives may also be included. Such additives include, but are not limited to, thixotropic agents and surfactants. Such additives are well known in the art and useful amounts of such components can be determined through routine experimentation to maximize device efficiency and reliability. In one embodiment of the invention, a metallization paste has a viscosity between 10,000 and 200,000 cP at 25° C. and at a sheer rate of 4 $sec^{-1}$ as measured using a temperature-controlled Brookfield RVDV-II+ Pro viscometer.

Intercalation Paste Formulations

Exemplary composition ranges of intercalation pastes are shown in Table I, according to some embodiments of the invention. In various embodiments, the intercalation paste has a solids loading between 30 wt % and 80 wt %, precious metal particles make up between 10 wt % and 70 wt % of the intercalation paste, intercalating particles make up at least 10 wt %, 15 wt %, 20 wt %, 25 wt %, 30 wt %, or 40 wt % of the intercalation paste, and the ratio of intercalating particles to precious metal particles is at least 1:5 by weight. In an exemplary embodiment, the precious metal particle content is 50 wt %, and the intercalating particles make up at least 10 wt % of the intercalation paste. In various embodiments, the ratio of intercalating particles to precious metal particles in the intercalation paste is at least 1:5, or 2:5, or 3:5, or 1:1, or 5:2 by weight.

TABLE I

Intercalation Paste Formulations by Weight Percent (wt %)

| Paste Type | Precious Metal Particles | Intercalating Particles | Organic Vehicle |
| --- | --- | --- | --- |
| Intercalation Paste (range I) | 10-70 | 10-50 | 20-70 |
| Intercalation Paste (range II) | 20-50 | 10-35 | 30-60 |
| Intercalation Paste A | 50 | 12.5 | 37.5 |
| Intercalation Paste B | 45 | 30 | 25 |
| Intercalation Paste C | 45 | 30 | 25 |
| Intercalation Paste D | 30 | 20 | 50 |

In one embodiment of the invention, for solar cell applications, an intercalation paste contains between 20 and 50 wt % precious metal particles (i.e., intercalation paste range II in Table I) and between 10 and 35 wt % intercalating particles, which may include LTBM, crystalline metal oxides, glass frits, or a combination thereof. In one embodiment, the intercalating particles are metallic bismuth particles. Intercalation paste A (Table I) may contain 50 wt % silver particles, 12.5 wt % bismuth particles, and 37.5 wt % organic vehicle, resulting in a 1:4 ratio (by weight) of intercalating particles to precious metal particles. Intercalation paste C (Table I) may contain 45 wt % silver particles, 30 wt % bismuth particles, and 25 wt % organic vehicle, resulting in a 1:1.5 ratio (by weight) of intercalating particles to precious metal particles. When the intercalation paste comprises silver and bismuth particles, the notation Ag:Bi is used.

In another embodiment, the intercalating particles are glass frit particles. Intercalation paste B (Table I) may contain 45 wt % silver particles, 30 wt % bismuth-based glass frit particles, and 25 wt % organic vehicle, resulting in a 1:1.5 ratio (by weight) of intercalating particles to precious metal particles. In another embodiment, intercalating particles are a mixture of LTBMs, crystalline metal oxide particles, and glass frit particles. Intercalation paste D (Table I) may contain 30 wt % silver particles, 15 wt % metallic bismuth particles, 5 wt % high-lead-content glass frit particles and 50 wt % organic vehicle. The formulation of the intercalation pastes can be adjusted to achieve a desired bulk resistance, contact resistance, layer thickness, and/or peel strength for a particular metal layer.

In another embodiment of the invention, a method of forming an intercalation paste includes the steps of providing precious metal particles, providing intercalating particles, and mixing the precious metal particles and intercalating particles together in an organic vehicle. In one arrangement, the intercalating particles are added to the organic vehicle and mixed in a planetary mixer (e.g., Thinky AR-100) and then the precious metal particles (and additional organic vehicle, if desired) are added and mixed in the planetary mixer. The intercalation paste may or may not then be milled, for example, by using a three roll mill (e.g., Exakt 50 I). In one arrangement, the intercalation paste contains between 10 and 70 wt % precious metal particles and more than 10 wt % intercalating particles.

Methods of Forming a Fired Multilayer Stack

In one embodiment of the invention, a fired multilayer stack includes a substrate on which there is at least one metal particle layer and at least one intercalation layer. In one embodiment, a fired multilayer stack is formed using a co-firing process that involves the following steps: applying a metal particle layer onto a substrate surface, drying the metal particle layer, applying an intercalation layer directly on a portion of the dried metal particle layer, drying the intercalation layer, and then co-firing the multilayer stack. In another embodiment, a fired multilayer stack is formed using a sequential firing process that involves the following steps: applying a metal particle layer onto a substrate surface, drying the metal particle layer, firing the metal particle layer, applying an intercalation layer directly on a portion of the fired metal particle layer, drying the intercalation layer and then firing the multilayer stack. In one embodiment, during firing, a portion of the intercalation layer penetrates into the metal particle layer, thereby transforming the metal particle layer into a modified metal particle layer. In some embodiments, each applying step involves a method selected independently from the group consisting of screen printing, gravure printing, spray deposition, slot coating, 3D printing and inkjet printing. In one embodiment, a metal particle layer is applied by screen printing a metal particle paste on a portion of a substrate, and an intercalation layer is applied by screen-printing an intercalation paste directly on a portion of a metal particle layer after it has been dried. In one embodiment, a portion of a substrate surface is covered by at least one dielectric layer and a metal particle layer is applied onto a portion of the dielectric layer.

Dried and Fired Multilayer Stack Morphology

FIG. 1 is a schematic cross-section drawing that shows a multilayer stack 100 before it is co-fired, according to an embodiment of the invention. A dried metal particle layer 120, is directly on a portion of a substrate 110. An intercalation layer 130, made up of intercalating particles and precious metal particles, as described above, is directly on a portion of the dried metal particle layer 120. In various embodiments of the invention, the intercalation layer 130 has an average thickness between 0.25 µm and 50 µm, between 1 µm and 25 µm, between 1 µm and 10 µm, or any range subsumed therein. In one embodiment of the invention, the intercalation layer 130 includes precious metal particles, intercalating particles, and optional organic binder (which may remain in the intercalation layer 130 after drying). Prior to co-firing, the precious metal particles and intercalating particles may be homogeneously distributed within the intercalation layer 130. In one arrangement, the precious metal particles and the intercalating particles are not deformed after drying (and prior to firing), retaining their original size and shape.

In one embodiment of the invention, the dried metal particle layer 120 is porous and includes at least one of aluminum, copper, iron, nickel, molybdenum, tungsten, tantalum, titanium, and alloys, composites, and other combinations thereof. In one arrangement, prior to co-firing, the dried metal particle layer 120 contains metal particles, and may or may not contain organic binder, and may or may not contain non-metallic particles such as glass frit. The metal particles are typically not deformed after drying (and prior to firing), retaining their original size and shape.

During firing, the intercalating particles from the intercalation layer 130 intercalate into a portion of the dried metal particle 120 layer adjacent to (shown as below in FIG. 1) the intercalation layer 130. The portion of the dried metal particle layer 120 adjacent to the intercalation layer 130 and into which the intercalating particle material penetrates is called the "modified metal particle layer" for the purposes of this disclosure. After firing, the remaining portion of the dried metal particle layer 120 that is not adjacent to the intercalation layer and into which no, or only trace amounts of intercalating particle material penetrates, is referred to as the "metal particle layer" for the purposes of this disclosure. In one arrangement, during firing, particles in the dried metal particle layer 120 may sinter or melt, so that the metal particle layer has a different morphology and less porosity than the dried metal particle layer 120. The changes that occur during firing and the fired multilayer stack structure are discussed in more detail below.

Figure 2:
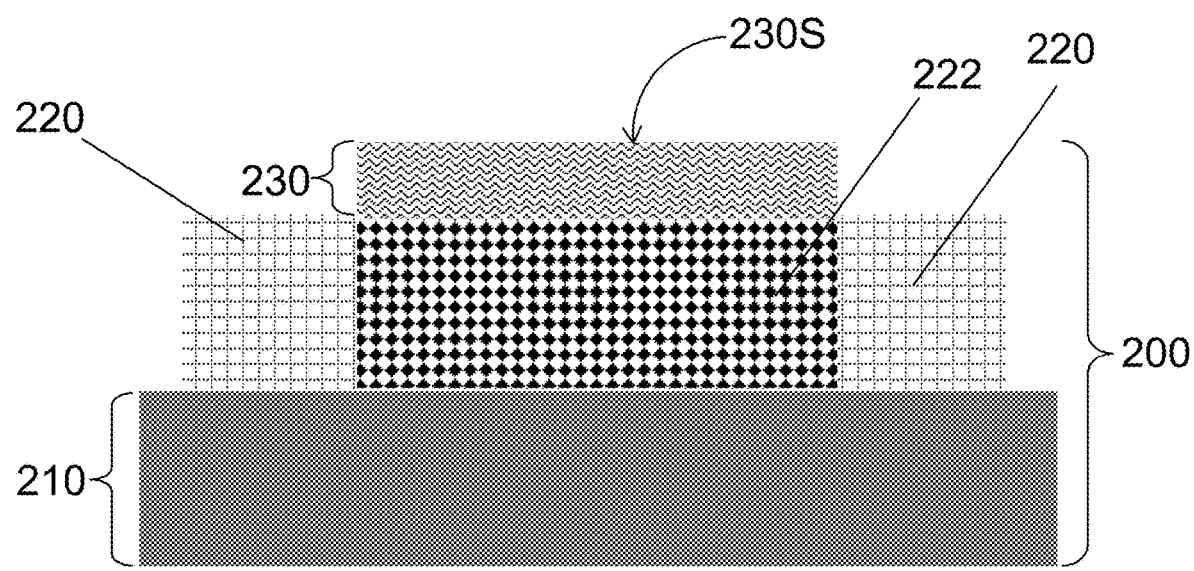
FIG. 2 is a schematic cross-section drawing of a fired multilayer stack, according to an embodiment of the invention.

FIG. 2 is a schematic cross-section drawing that shows a fired multilayer stack 200 (the structure 100 of FIG. 1 after it has been fired), according to an embodiment of the invention. The fired multilayer stack 200 includes a modified (due to firing) metal particle layer 222 adjacent to at least a portion of a substrate 210 and a modified (due to firing) intercalation layer 230 adjacent to the modified metal particle layer 222. During firing, at least a portion of the precious metal particles and intercalating particles in the intercalation layer (shown as 130 in FIG. 1 before firing) form phases that phase separate from each other. The precious metal particles may sinter or melt, changing the morphology and reducing the porosity of the modified intercalation layer 230. At least a portion of the intercalating particles melt and flow, or intercalate, into the adjacent modified metal particle layer 222 as at least a portion of the precious metal particles (which may sinter or melt) move toward a solderable surface 230S of the modified intercalation layer 230. The modified metal particle layer 222 includes metal particles into which material from the intercalating particles in the intercalation layer (shown as 130 in FIG. 1 before firing) has penetrated, altering the material properties of a portion of the dried metal particle layer (shown as 120 in FIG. 1 before firing) to form the modified metal particle layer 222. The material from the intercalating particles may connect loosely packed metal particles in the modified metal particle layer 222, or it may coat metal particles that are already in contact with one another in the modified metal particle layer 222.

In some arrangements, there are also metal particle regions 220 into which little or only trace amounts of intercalation particle material have penetrated. In one arrangement, a metal particle layer 220, which is not in direct contact with the modified intercalation layer 230, does not contain an increased concentration of elements from the intercalation particles. In some arrangements, the metal particle layer 220 and the modified metal particle layer 222 form a compound(s) with the substrate 210 or dope the substrate 210 during co-firing (not shown). Although FIG. 2 indicates sharp boundaries between the metal particle layer regions 220 and the modified metal particle layer 222, it should be understood that the boundary is not generally sharp. In some arrangements, the boundary is determined by the extent of lateral diffusion of the modified intercalation layer 230 material into the metal particle layer 220 during co-firing.

Figure 3:
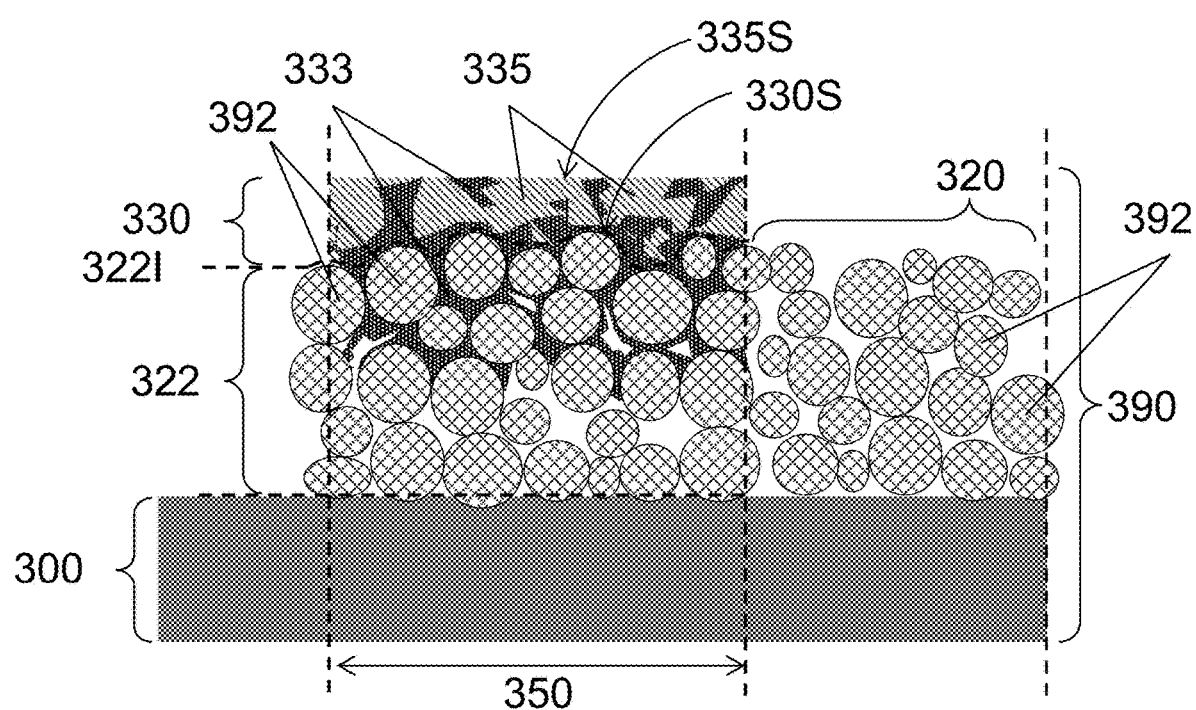
FIG. 3 is a schematic cross-section drawing of a fired multilayer stack in which the intercalation layer has phase separated.

In some embodiments of the invention, the materials in the modified intercalation layer 230 in FIG. 2 are phase separated into a phase that contains material from the intercalating particles and a phase that contains the precious metal. FIG. 3 is a schematic cross-section drawing that shows a fired multilayer stack 390 (equivalent to structure 200 of FIG. 2) and in which the intercalation layer 330 has phase separated. The fired multilayer stack 390 (within region 350 only) includes a modified (due to firing) metal particle layer 322 in region 350 between a portion of a substrate 300 and a modified (due to firing) intercalation layer 330. A metal particle layer 320 that contains metal particles 392 is on the substrate 300 adjacent to the multilayer stack region 350.

The modified intercalation layer 330 contains two phases: a precious metal phase 335 and an intercalation phase 333 and has a solderable surface 335S. Most (at least more than 50%) of the solderable surface is made up of the precious metal phase 335. In some arrangements, the precious metal phase 335 and intercalation phase 333 do not phase separate completely during firing, so that there is also some of the intercalation phase 333 at the solderable surface 335S. The modified metal particle layer 322 contains metal particles 392 and a portion of material from the intercalation phase 333. There is an interface 3221 between the modified intercalation region 330 and the adjacent metal particles 392 in the modified metal particle layer 322. The interface 3221 may not be smooth and is dependent on the size and shape of the metal particles 392, as well as the firing conditions. In embodiments where optional glass frit has been included in the dry metal particle layer (120 in FIG. 1) before firing, the modified metal particle layer 322 and the metal particle layer 320 may also contain a small amount of glass frit (not shown), which makes up less than 3 wt % of the layer.

Figure 4:
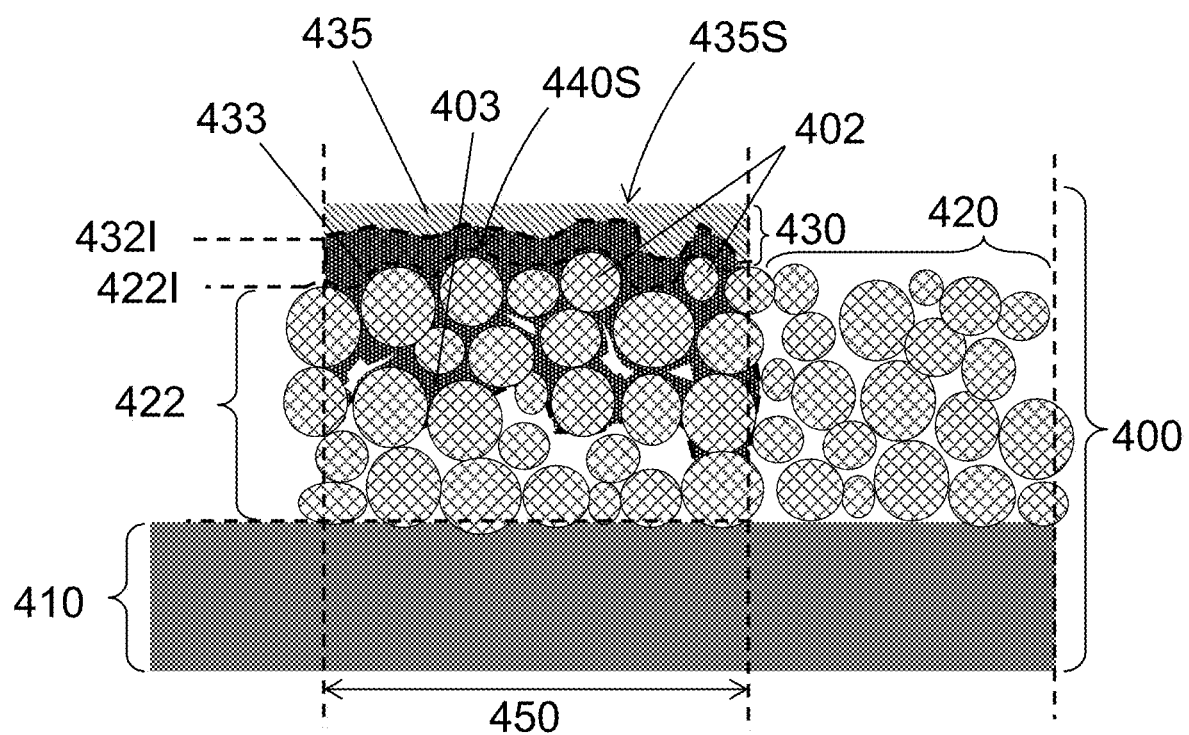
FIG. 4 is a schematic cross-section drawing of a fired multilayer stack in which the intercalation layer has phase separated into two sublayers.

In other embodiments, the materials in the modified intercalation layer 230 in FIG. 2 are phase separated into to form a layered structure. FIG. 4 is a schematic cross-section drawing that shows a fired multilayer stack 400 (equivalent to the structure 200 of FIG. 2) including an intercalation layer with two sublayers. The fired multilayer stack 400 (within region 450 only) includes a modified (due to firing) metal particle layer 422 in region 450 between a portion of a substrate 410 and a modified (due to firing) intercalation layer 430. A metal particle layer 420 that contains metal particles 402 is on the substrate 410 adjacent to the multilayer stack region 450.

The modified intercalation layer 430 contains two sublayers: an intercalation sublayer 433 directly on the modified metal particle layer 422 and a precious metal sublayer 435 directly on the modified intercalation layer 433. The precious metal sublayer 435 has a solderable surface 435S. The modified metal particle layer 422 contains metal particles 402 and some material 403 from the intercalation sublayer 433. There is an interface 4221 between the modified intercalation layer 430 (or the modified intercalation layer 433) and the top-most metal particles 402 in the modified metal particle layer 422. In embodiments where optional glass frit has been included in the dry metal particle layer (120 in FIG. 1) before firing, the modified metal particle layer 422 and the metal particle layer 420 may also contain a small amount of glass frit (not shown), which makes up less than 3 wt % of the layer.

Cross-sectional SEM imaging was used to identify the layers and measure the layer thicknesses in a multilayer stack. Average layer thicknesses of layers in a fired multilayer stack were obtained by averaging at least ten thickness measurements, each separated by at least 10 μm, across a cross-sectional image. In various embodiments of the invention, a metal particle layer (such as 220 in FIG. 2) has an average thickness between 0.5 μm and 100 μm, between 1 μm and 50 μm, between 2 μm and 40 μm, between 20 μm and 30 μm, or any range subsumed therein. Such a metal particle layer on a substrate is typically smooth with a minimum and maximum layer thickness within 20% of the average metal particle layer thickness over a 1×1 mm area. In addition to cross-section SEM, the layer thickness and variation over the described area can be accurately measured using an Olympus LEXT OLS4000 3D Laser Measuring Microscope and/or a profilometer such as a Veeco Dektak 150.

In an exemplary embodiment, a metal particle layer (such as 220 in FIG. 2) is made of sintered aluminum particles and has an average thickness of 25 μm. The porosity of the metal particle layer can be measured using a mercury porosimeter such as a CE instrument Pascal 140 (low pressure) or Pascal 440 (high pressure) in a range between 0.01 kPa and 2 Mpa. Fired metal particle layers may have porosities between 1% and 50%, between 2% and 30%, between 3% and 20%, or any range subsumed therein. Fired metal particle layers made of aluminum particles and used in solar applications may have a porosity between 10% and 18%.

The thicknesses of an intercalation sublayer and of the precious metal sublayer, such as those shown schematically as 433 and 435, respectively, in FIG. 4, were measured in an actual multilayer stack using cross-sectional SEM/EDX. The sublayers were distinguished in SEM due to the differences in contrast between the intercalation and precious metal phases. EDX mapping was used to identify the location of the interface shown as 432I in FIG. 4. In various embodiments, the precious metal sublayer has a thickness between 0.5 μm and 10 μm, between 0.5 μm and 5 μm, between 1 μm and 4 μm, or any range subsumed therein. In various embodiments, the intercalation sublayer has a thickness between 0.01 μm and 5 μm, between 0.25 μm and 5 μm, between 0.5 μm and 2 μm, or any range subsumed therein.

In one embodiment of the invention, a modified intercalation layer contains two phases: a precious metal phase and an intercalation phase Such a structure was shown in detail in FIG. 4. Typically, the intercalation phase is not solderable, so it is useful if the solderable surface 230S contains mostly the precious metal phase to ensure solderability. In various arrangements, the solderable surface contains more than 50%, more than 60%, or more than 70% precious metal phase. In one arrangement, the solderable surface of the modified intercalation layer contains mostly precious metal (s). Plan view EDX was used to determine the concentration of elements on the surface of the modified intercalation layer. SEM/EDX was performed with the equipment described above and at an accelerating voltage of 10 kV with a 7 mm sample working distance and 500 times magnification. In various embodiments, at least 70 wt %, at least 80 wt %, at least 90 wt %, at least 95 wt % or at least 98 wt % of the outside surface 230S of the modified intercalation layer 230 contains one or more of gold, silver, platinum, palladium, rhodium, and alloys, composites, and other combinations thereof. The firing conditions, intercalating particle and precious metal particle types and sizes all affect the degree of phase separation in modified intercalation layer morphology.

The modified metal particle layer (shown as 222 in FIG. 2) contains a much higher concentration of the intercalating particle material than does the metal particle layer (shown as 220 in FIG. 2). A comparison of EDX spectra taken from cross-sections of the modified metal particle layer and from the metal particle layer in an actual multilayer stack can be used to determine the concentration of material from the modified intercalation layer that has intercalated into the modified metal particle layer. The SEM/EDX equipment described above, operated at 20 kV with a sample working distance of 7 mm, was used to measure the ratio of metal from the intercalation particles (e.g., bismuth) to total metal (e.g., bismuth and aluminum) in a cross-section sample of the modified metal particle layer. The weight ratio (intercalation metal to total metal) is referred to as the IM:M ratio. A baseline EDX analysis was performed in a region of the metal particle layer that was at least 500 μm away from the modified metal particle layer to ensure reproducible measurements. A second EDX spectrum was taken from the modified metal particle layer, and the spectra were compared. In determining the IM:M ratio, only the peaks of the metallic elements were considered (i.e., peaks from carbon, sulfur, and oxygen were ignored). When analyzing the ratio, precious metals and any metallic elements from the substrate were excluded in order to prevent unreliable results. In an exemplary embodiment, when the dry metal particle layer (shown as 120 in FIG. 1) contained aluminum particles and the intercalation layer 130 contained bismuth and silver particles, the metal particle layer (i.e., after firing) contained approximately 1 wt % bismuth and more than 98 wt % aluminum with a Bi:(Al+Bi) (IM:M) ratio of 1:99. Other intercalation metal components make up less than 0.25 wt % of the modified metal particle layer and are not considered in calculation the IM:M ratio. In various other embodiments, the IM:M ratio is $1:10^6$, 1:1000, 1:100, 1:50, 1:25, or 1:10.

Figure 5:
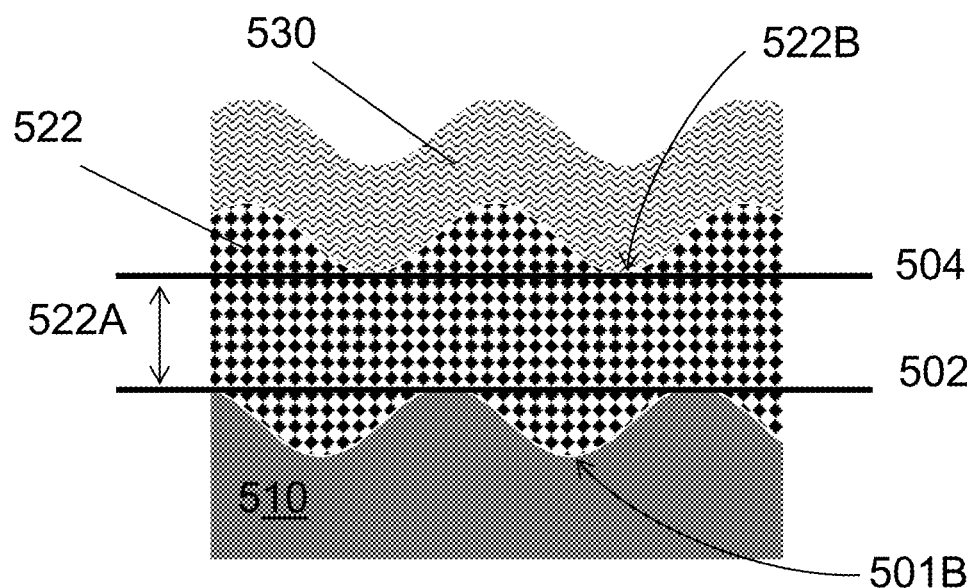
FIG. 5 is a schematic cross-section drawing of a portion of the fired multilayer stack shown in FIG. 2, according to an embodiment of the invention.

It should be noted that substrates may have some surface roughness, which may cause interfaces with them to also be rough. FIG. 5 is a schematic cross-section drawing that shows a portion of such a substrate 510, a modified metal particle layer 522 and a modified intercalation layer 530, according to an embodiment of the invention. There is a non-planar interface 501B between the substrate 510 and the modified metal particle layer 522. There is a non-planar interface 522B between the modified metal particle layer 522 and the modified intercalation layer 530. Line 502 indicates the deepest incursion of the substrate 510 into the modified metal particle layer 522. Line 504 indicates the deepest incursion of the modified intercalation layer 530 into the modified metal particle layer 522. The region of the modified metal particle layer 522 between the line 502 and the line 504 can be referred to as sampling region 522A. In determining the IM:M ratio in the modified metal particle layer 522, it can be useful to limit such analysis to the sampling region 522A in order to avoid spurious results due to interface roughness.

In exemplary embodiments, the IM:M ratio in a modified metal particle layer is 20% higher, 50% higher, 100% higher, 200% higher, 500% higher, or 1000% higher than in a metal particle layer (in regions at least 500 μm away from the modified metal particle layer). In an exemplary embodiment, an intercalation layer containing bismuth particles is on an aluminum particle layer, and the modified metal particle layer (as analyzed in a sampling region such as that shown as 522A in FIG. 5) contains 4 wt % bismuth and 96 wt % aluminum for a Bi:(Al+Bi) (or IM:M) ratio of 1:25. The Bi:(Al+Bi) ratio is 400% higher in the modified metal particle layer than in the metal particle layer.

When an intercalation layer contains crystalline metal oxides and/or glass frits that contain more than one metal, the intercalation metal components are quantified by EDX and summed to determine to IM:M ratio. For example, if a glass frit contains both bismuth and lead, then the ratio is defined as (Bi+Pb):(Bi+Pb+Al).

In various embodiments, a fired multilayer stack also includes a solid compound layer formed from interactions between metal particles in a dried metal particle layer and a substrate during firing. The solid compound layer can include, but is not limited to, alloys, eutectics, composites, mixtures, or combinations thereof. In one arrangement, a modified metal particle layer and a substrate form solid compound region(s) at their interface. The solid compound region(s) may contain one or more alloys. The solid compound region(s) may be continuous (a layer) or semi-continuous. Depending on the composition of the substrate and metal particle layer, alloy(s) or other compounds that form may include one or more of aluminum, copper, iron, nickel, molybdenum, tungsten, tantalum, titanium, silicon, oxygen, carbon, germanium, gallium, arsenic, indium and phosphorous. For example, aluminum and silicon can form a eutectic above 660° C. which, upon cooling, results in a solid aluminum-silicon (Al—Si) eutectic layer at the silicon interface. In an exemplary embodiment, the solid compound layer is a solid Al—Si eutectic layer formed on a portion of the silicon substrate. The formation and morphology of the solid Al—Si eutectic layer is well known in silicon solar cells. In another embodiment, a substrate is doped with at least one of aluminum, copper, iron, nickel, molybdenum, tungsten, tantalum, titanium, and alloys, composites, and other combinations thereof. In one example, aluminum is a p-type dopant in silicon and, during firing, aluminum from an aluminum particle layer adjacent to the substrate, provides more aluminum dopant to form a highly p-type doped region in the silicon substrate, which is known as the back-surface field.

Depending on the atmospheric conditions, intercalating particles may undergo multiple phase changes as they melt and intercalate into a modified metal particle layer in a fired multilayer stack. Depending on the materials in the modified metal particle layer and in the substrate, the intercalating particles may also form crystalline compounds as they intercalates into the modified metal particle layer. Such crystalline compounds can improve cohesion between metal particles in the modified metal particle layer, prevent inter-diffusion of certain elements, and/or reduce electrical contact resistance between metal layers in the fired multilayer stack. In one embodiment, the modified intercalation layer and the modified metal particle layer contain crystallites made up of bismuth and at least one other of oxygen, silicon and silver and alloys, composites, and other combinations thereof.

In one embodiment of the invention, a precious metal phase includes at least one material selected from the group consisting of gold, silver, platinum, palladium, rhodium, and alloys thereof, composites thereof, and other combinations thereof. In one arrangement, the precious metal phase consists essentially of one or more of these materials. When one of these materials makes up the majority of the precious metal phase, the precious metal phase is described as being rich in that material. For example, if a precious metal phase, precious metal layer, or precious metal sublayer contains mostly silver, it can be referred to a silver-rich region, silver-rich layer, or silver-rich sublayer, respectively.

An intercalation phase contains elements from intercalating particles and may also include elements from the outside environment (e.g., oxygen) and small quantities of elements from precious metal particles in an adjacent metal particle layer, and a nearby substrate, which have been incorporated during firing. A wide array of elements may be in the intercalation phase depending on whether low-temperature base metals, crystalline metal oxides and/or glass frits are used as intercalating particles. In one embodiment (when the intercalating particles are low temperature base metals exclusively), the intercalation phase contains at least one material selected from the group consisting of bismuth, boron, tin, tellurium, antimony, lead, oxygen, and alloys, composites, and other combinations thereof. In another embodiment (when the intercalating particles are crystalline metal oxides exclusively), the intercalation phase contains at least one material selected from the group consisting of oxides of bismuth, tin, tellurium, antimony, lead, vanadium chromium, molybdenum, boron, manganese, cobalt, and alloys, composites, and other combinations thereof. In another embodiment (when the intercalating particles are glass frits exclusively), the intercalation phase contains oxygen and at least one of the following elements: silicon, boron, germanium, lithium, sodium, potassium, cesium, magnesium, calcium, strontium, barium, zirconium, hafnium, vanadium, niobium, chromium, molybdenum, manganese, rhenium, iron, cobalt, zinc, cadmium, gallium, indium, carbon, tin, lead, nitrogen, phosphorous, arsenic, antimony, bismuth, sulfur, selenium, tellurium, fluorine, chlorine, bromine, iodine, lanthanum, cerium, and alloys, composites, and other combinations thereof. When one of these materials makes up the majority of the intercalation region, the intercalation region is described as being rich in that material. For example, if an intercalation region, intercalation layer, or intercalation sublayer contains mostly bismuth, it can be referred to a bismuth-rich region, bismuth-rich layer, or bismuth-rich sublayer, respectively.

Examples of Fired Multilayer Stacks and Applications

Metal particle layers that contain mostly aluminum, copper, iron, nickel, molybdenum, tungsten, tantalum, and titanium are not solderable with mildly activated (RMA) fluxes and tin-based solders after firing. Yet, in solar cells and other devices, it is highly desirable to solder ribbons to make electrical connections with metal particle layers such as aluminum particle layers. As is disclosed herein, inventive intercalation pastes that contain precious metals such as silver and gold can be used on metal particle layers and fired in air to produce surfaces that are highly solderable. This is in contrast to other attempts to increase the solderability of metal particle layers by adding precious metals, as precious metals usually interdiffuse with the metal particle layers (e.g., aluminum) upon firing in multilayer stacks, resulting in a solderable surface that contains too little precious metal to solder well. For example, firing a layer of commercially available silver rear tabbing paste that contains less than 10 wt % glass frit on an aluminum particle layer does not result in a solderable surface. Such layers experience significant silver-aluminum interdiffusion during the firing step and the resulting silver aluminide surface is not solderable Intercalation layers, as disclosed herein, can be used to modify the material properties of metal particle layers in order to 1) to block diffusion of precious metals and provide a solderable surface, 2) mechanically strengthen the metal particle layer and 3) assist in etching layers beneath the metal particle layers. In one embodiment of the invention, multilayer stacks were formed using intercalation pastes that contain precious metal particles made of silver and intercalating particles made of bismuth metal or bismuth based glass frits, and adjacent metal particle layers that contain aluminum particles. Fired multilayer stacks were formed by screen printing aluminum pastes (commonly used for solar cell applications) on a bare silicon wafer, drying the sample at 250° C. for 30 seconds, screen printing the intercalation paste on a portion of the dried aluminum particle layer, drying the sample at 250° C. for 30 seconds and co-firing the sample using a spike fire profile with a peak temperature between 700° C. and 820° C. and a ramp up and cool down rate greater than 10° C./sec. All drying and firing steps were performed using a Despatch CDF 7210 furnace that is commonly used for silicon solar manufacturing.

SEM/EDS analysis was used to determine the elemental composition of various regions in polished, cross-sectioned fired multilayer stacks and to study the intercalation process. SEM/EDX was performed with the equipment previously described using two different modes of operation. SEM micrographs were imaged with a Zeiss Gemini Ultra-55 analytical field emission SEM using two modes referred to as the SE2 and Inlens. The SE2 mode was operated at 5-10 kV and a working distance of 5-7 mm with the SE2 secondary electron detector and scanning cycle time of 10 seconds. The brightness and contrast were varied between 0 and 50% and between 0 and 60%, respectively in order to maximize contrast between the intercalation region and the Al particles. The Inlens mode was operated at 1-3 kV and a working distance of 3-7 mm with the InLens secondary electron detector and scanning cycle time of 10 seconds. In order to image the BSF in the Inlens mode, the brightness was set to 0% and the contrast set to around 40%.

In one embodiment of the invention, intercalation pates that include 10-15 wt % intercalating particles block interdiffusion between precious metal (i.e., silver) and metal particles (i.e., aluminum). Intercalation paste A (shown in Table I) includes 12.5 wt % bismuth particles and 50 wt % Ag, resulting in a ratio of intercalating particles to precious metal particles of 1:4 by weight. A fired multilayer stack was made as described above. SEM of the fired multilayer stack was performed in SE2 mode with the equipment described above at an accelerating voltage of 5 kV, a working distance of 7 mm, and 4000 times magnification.

Figure 6:
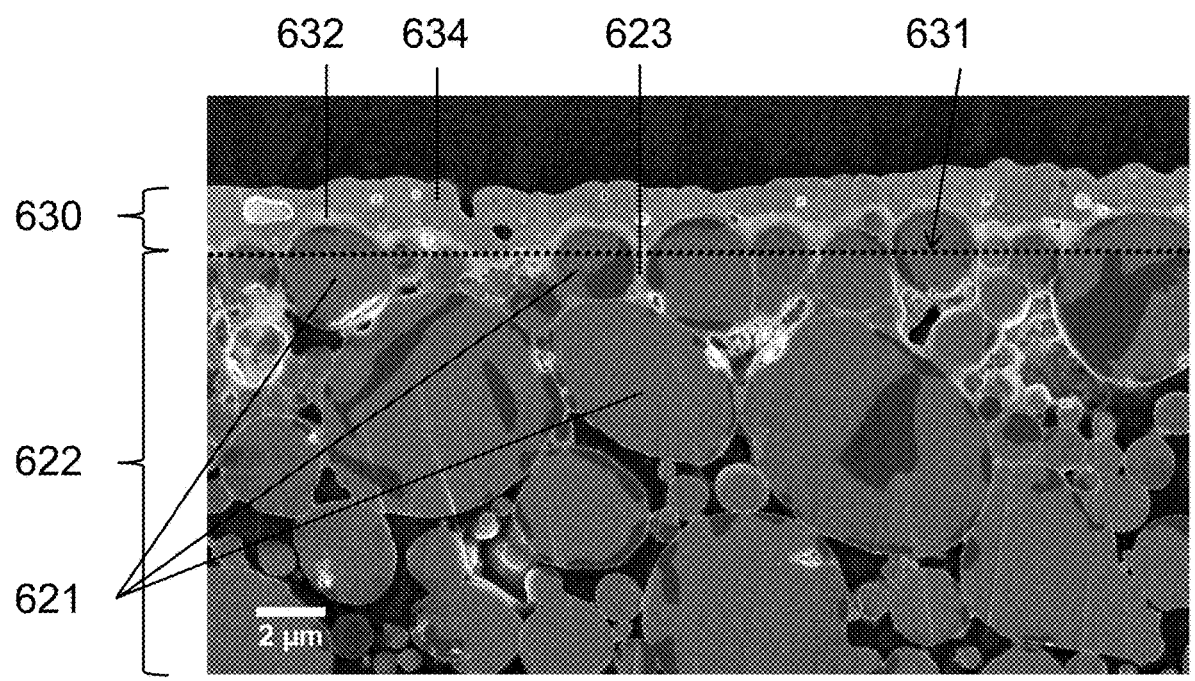
FIG. 6 is a scanning electron microscope (SEM) cross-section image of a co-fired multilayer stack, according to an embodiment of the invention.

FIG. 6 is a scanning electron microscope cross-section image of the co-fired multilayer stack. There is a modified intercalation layer 630 directly on a modified metal particle layer 622. The modified intercalation layer 630 includes a bismuth-rich (intercalation phase) sublayer 632 that comprises bismuth oxide and a silver-rich (precious metal) sublayer 634. The modified metal particle layer 622 contains aluminum particles 621 and intercalation phase material 623 that has spread out from the bismuth rich sublayer 632. The intercalation region 632 is directly on the aluminum particles 621, at least near interface region 631. The intercalation sublayer 632 seems to prevent interdiffusion of silver from the modified intercalation layer 630 and aluminum from the modified metal particle layer 622 during the co-firing process. FIG. 6 is an example of the layered structure described in FIG. 4 above. The precious metal sublayer 634 provides a surface (away from the modified metal particle layer 622) that is highly solderable. The intercalation phase material 623 does not penetrate far into the modified metal particle layer 622. The modified metal particle layer 622 contains mostly aluminum particles that are weakly sintered together and have poor mechanical strength after co-firing. There was not enough bismuth available to penetrate deeply into the metal particle layer 622, and the intercalation sublayer 632 may apply stress to the modified metal particle layer 622, which can mechanically weaken the co-fired multilayer stack. The peel strength of such a co-fired multilayer stack is less than 0.4 N/mm (Newton per millimeter) with the predominant failure mechanism between Al particles. Current solar industry standards require peel strengths greater than 1 N/mm to be considered commercially viable.

Figure 7:
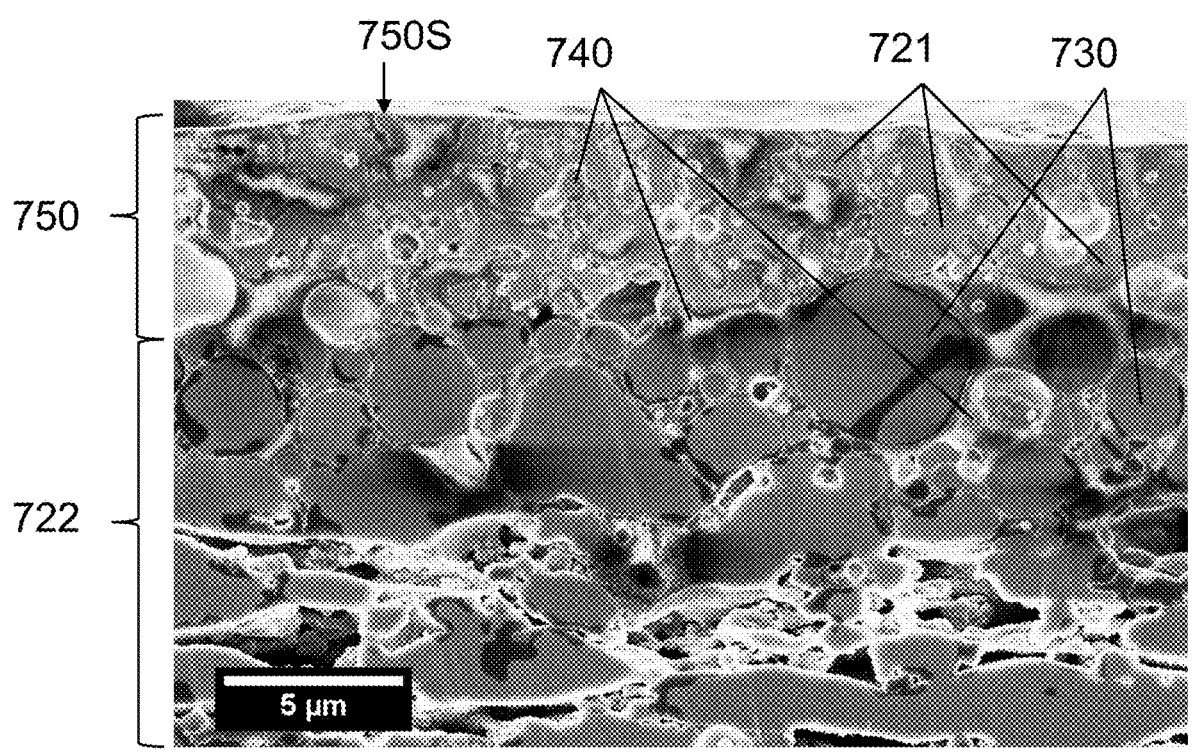
FIG. 7 is a scanning electron micrograph (SEM) cross-section image of a co-fired multilayer stack that has a silver-bismuth frit layer.

Intercalation paste B (shown in Table I) uses a glass frit as the intercalating particles to achieve a solderable surface. Intercalation paste B contains 30 wt % bismuth-based glass frit (intercalating) particles and 45 wt % Ag, resulting in a ratio of intercalating particles to precious metal particles be 1:1.5 by weight. The glass frit contains mainly bismuth and has a glass transition temperature of 387° C. and a softening point of 419° C. SEM of the fired multilayer stack was performed in SE2 mode with the equipment described above at an accelerating voltage of 5 kV, a working distance of 7 mm, and 4000 times magnification. FIG. 7 is a scanning electron microscope cross-section image of such a co-fired multilayer stack, according to an embodiment of the invention. A modified metal particle layer 722 contains aluminum particles 730. During co-firing, the bismuth-based glass frit does not completely phase separate from the Ag particles, resulting in a modified intercalation layer 750 that has two phases: a precious metal phase 721 and a bismuth-based intercalation phase 740 similar to those shown in FIG. 3 above. A surface 750S on the modified intercalation layer 750 contains more than 50% precious metal phase 721. The surface 750S is solderable with fluxes commonly used in the solar cell industry (e.g., Kester 952S, Kester 951 and Alpha NR205). The overall peel strength of the fired multilayer stack is less than 0.5 N/mm, which may be due to the relatively low penetration of the bismuth intercalation phase 740 into the modified aluminum particle layer 722. In general, the morphology of the modified intercalation layer can be modified by changing the intercalating particles composition and loading in the intercalation layer.

Intercalation Pastes Blocking Elemental Interdiffusion and Strengthening Underlying Metal Particle Layers The above examples illustrate two paste formulations engineered to block interdiffusion between precious metal (i.e., silver) and metal particles (i.e., aluminum) but whose fired layers lack adequate mechanical strength when soldered. Intercalation paste C (shown in Table I) contains 30 wt % bismuth particles and 45 wt % silver particles (i.e., Ag:Bi intercalation paste), resulting in a ratio of intercalating particles to precious metal particles of 1:1.5 by weight. The increased intercalating particle content in the paste yields a higher concentration of intercalation material in the modified metal particle layer and results in a mechanically stronger fired multilayer stack. Intercalation paste C was used as a drop-in replacement for a commercial silver rear tabbing paste during the fabrication of a BSF, multicrystalline, p-type solar cell. Intercalation paste C may also be referred to as a silver-on-aluminum (Ag-on-Al), rear tabbing, floating rear tabbing, or tabbing intercalation paste. A suite of characterization tools was used on the resulting fired multilayer stack in order to assess the IM:M (intercalation metal: metal) ratio, precious metal surface coverage, and determine if crystallites formed in the intercalation region.

Figure 8:
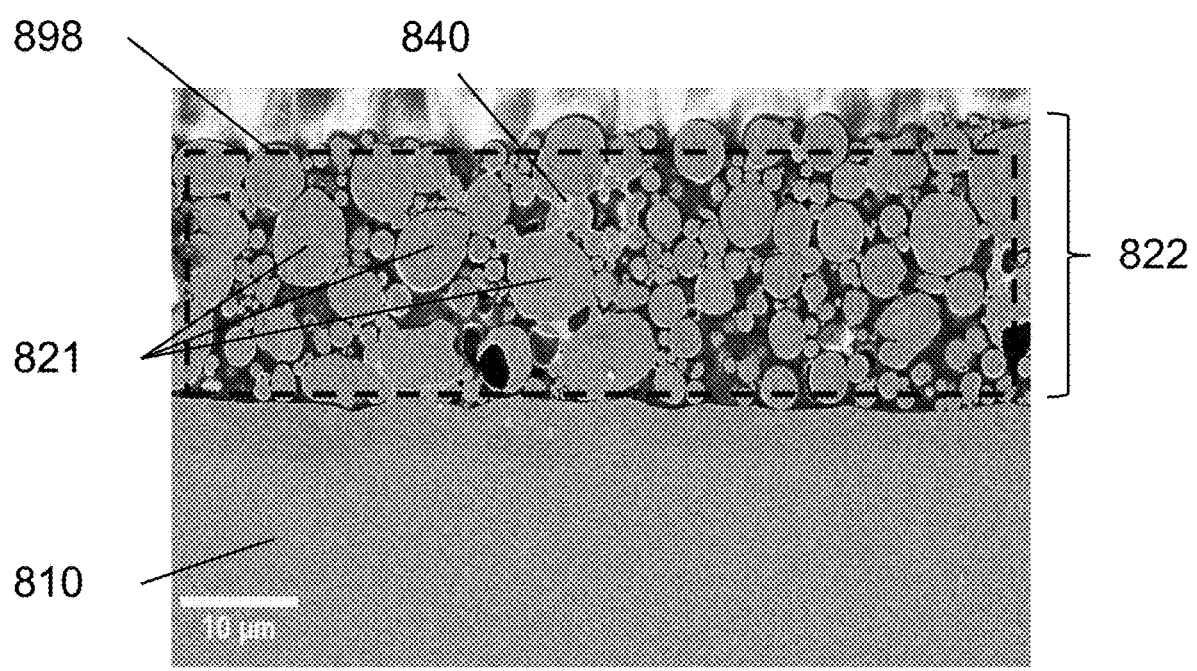
FIG. 8 is a scanning electron microscope (SEM) cross-section image (in SE2 mode) of an aluminum particle layer on a silicon substrate.
Figure 9:
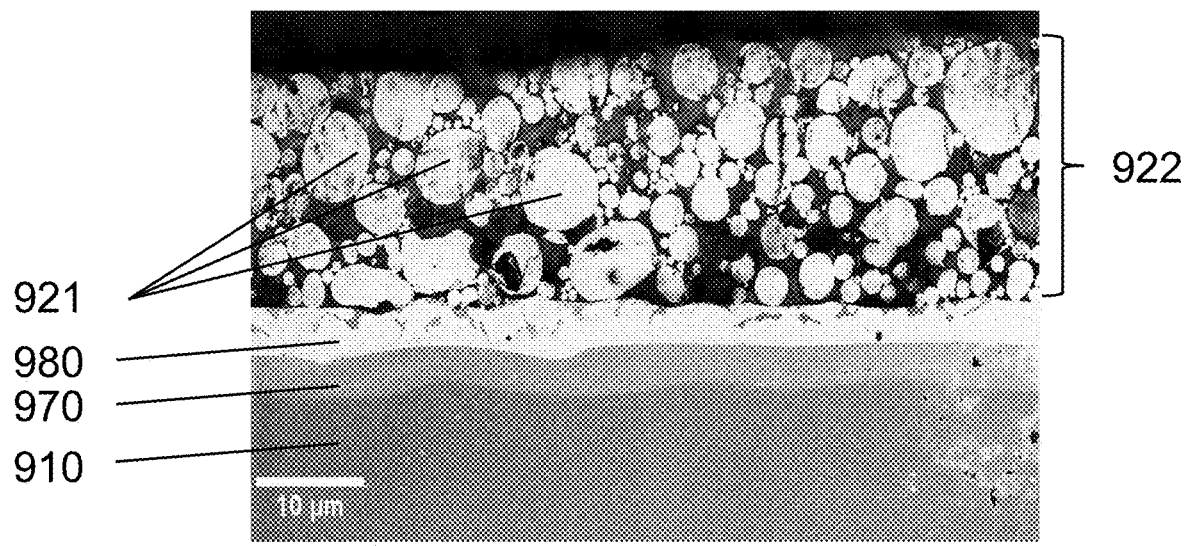
FIG. 9 is a scanning electron microscope (SEM) cross-section image (in InLens mode) of an aluminum particle layer on a silicon substrate shown in FIG. 8.

The influence of the intercalation layer on the metal particle layer is best demonstrated by first illustrating the morphology of a fired aluminum particle layer on a silicon substrate in the absence of an intercalation layer. FIG. 8 is a scanning electron microscope (SEM) cross-section image in SE2 mode of such a fired aluminum particle layer 822 on a silicon substrate 810 taken from a region of a silicon solar cell that does not contain an intercalation layer. The fired aluminum particle layer 822 is about 20 μm thick and contains aluminum particles 821 and a small amount of inorganic binder (i.e., glass frit) 840. An InLens mode scanning electron micrograph of the same aluminum particle layer is shown FIG. 9. In InLens mode, the aluminum particle layer 922, aluminum particles 921 and the silicon substrate 910 are clearly visible, in addition to a back-surface field region 970 and a solidified aluminum-silicon (Al—Si) eutectic layer 980.

Figure 10:
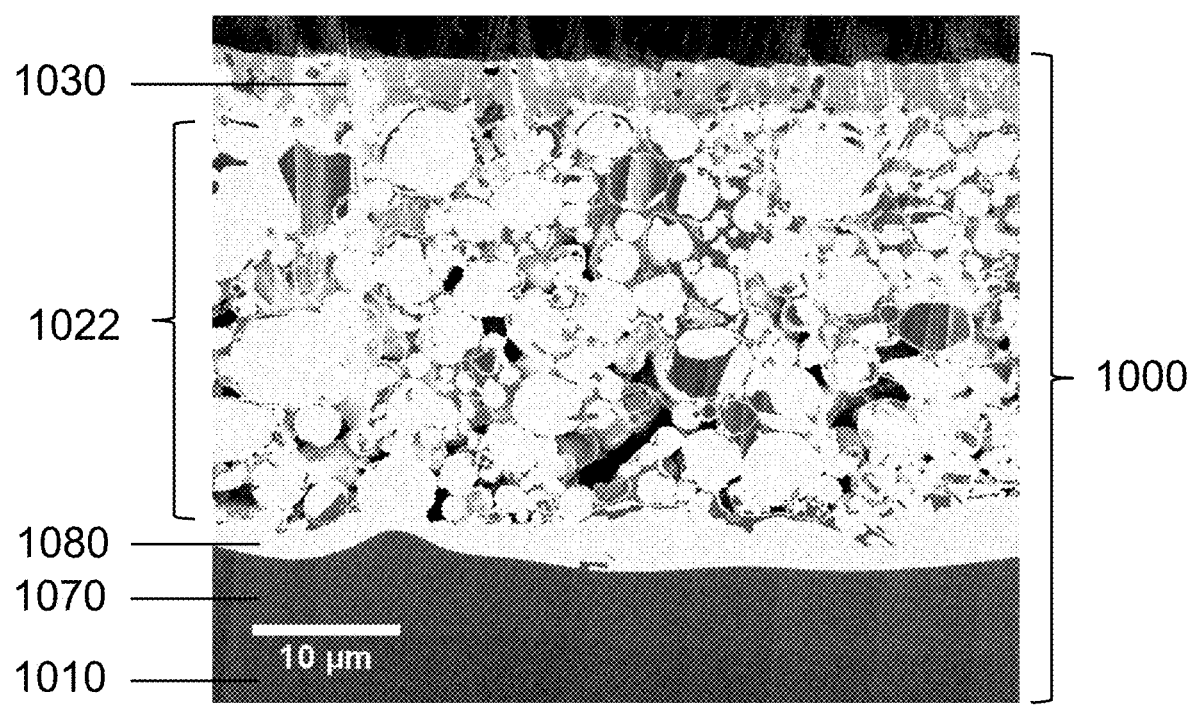
FIG. 10 is a scanning electron microscope (SEM) cross-section image (in InLens mode) of a portion of a silicon solar cell that contains a co-fired multilayer stack.

The impact of an intercalation layer on producing a modified metal particle layer after co-firing can be understood with reference to FIG. 10. FIG. 10 is an InLens SEM cross-section image of the same silicon solar cell used in the image shown in FIG. 8, but taken from a region that contains a co-fired multilayer stack made using intercalation paste C (shown in Table I). The co-fired multilayer stack 1000 contains a modified intercalation layer 1030, a modified aluminum particle layer 1022, a solidified Al—Si eutectic layer 1080, an aluminum-doped back-surface field (BSF) region 1070, and a silicon substrate 1010. In an exemplary embodiment, the BSF in the silicon substrate is doped p-type to between $10^{17}$ and $10^{20}$ atoms per $cm^3$.

Figure 11:
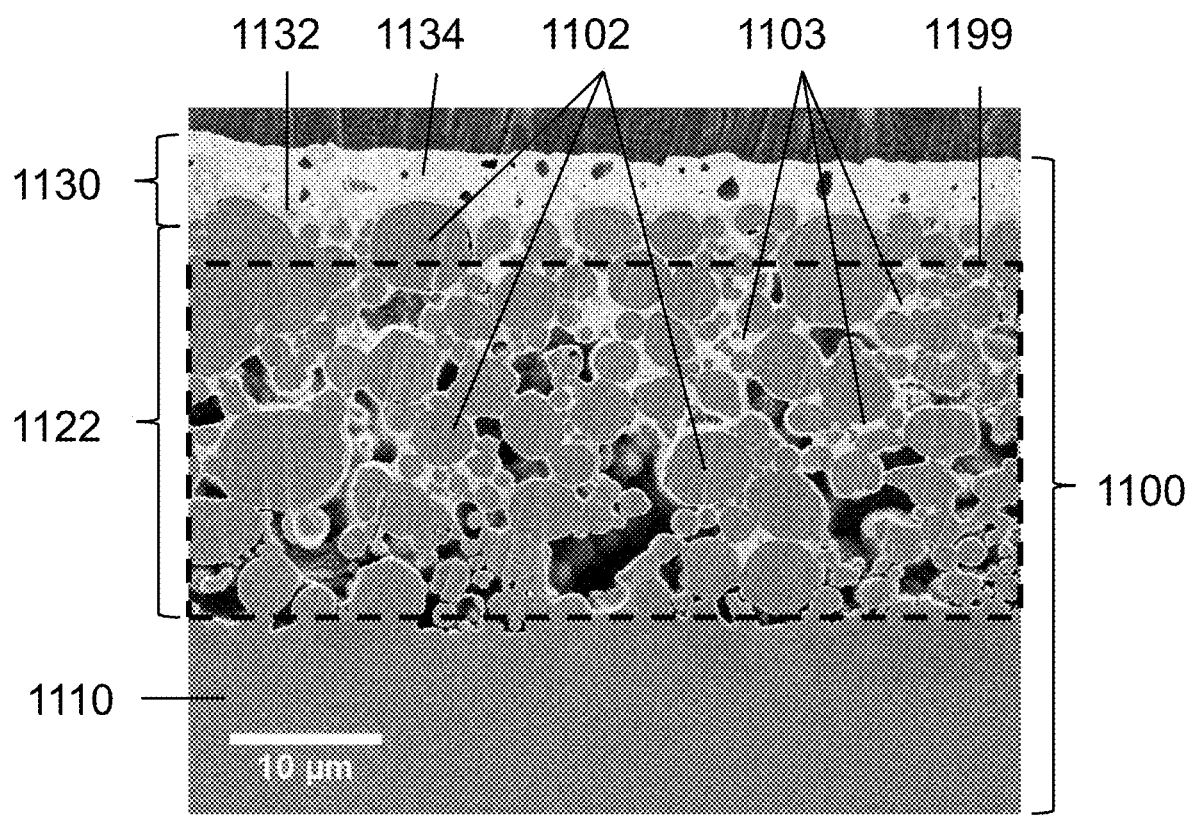
FIG. 11 is a scanning electron microscope (SEM) cross-section image (in SE2 mode) of the portion of a silicon solar cell that contains a co-fired multilayer stack shown in FIG. 10.

An SE2 mode scanning electron micrograph of the co-fired multilayer stack of FIG. 10 is shown FIG. 11. While the InLens mode clearly shows the BSF region, SE2 mode is the preferred mode to image bismuth (intercalation phase) in the modified aluminum particle layer. The co-fired multilayer stack 1100 contains a modified intercalation layer 1130, a modified aluminum particle layer 1122 and a silicon substrate 1110. A silver sublayer 1134 and a bismuth intercalation sublayer 1132 in the modified intercalation layer 1130 can also be seen. The BSF region and the solidified Al—Si eutectic layer cannot be seen clearly in this image. The modified aluminum particle layer 1122 contains a large quantity of bismuth intercalation material 1103, which intercalated around aluminum particles 1102 during co-firing. In some instances, the contrast between the bismuth and silver may not be strong enough to clearly identify the sublayers and degree of bismuth intercalation into the aluminum particle layer. In such instances, elemental maps of the cross-sections can be made using SEM/EDX in order to fully determine silver and bismuth placement in the co-fired multilayer stack.

The amount of intercalating metal (i.e., bismuth) in a modified aluminum particle layer due to intercalation can be determined by comparing EDX spectra taken from a modified aluminum particle layer region and an aluminum particle layer region in the same cross-section sample. It is most useful if the regions are more than 1 μm apart from one another. A way of making this comparison has been described above as an IM:M or Bi:(Bi+Al) ratio. Such analysis can be useful in determining whether an intercalation paste was used in the fabrication of a solar cell. Metallization layers in solar cells typically consist of a narrow subset of metals, which include aluminum, silver, bismuth, lead, and zinc. In commercial solar cells the aluminum particle layer contains aluminum almost exclusively.

Figure 12:
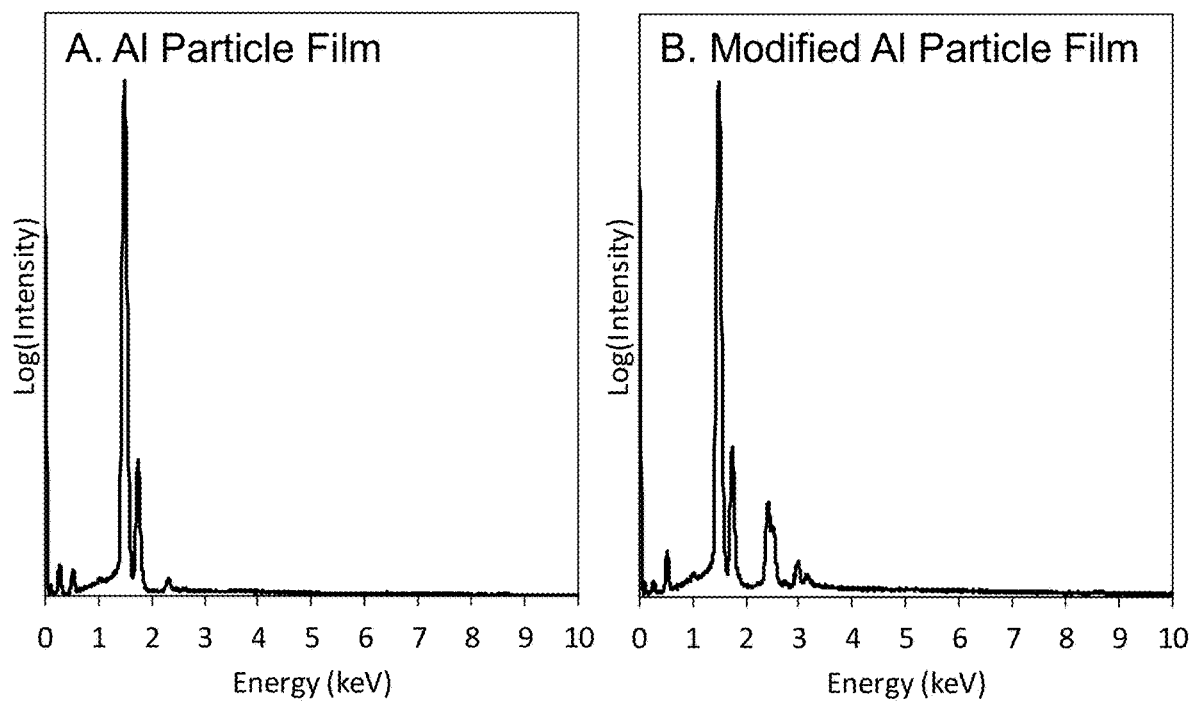
FIG. 12 shows energy dispersive x-ray (EDX) spectra from an aluminum particle layer and from a modified aluminum particle layer, according to an embodiment of the invention.

In one example, intercalating particles in intercalation paste C contain bismuth exclusively, and metal particles in the metal particle layer are mostly aluminum. Comparing the ratio of bismuth to bismuth plus aluminum (Bi:(Bi+Al)) in the aluminum particle layer (i.e., which had no interaction with the intercalation paste) and the modified aluminum particle layer is a useful metric in determining whether an intercalation paste was incorporated into a solar cell. The EDX spectra for these two layers was measured for approximately three minutes using the equipment described above at an accelerating voltage of 20 kV, and a working distance of 7 mm. The EDX spectrum for the fired aluminum particle layer 822 in FIG. 8 was collected from region 898. The EDX spectrum for the modified aluminum particle layer 1122 in FIG. 11 was collected from region 1199. Elemental quantification was performed on these spectra using Bruker Quantax Esprit 2.0 software for automatic elemental identification, background subtraction, and peak fitting. The EDX spectra are shown in FIG. 12. Aluminum and bismuth metal peak areas were quantified and wt % calculated from the EDX spectra in FIG. 12 for the two layers and are summarized below in Table II. No significant quantities of any other metals could be identified in the EDX spectra. The aluminum particle layer EDX spectra shown in FIG. 12A yields a Bi:(Bi+Al) wt % ratio of 1:244, and the modified aluminum particle layer spectrum shown in FIG. 12B yields a Bi:(Bi+

Al) wt % ratio of approximately 1:4 as shown in Table II. The Bi:(Bi+Al) wt % ratio in the modified aluminum particle layer 1122 is around 62 times higher than in the fired aluminum particle layer 822 not in contact with the Ag:Bi intercalation layer. In various embodiments, the ratio Bi:(Bi+Al) in a fired multilayer stack made is at least 20%, or at least 50%, or at least 2×, or at least 5×, or at least 10× or at least 50× higher in the modified aluminum particle layer than in the fired aluminum particle layer.

TABLE II

Aluminum Bismuth EDX Quantification and resulting Bi:(Bi + Al) Wt % Ratios

|  | Al | Bi | Bi:(Bi + Al) ratio |
|---|---|---|---|
| Aluminum Particle Layer | 40.290 | 0.166 | 1:244 |
| Modified Aluminum Particle Layer | 43.641 | 14.974 | 1:3.91 |

Figure 13:
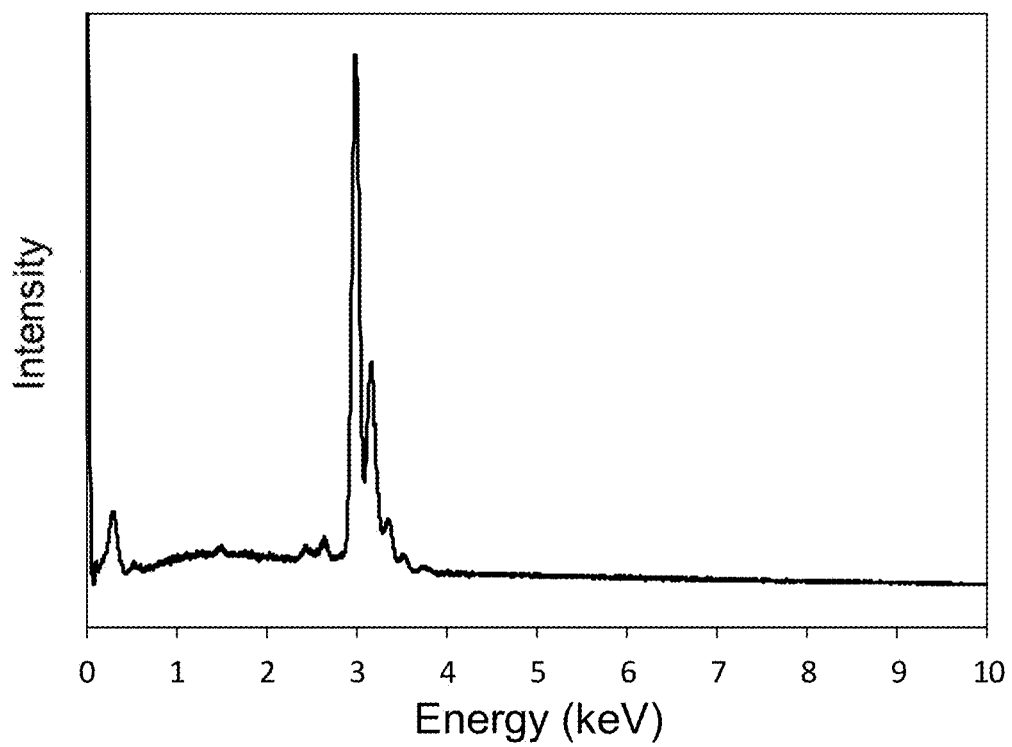
FIG. 13 is an EDX spectrum of the surface of a rear tabbing layer that contains a silver-bismuth intercalation layer, according to an embodiment of the invention.

Plan view EDX can be used to determine the concentration of elements on the surface of a rear tabbing layer in a silicon solar cell. In plan view, EDX probes regions the surface to depths of about 4 μm or less, making this a useful technique for identifying the degree of interdiffusion in a co-fired multilayer stack: a higher precious metal concentration means there has been less interdiffusion, and a lower precious metal concentration means there has been more interdiffusion. FIG. 13 is a plan view EDX spectrum taken from a surface of a rear tabbing layer that contains a Ag:Bi intercalation layer, according to an embodiment of the invention. The EDX spectrum was collected using a SEM operated at an accelerating voltage of 10 kV, 7 mm working distance, and 500 times magnification. The dominant peaks between 3.5 and 4 keV and the smaller peak at 0.3 keV are all identified as silver. The remaining minor peaks in the spectrum are identified as the following: carbon at 0.3 keV (convoluted with a minor silver peak); oxygen at 0.52 keV; aluminum at 1.48 keV; and bismuth at 2.4 keV. Element quantification was performed automatically using Bruker Quantax Esprit 2.0 software to subtract the background, identify the elemental peak, and then fit the peak intensities of the x-ray energies. The normalized weight percentages of each element are shown in Table III below. The total silver coverage on the surface of the rear tabbing layer is 96.3 weight percent (wt %).

TABLE III

Normalized Elemental Weight Percent of the Rear Tabbing Layer Surface

| Element | Normalized Wt % |
|---|---|
| Carbon | 0.784 |
| Silver | 96.342 |
| Silicon | 0.002 |
| Aluminum | 0.153 |
| Bismuth | 1.912 |
| Oxygen | 0.807 |

Figure 14:
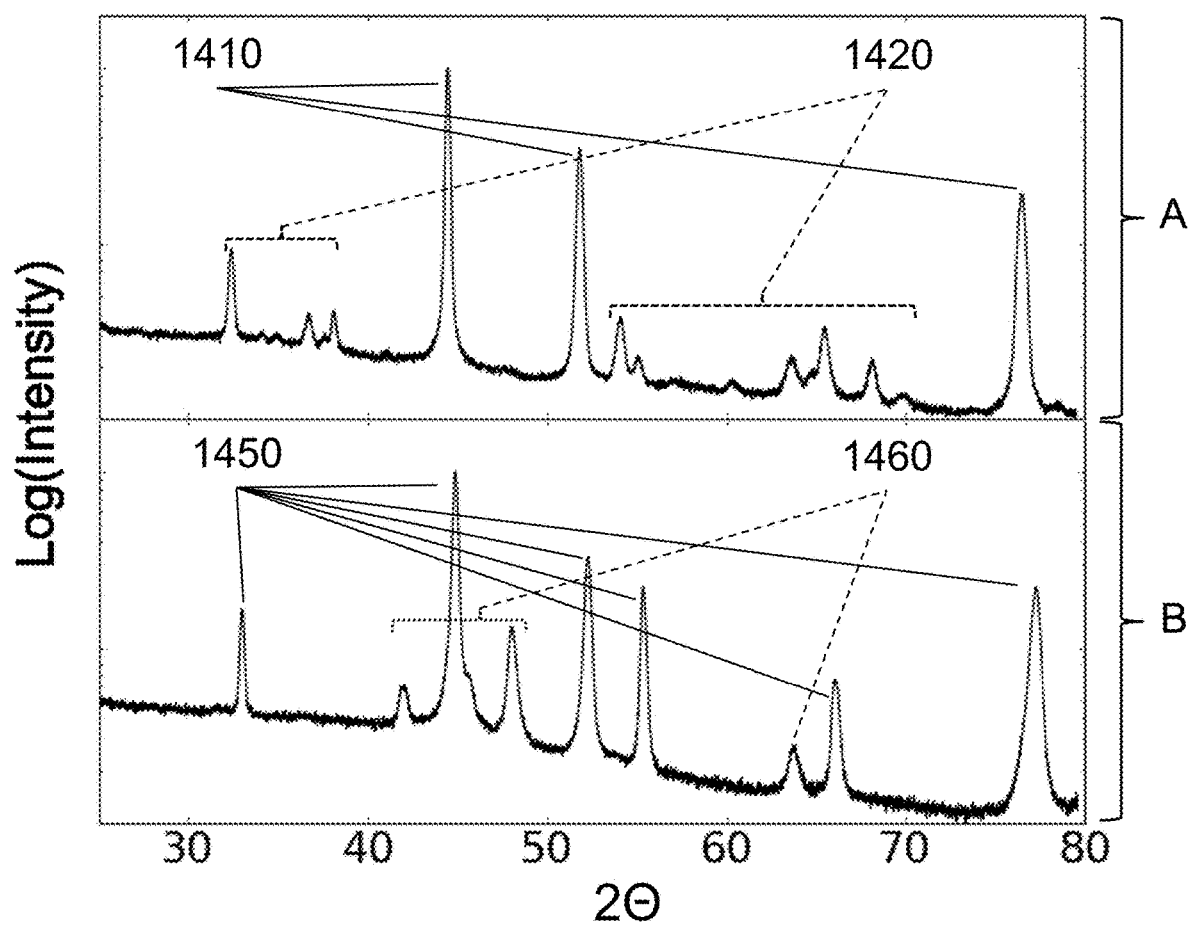
FIG. 14 shows x-ray diffraction patterns from co-fired multilayer film stacks on the rear tabbing layer of a silicon solar cell.

Intercalation layers that contain silver and bismuth can form several unique crystal phases when fired on dried aluminum-based metal particle layers. XRD can be used to distinguish between a fired multilayer stack that uses bismuth particles in the intercalation layer and a fired multilayer stack that uses a conventional silver-based tabbing paste with less than 10 wt % glass frit as the inorganic binder. XRD was performed using a Bruker ZXS D8 Discover GADDS x-ray diffractometer equipped with a VÅNTEC-500 area detector and a cobalt x-ray source operated at 35 kV and 40 mA. XRD patterns of fired multilayer stacks on the rear tabbing layer of a silicon solar cell are shown in FIG. 14. Diffractograms were measured using cobalt Kα wavelength in two 25° frames that were combined for a total window of 25-80° in 2Θ. Each frame was measured for 30 minutes under x-ray irradiation. No background subtraction was performed on the two diffraction patterns in FIG. 14. Patterns were normalized to unity against the largest peak, and a 0.01 background was added to the data to plot in Log(Intensity).

The XRD diffraction patterns show that a fired multilayer stack formed with an Ag:Bi intercalation layer, or rear tabbing layer in a solar cell, has a different pattern compared to one formed without bismuth. XRD pattern A is from a co-fired multilayer stack on the rear tabbing layer of a silicon solar cell. The co-fired multilayer stack included a modified intercalation layer formed using an intercalation paste that contained approximately 45 wt % silver, 30 wt % Bi, and 25 wt % organic vehicle (as for Paste C in Table I above). Peaks 1410 are identified as silver and peaks 1420 are crystallites of bismuth oxide ($Bi_2O_3$). XRD pattern B is from a co-fired multilayer stack on the rear tabbing layer of a silicon solar cell formed using a commercially available rear tabbing paste that contained less than 10 wt % glass frit as the intercalation layer on an aluminum particle layer. The co-fired multilayer stack is dark in color, indicating significant silver-aluminum interdiffusion. Peaks 1450 are identified as a silicon-aluminum eutectic phase. Peaks 1460 are identified as a silver-aluminum alloy phase (i.e., $Ag_2Al$). Silver peaks 1410 are observed in pattern A along with a bismuth oxide compound and not in pattern B where silver is observed only as part of a silver-aluminum alloy 1450. This is further evidence that bismuth prevents interdiffusion in fired multilayer stacks. In one embodiment, a rear tabbing layer in a silicon solar cell contains crystallites of bismuth and at least one other element such as silicon, silver, and oxides thereof, alloys thereof, composites thereof, or other combinations thereof. In another embodiment, a rear tabbing layer contains bismuth oxide crystallites. In another embodiment, an intercalation region undergoes multiple phase transformations during firing.

An Intercalation Layer can Etch Through a Dielectric Layer During Firing

In some device applications, a dielectric layer is deposited onto a substrate surface before metal layers are deposited in order to passivate the substrate surface and to improve electronic properties. The dielectric layer may also prevent species interdiffusion between the substrate and adjacent metal particle layer(s). In some cases, it may be highly desirable to etch through the dielectric layer in order to form compounds between the substrate and the metal particle layer to improve electrical conduction between the substrate and the metal particle layer. Glass frits that contain bismuth and lead are known to penetrate through a variety of dielectric layers (e.g., silicon nitride) during co-firing of silicon solar cells. In an exemplary embodiment, intercalation paste D (from Table I above) contains approximately 30 wt % silver, 20 wt % intercalating particles (15 wt % metallic bismuth particles, 5 wt % high-lead-content glass frit) and 50 wt % organic vehicle. Such an intercalation paste can be especially useful if etching through a dielectric layer is desired.

Figure 15:
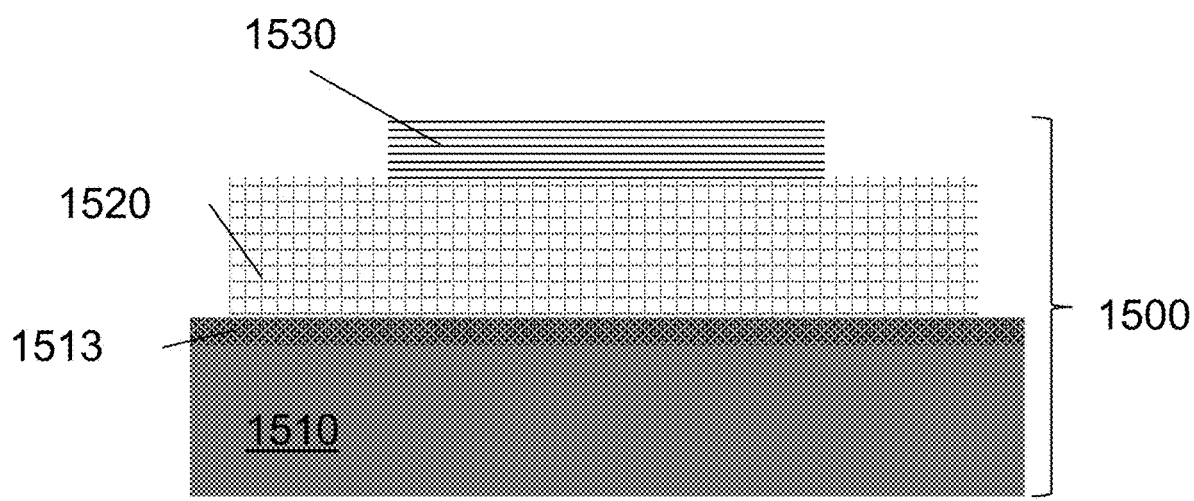
FIG. 15 is a schematic cross-section drawing of multi-layer film stack that includes a dielectric layer prior to firing, according to an embodiment of the invention.

FIG. 15 shows a schematic cross-section drawing of a multilayer stack 1500 that includes a substrate 1510 coated with at least one dielectric layer 1513 prior to firing, according to an embodiment of the invention. A dried metal particle layer 1520, is on a portion of the dielectric layer

1513. An intercalation layer 1530, made up of intercalating particles and precious metal particles, as described above, is on a portion of the dried metal particle layer 1520. Prior to firing, the precious metal particles and intercalating particles may be homogeneously distributed within the intercalation layer 1530. The dielectric layer contains at least one of silicon, aluminum, germanium, hafnium, gallium, oxides thereof, nitrides thereof, composites thereof, and combinations thereof. In one arrangement, the dielectric layer 1513 is a 75-nm thick silicon nitride layer. In another embodiment, there is a second dielectric layer (not shown) between the dielectric layer 1513 and the substrate 1510. In one arrangement, the second dielectric layer is a 10-nm thick alumina layer directly on the substrate 1510 and the dielectric layer 1513 is a 75-nm thick silicon nitride layer directly on the alumina layer. Dried metal particle layer 1520 is formed by depositing metal particle paste on the dielectric layer 1513 and subsequently drying. In one arrangement, the dried metal particle layer 1520 is 20 μm thick and contains aluminum particles. An intercalation layer 1530 that contains intercalating particles, such as glass frit(s) that contain lead or bismuth, is deposited on the dried metal particle layer 1520, covering at least a portion of the dried metal particle layer 1520, and then dried.

Figure 16:
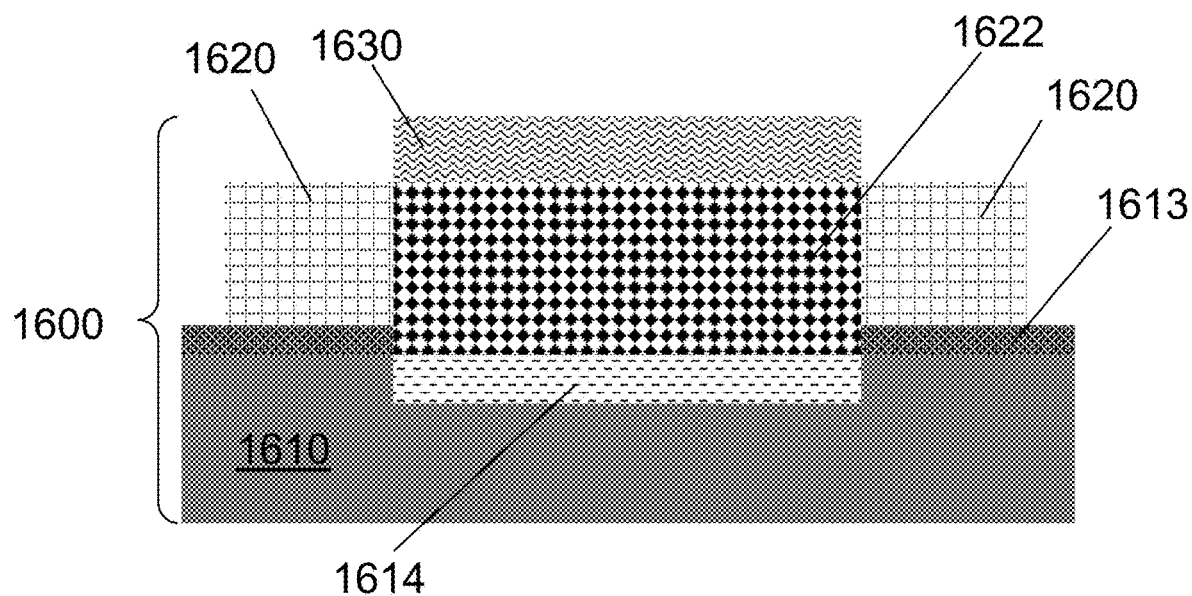
FIG. 16 is a schematic cross-section drawing of a fired multilayer film stack that includes a dielectric layer, according to an embodiment of the invention.

FIG. 16 is a schematic cross-section drawing that shows a fired multilayer stack 1600 (the structure 1500 of FIG. 15 after it has been fired), according to an embodiment of the invention. A portion of substrate 1610 is coated with at least one dielectric layer 1614. During co-firing at least some of the intercalating particles (that include glass frit(s) as described in reference to FIG. 15) in a modified intercalation layer 1630 melt and begin to flow, intercalating into a modified metal particle layer 1622. In one arrangement, material from glass frit particles in the modified intercalation layer 1630 penetrates into and through the metal particles in the modified metal particle layer 1622 and etches into the dielectric layer 1613 (1513 before firing), allowing some metal from the modified metal particle layer 1622 to interact chemically and electrically with the substrate 1610, forming one or more new compounds 1614. Other intercalating particles (e.g., bismuth particles) from the modified intercalation layer 1630 may also intercalate into the modified metal particle layer 1622 and may provide structural support. In one arrangement, as described in more detail above in reference to FIG. 2, at least a portion of the precious metal particles and intercalating particles in the modified intercalation layer 1630 form phases that phase separate from each other. In some arrangements, there are also metal particle regions 1620 (on the dielectric layer 1613) into which little or only trace amounts of intercalating particle material has penetrated. In an exemplary embodiment, the intercalating particles are bismuth particles and glass frit particles, the metal particles are aluminum.

Introducing Variations in the Thickness of a Metal Particle Layer to Reduce Buckling An intercalation layer can cause stress in an underlying modified metal particle layer during firing, which can cause buckling or wrinkling and therefore poor layer strength and electrical communication between layers. For example, an intercalation layer may have a different coefficient of thermal expansion than an adjacent modified metal particle layer, causing the layers to expand or contract differently during firing. Another source of stress in an adjacent modified metal particle layer may be the intercalation of melted intercalating particle material between the metal particles. Such stresses can cause a modified metal particle layer and/or a modified intercalation layer to buckle or wrinkle.

Buckling or wrinkling can be described as large, periodic or non-periodic deviations in the thickness of a layer. Often this results in delamination between layers. For example, before an intercalation layer on a dried metal particle layer is fired, the initial thickness of the stack that contains the intercalation layer and the dried metal particle layer is approximately the same everywhere. After co-firing, the thickness of the fired multilayer stack that contains the modified intercalation layer and the modified metal particle layer may be by as much as three times greater than the initial thickness in some regions.

Figure 17:
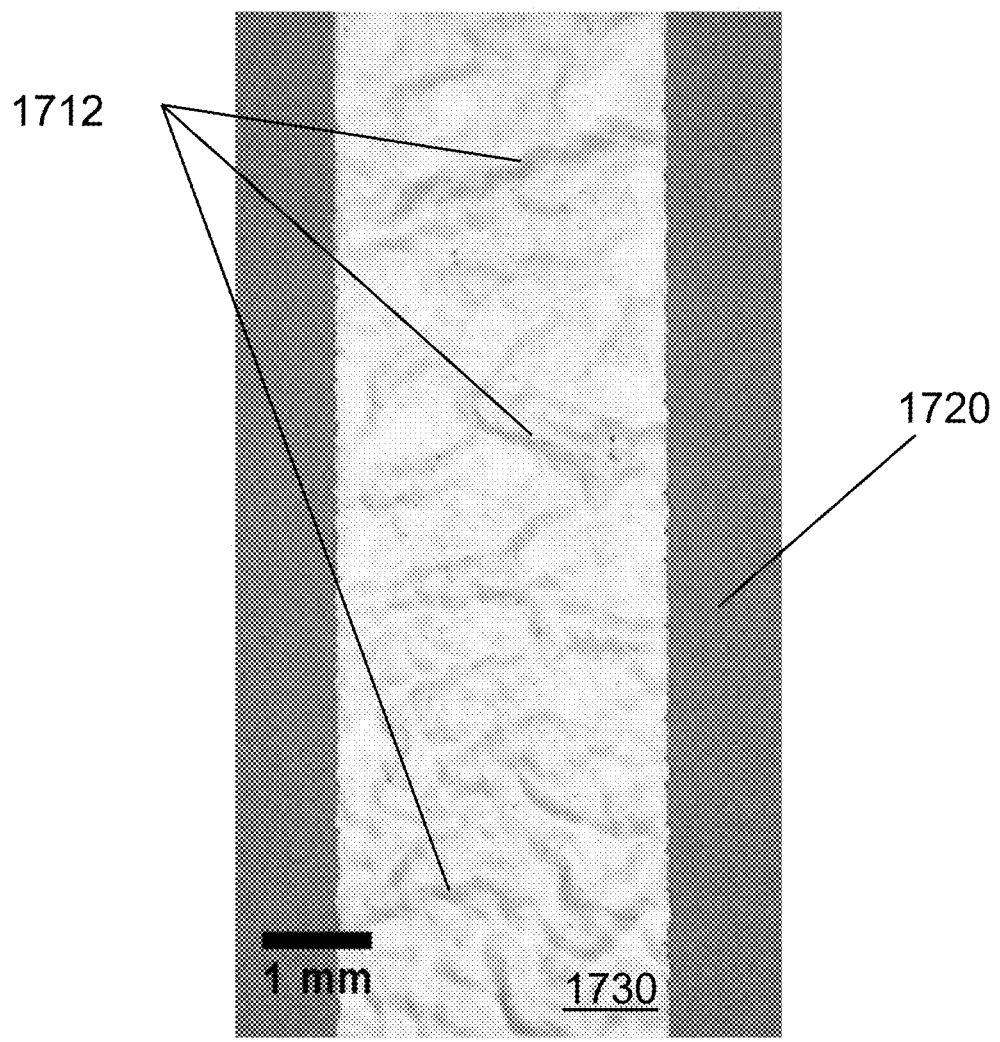
FIG. 17 is a plan-view optical micrograph of co-fired multilayer film stack in which buckling has occurred.

FIG. 17 is a plan-view optical micrograph of co-fired multilayer stack in which buckling has occurred. A modified intercalation layer 1730 is visible. The modified intercalation layer 1730 has buckled; some peak regions 1712 are indicated in FIG. 17. An adjacent metal particle layer 1720 has not buckled and remains smooth or approximately planar. Even though the intercalation layer 1730 has buckled, the mechanical integrity of the co-fired multilayer stack remains strong with peel strengths of more than 1 N/mm. However, the buckling can make it challenging to make good, robust contact between the modified intercalation layer 1730 and tabbing ribbons (not shown) when they are soldered together. The buckled surface of the modified intercalation layer 1730 may result in incomplete solder wetting over the extent of intercalation layer 1730, which can lower peel strength and solder joint reliability. It may be useful to reduce or eliminate buckling in the co-fired multilayer stack to ensure successful soldering to tabbing ribbons.

Variable thicknesses can be incorporated into fired multilayer stacks to significantly reduce buckling and/or wrinkling of layers. When one or more layers has variable thicknesses, a non-planar interface between such layers can result. An indication of variable thickness is a non-planar interface between layers in a fired multilayer film stack. Variable thickness can be created by patterning a portion of a first layer and subsequently printing a second layer directly on the patterned portion of the first layer to create a non-planar interface between the two layers. In one arrangement, a layer has variable thickness as the result of having been printed using a patterned screen. After firing, the thicknesses of individual layers may be reduced, but firing does not cause layers with variable thickness to become layers with uniform thickness. Variable thickness in a layer can be measured and quantified using cross-sectional SEM and surface topology techniques both before and after firing. In various embodiments, a layer can be described as having variable thickness when it has thickness variations that are at least 20% greater than or at least 20% less than the average thickness of the layer as measured within a 1×1 mm area.

Figure 18:
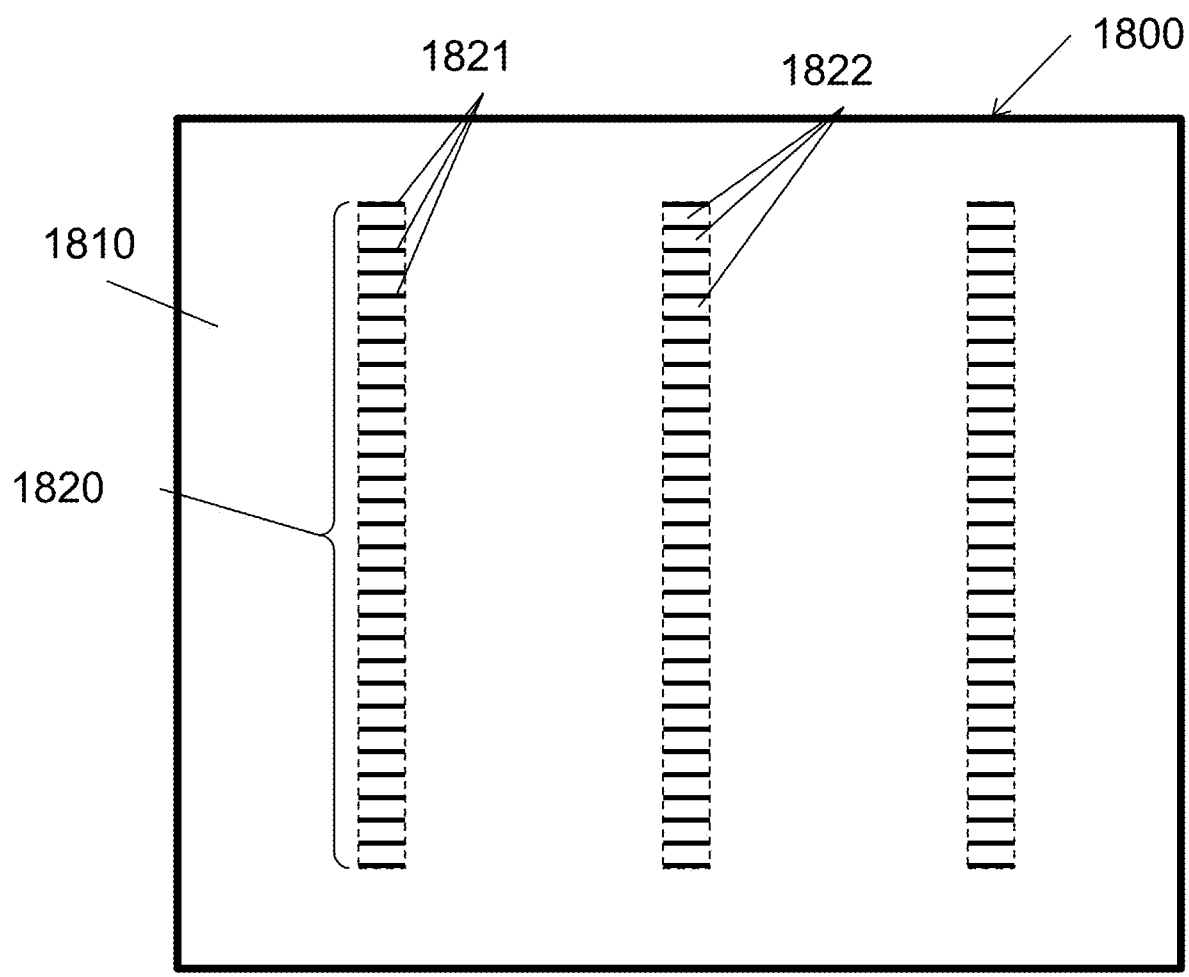
FIG. 18 is a screen design (not drawn to scale) that can be used during deposition of a wet metal particle layer, according to an embodiment of the invention.

FIG. 18 is a screen that can be used during deposition of metal particle paste to achieve variable thickness in a dried metal particle layer according to an embodiment of the invention. The screen 1800 has an open mesh 1810, and some patterned regions 1820. The patterned regions 1820 contain closed areas 1821 and open areas 1822. When the screen 1800 is used during printing of a wet metal particle layer, paste flows through the openings 1822 and the open mesh 1810 and is blocked by the closed areas 1821, which causes the deposited wet metal particle layer to have variable thickness. In one embodiment, the wet metal particle layer is subsequently dried to form a variable-thickness dried metal particle layer, and an intercalation paste is deposited directly on the variable-thickness dried metal particle layer.

There are several factors that can affect variable thickness in a dried metal particle layer, such as mesh count, wire diameter and shape, wire angle relative to the frame, emulsion thickness and screen design. The mesh size and wire diameter determine the minimum pattern shapes and openings that can be printed. Thickness variations in a dried metal particle layer are also affected by the rheology of the metal particle paste, which affects layer slumping. Pastes can be designed with high viscosities and thixotropies to control exactly where they are deposited on a substrate. It is also possible to change the magnitude of the thickness variations in the metal particle layer by adjusting the emulsion thickness of the screen. Screens may be designed to ensure a continuous dried metal particle layer on a substrate surface with variable layer thicknesses overall or only in particular regions. In an exemplary embodiment, a metal particle paste is printed using a 230-mesh screen with an emulsion thickness of 5 µm. In one arrangement, the pattern 1820 has a series of 100 µm by 3 mm open areas 1822 adjacent to 100 µm by 3 mm closed areas 1821. There is no restriction on pattern type, periodicity (or lack thereof), or size. Many patterns can result in variable thickness and the patterns may be adjusted for various printing conditions and paste formulations.

Figure 19:
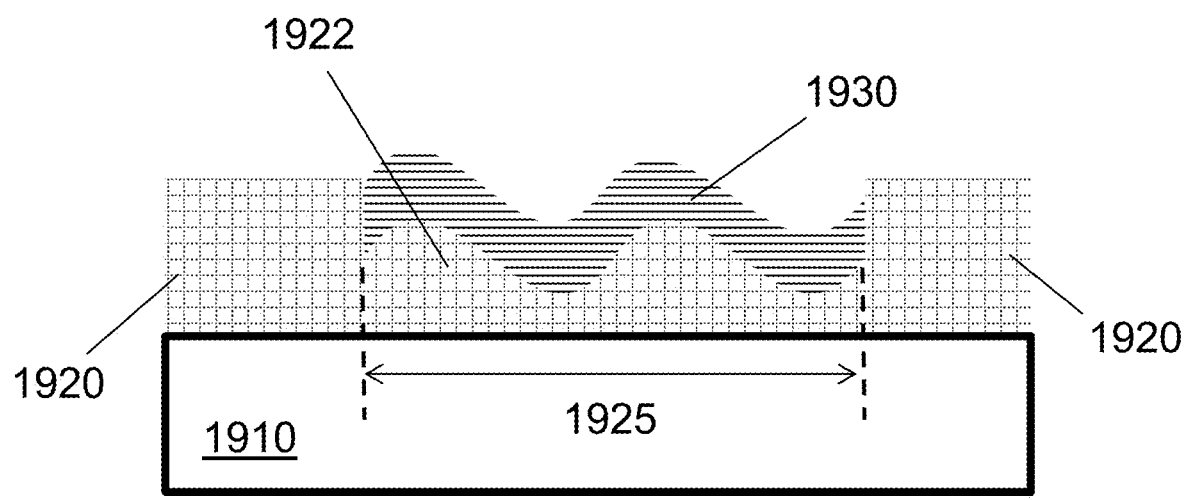
FIG. 19 is a schematic cross-section drawing of a dried metal particle layer with variable thickness deposited using the screen in FIG. 18, according to an embodiment of the invention.

FIG. 19 is a schematic cross-section drawing of a dried metal particle layer with variable thickness deposited onto a substrate 1910 using the screen 1800 of FIG. 18, according to an embodiment of the invention. A dried metal particle layer 1920 outside region 1925 was formed by depositing metal particle paste through open mesh areas 1810 of the screen 1800, and then drying the metal particle paste. A variable-thickness dried metal particle layer 1922 in region 1925 was deposited through a masked region 1820 of the screen 1800 and has variable thickness. An intercalation paste was subsequently printed directly on the variable-thickness dried metal particle layer 1922 in region 1925 and dried to form an intercalation layer 1930.

Figure 20:
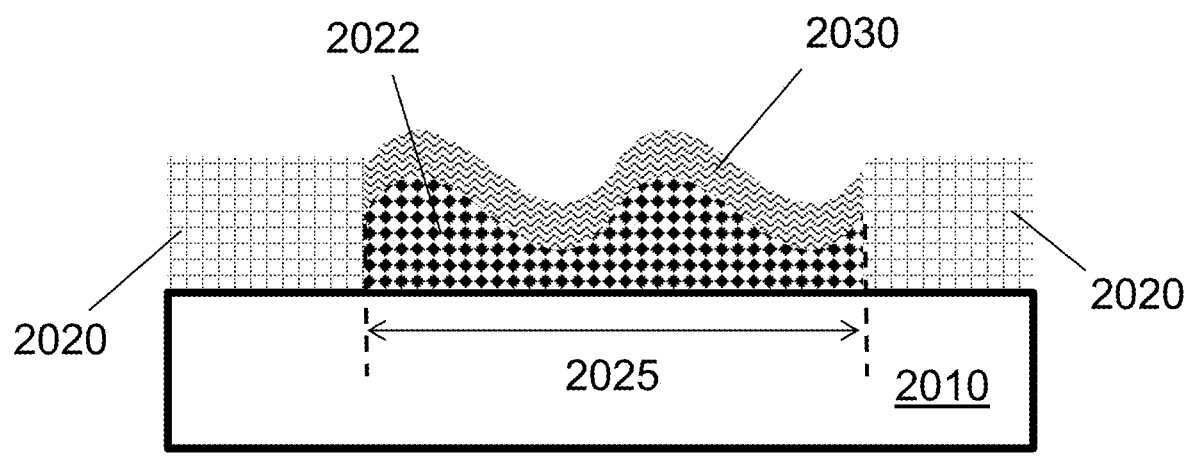
FIG. 20 is a schematic cross-section drawing of a modified metal particle layer with variable thickness deposited using the screen of FIG. 18 and then co-fired, according to an embodiment of the invention.

FIG. 20 is a schematic cross-section drawing of the structure of FIG. 19 after it has been co-fired, according to an embodiment of the invention. As described above, co-firing causes material from the intercalation layer 1930 (FIG. 19) to intercalate into the underlying variable-thickness dried metal particle layer 1922 (FIG. 19), transforming the variable thickness metal particle layer 1922 into a variable-thickness modified metal particle layer 2022 and the intercalation layer 1930 into a modified intercalation layer 2030. In one arrangement, the modified metal particle layer 2022 has patterned thickness variations including, but not limited to, periodic bumps, ridges, edges and other feature shapes. It should be noted that the thickness of the modified intercalation layer 1930 is often uniform, and the non-planar interface between the modified intercalation and the modified metal particle layer (due to its variable thickness) can be inferred by measuring variations in the total layer thickness of the multilayer stack.

Figure 21:
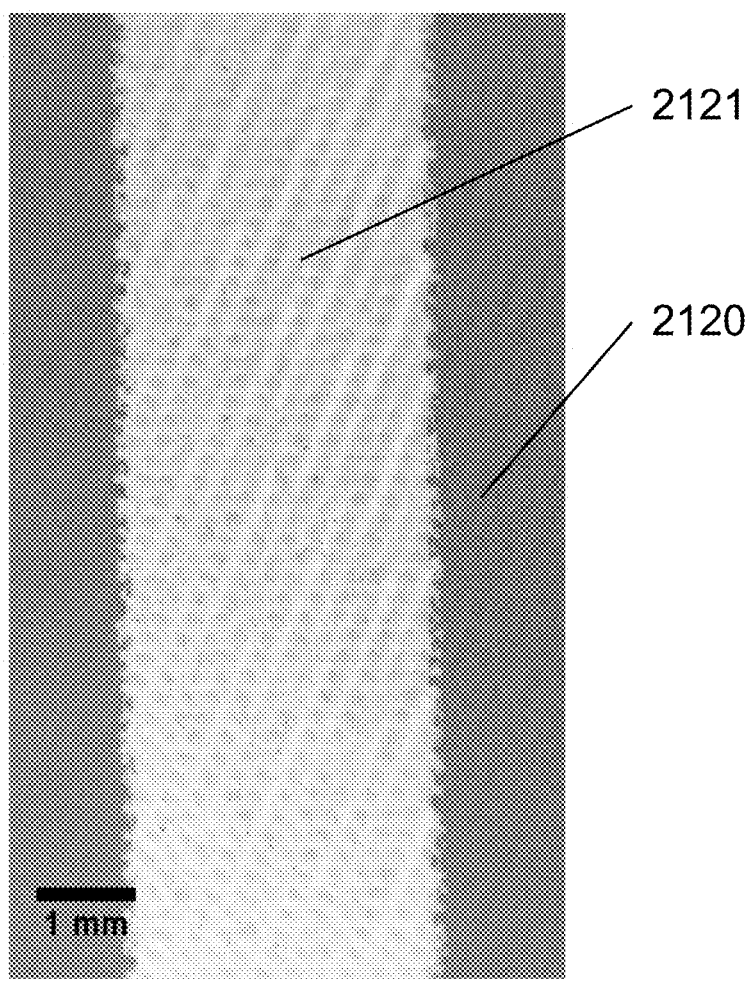
FIG. 21 is a plan-view optical micrograph of a co-fired multilayer stack as shown in FIG. 20.

FIG. 21 is a plan-view optical micrograph of a co-fired multilayer stack in which metal particle paste was printed with variable thickness (in some regions) using a screen such as that shown in FIG. 18. An intercalation layer was printed directly on the variable thickness region of the metal particle layer, and the multilayer stack was co-fired to form a modified intercalation layer 2121 on the top surface, bordered on either side by an approximately planar metal particle layer 2120. The metal particle layer 2120 has a planar top surface. The surface of the modified intercalation layer 2121 is non-planar with a pattern that reflects the variations in thickness in the underlying modified metal particle layer. The surface of the modified intercalation layer 2121 does not show signs of buckling or wrinkling, as were seen clearly in the modified intercalation layer 1730 in FIG. 17. In one embodiment of the invention, a portion of the co-fired multilayer stack has variable thickness.

A useful metric to describe variable thickness is to compare peak thicknesses and valley thicknesses to average layer thickness. In any layer, there can be some unintentional thickness variation, but such variations are typically less than 20% of the average layer thickness. A layer can be considered to be planar (have uniform thickness) if its thickness varies by less than 20% of the average layer thickness. By careful design of screens for printing metal particle pastes, it is possible to create layers with variable thicknesses that have thickness variations that are at least 20% greater than or at least 20% less than the average thickness of the layer as measured within a 1×1 mm area.

Figure 22:
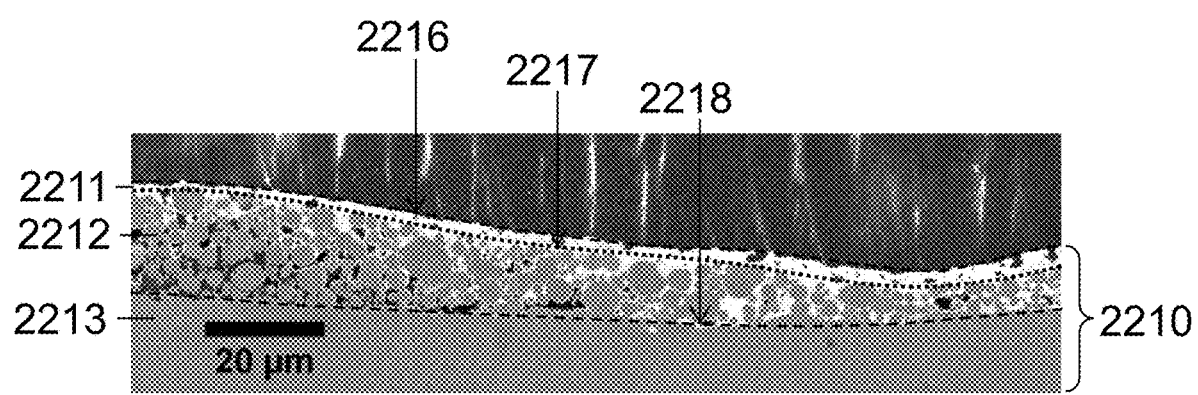
FIG. 22 is a cross-section SEM image of a portion of a fired multilayer stack with variable thickness.
Figure 23:
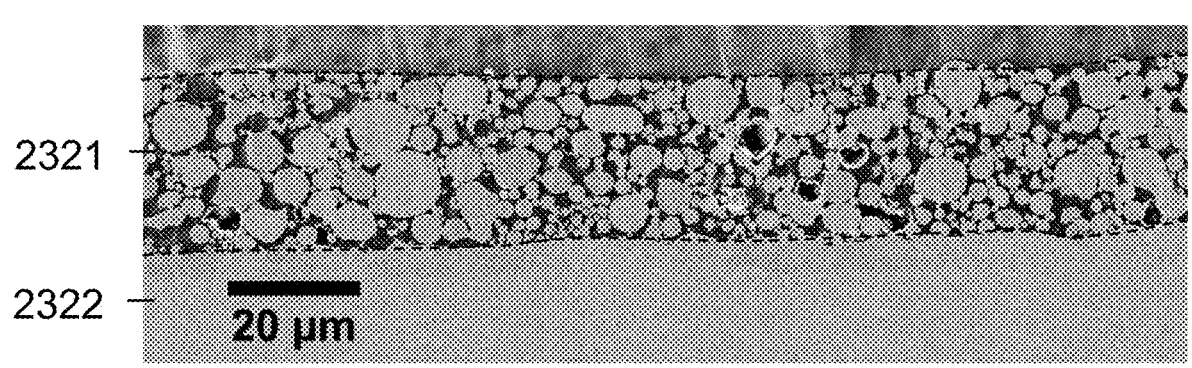
FIG. 23 is a cross-section SEM image of a portion of an aluminum particle film on a silicon substrate with a planar thickness.

Variable thickness in fired multilayer stacks can be measured from SEM images of polished cross-section samples. FIG. 22 is a cross-section SEM image of a portion of a fired multilayer stack 2210 that has variable thickness, according to an embodiment of the invention. Cross-section samples were prepared and imaged using the methods described above. The fired multilayer stack 2210 includes a modified intercalation layer 2211, a modified aluminum particle layer 2212, and a silicon substrate 2213. Two interfaces on either side of the modified aluminum particle layer 2212 are identified in the image: interface 2218 between the silicon substrate 2213 and the modified aluminum particle layer 2212, and interface 2217 between the modified aluminum particle layer 2212 and the modified intercalation layer 2211. Interface 2216 is a solderable surface. For comparison, FIG. 23 shows a silicon substrate 2322 that has a planar aluminum particle film 2321 that does not have variable thickness.

The average thickness of the modified aluminum particle layer 2212 in FIG. 22 is calculated by averaging thicknesses measurements. The thickness between the two interfaces 2217 and 2218 in FIG. 22 was measured at regular intervals (e.g., 10 microns) across the sample. Thicknesses were also measured at local maximums and local minimums. Software such as ImageJ 1.50a can be used to obtain average thickness, and minimum and maximum thicknesses. The peaks and valleys seen in a single cross-section sample may not be representative of an entire fired multilayer stack. Therefore, it is useful to make such measurements over several cross-section samples in order to ensure that very many peaks and valleys are measured. These are methods that would be known to a person with ordinary skill in the art.

For the sample shown in FIG. 22, the modified aluminum particle layer 2212 has an average thickness of 11.3 µm, a peak thickness of 18.4 µm, and a valley thickness of 5.2 µm. The peak thickness is 64% greater than the average thickness and the valley is 54% less than the average thickness. In various embodiments, a layer with variable thickness has a peak thickness that is at least 20%, at least 30%, at least 40%, or at least 50% greater than the average layer thickness. In various embodiments, a layer with variable thickness has a valley thickness that is at least 20%, at least 30%, at least 40%, or at least 50% less than the average layer thickness.

When the modified intercalation layer 2211 is continuous and approximately uniform in thickness, solderable surface 2216 of the modified intercalation layer 2211 is approximately parallel to the interface 2217. In one embodiment of the invention, all measurements described above for the modified aluminum particle layer 2212 can be made for the combined thicknesses of the modified aluminum particle layer 2212 and the modified intercalation layer 2211 between the solderable surface 2216 and the interface 2217. Comparisons of the thickness measurements for the two combined layers are good approximations for comparisons of the thickness measurements for the modified aluminum particle layer 2212 alone. For the combined layers in FIG. 22, the peak thickness is 44% greater than the average overall thickness of 13.2 µm, and the valley thickness is 43% less than the average overall thickness. This alternative method may systematically under-measure the thickness variation in a fired multilayer stack.

For some applications, it may be desirable for only a portion of a fired multilayer stack to have variable thickness. For example, an aluminum particle layer on the back side of a silicon solar cell is typically planar. It may be useful to introduce variable thickness in rear tabbing layer portions (which include modified intercalation layers) on the back side of such a cell. Comparing thickness variation in a portion of the rear tabbing layer with thickness variation in a portion of the surrounding aluminum particle layer could be used to determine if layers with variable thicknesses were used on the back side of a solar cell.

Another useful metric to determine variable thickness in a fired multilayer film stack is average peak-to-valley height, which is the difference between the average of local maximums and the average of local minimums. In cross-section SEM images there is no guarantee that local maximums and local minimums in the image, so surface topographic metrology methods such as profilometery, coherent scanning interferometry, and focus variation microscopy are more useful. An example of a profilometer is a Bruker or Veeco Dektak 150 or equivalent. Coherent scanning interferometry can be performed using an Olympus LEXT OLS4000 3D Laser Measuring Microscope. An accompanying software with these methods can automatically calculate average peak-to-valley difference.

Figure 24:
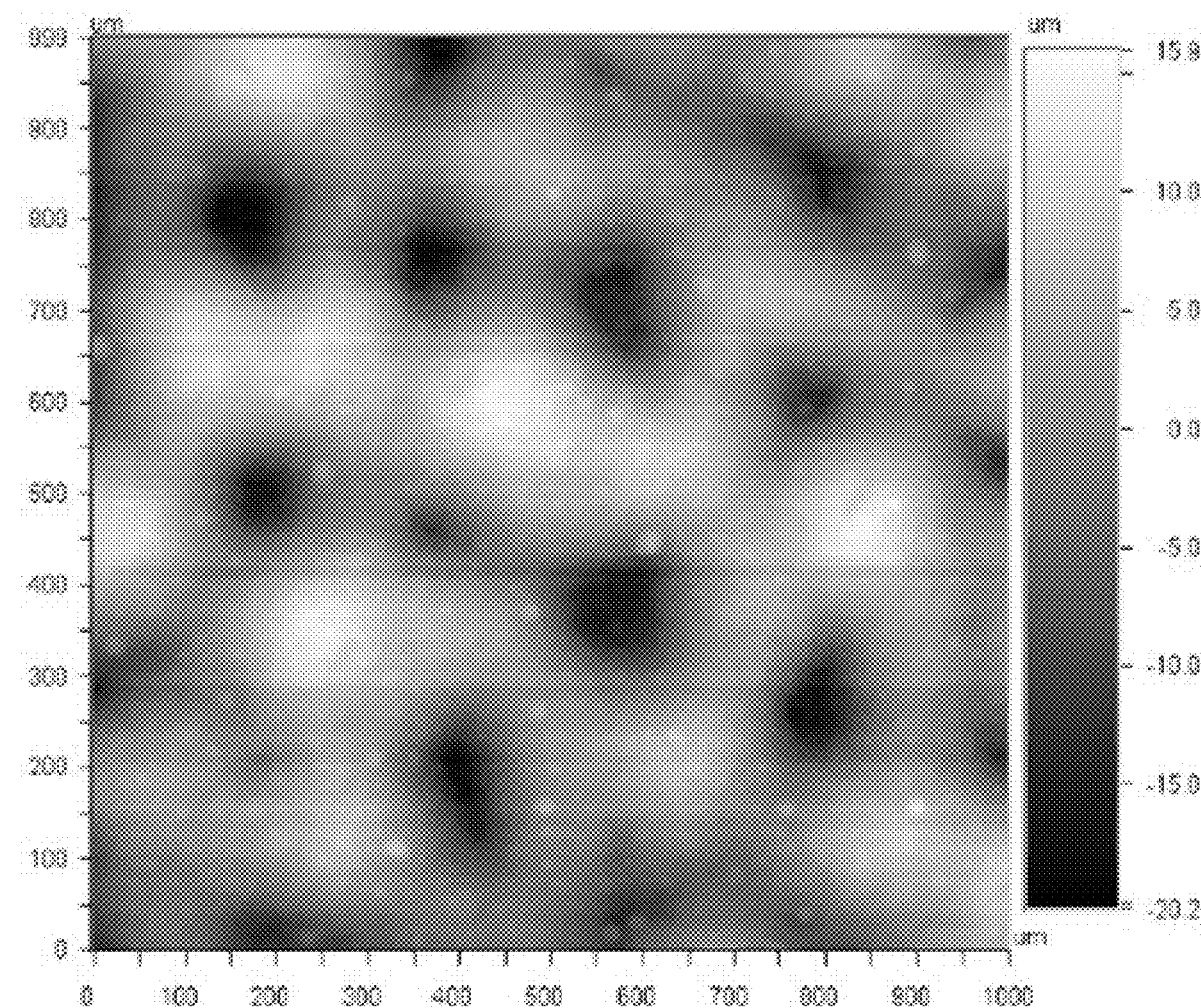
FIG. 24 is a surface topology scan of a fired multilayered stack with variable thickness.
Figure 25:
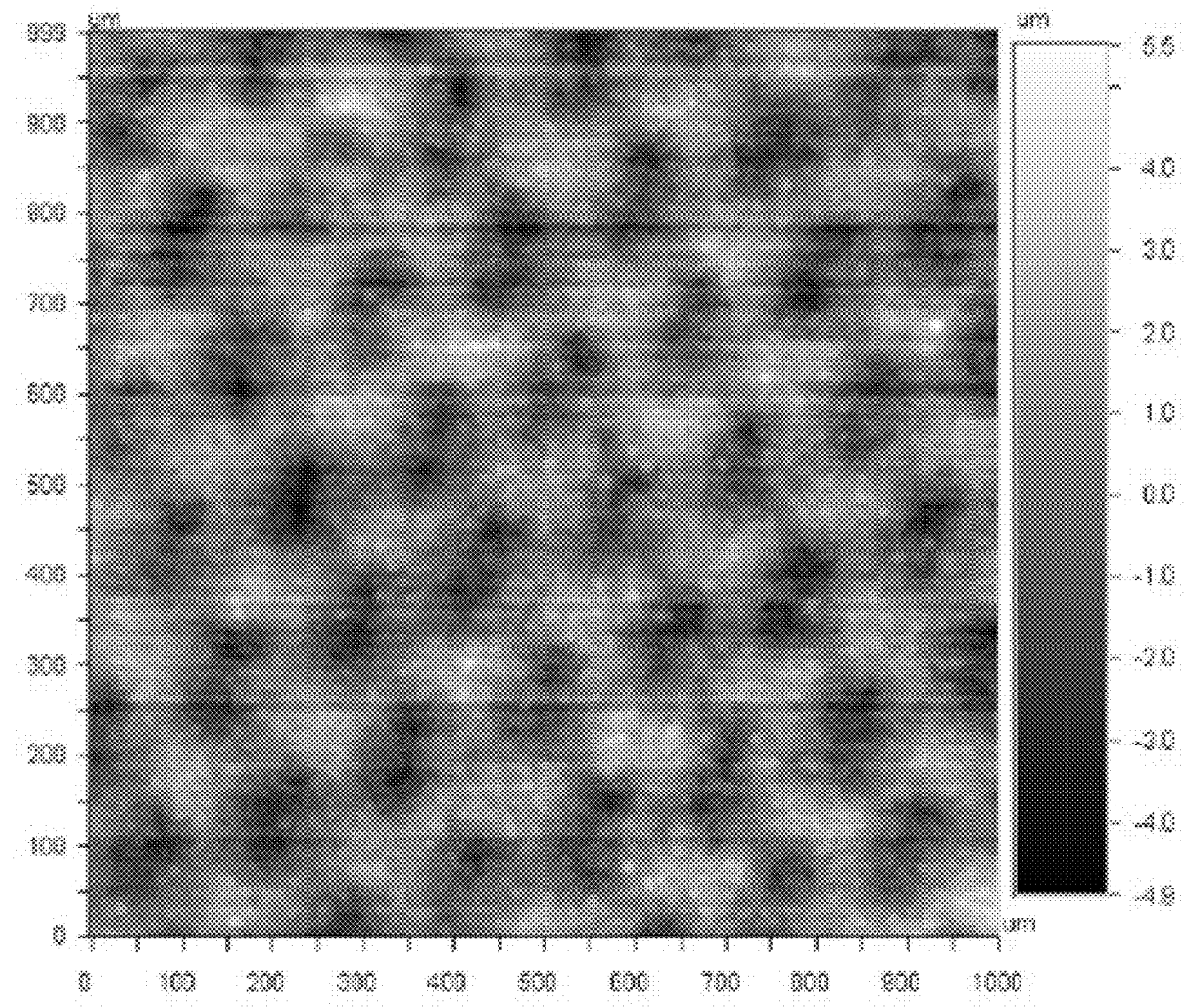
FIG. 25 is a surface topology scan of a fired aluminum particle layer.

In an example embodiment, profilometry is used to determine, within the same sample, the average peak-to-valley heights both for a fired multilayered stack that has variable thickness and for an aluminum particle layer that has uniform thickness. A Veeco Dektak 150 was used to measure the surfaces in a 1×1 mm area with a 12.5 mm radius probe to produce 3D topological surface maps. FIG. 24 is a 3D surface topology map of the fired multilayered stack with variable thickness, and FIG. 25 and is a 3D surface topology map of the (adjacent) aluminum particle layer with uniform thickness. The lightest regions in the figures indicate local maximums and the darkest regions indicate local minimums. FIG. 24 shows thickness variations (from −20.2 µm to 15.9 µm), which would be expected for fired multilayer stack that included a variable thickness modified metal particle layer. FIG. 25 shows thickness variations (from −4.9 µm to 5.5 µm), which would be expected for an aluminum particle layer that has uniform thickness. Average peak-to-valley heights were calculated using the program Veeco Vision v4.20 which automatically identifies and averages local maximums and minimums and then subtract the difference. The average peak-to-valley height for the fired multilayer stack in FIG. 24 is 35.54 µm and for the aluminum layer in FIG. 25 is 9.51 µm. In various embodiments, a layer has variable thickness when the average peak-to-valley height is greater than 10 µm, greater than 12 µm, or greater than 15 µm, and a layer has uniform thickness when the average peak-to-valley height is less than 10 µm, less than 12 µm, or less than 15 µm.

In one embodiment of the invention, when the modified intercalation layer of a co-fired variable-thickness multilayer stack, such as the one shown in FIG. 20, is soldered to a tabbing ribbon, it has a peel strength that is twice the peel strength of a fired multilayer stack that does not have variable thickness. In one arrangement, the modified intercalation layer on the surface of such a variable-thickness fired multilayer stack is soldered to a tin-based tabbing ribbon, and they have a peel strength greater than 1.5 N/mm, or greater than 2 N/mm, or greater than 3 N/mm. The thickness variations may be optimized to provide a continuous metal particle layer and back-surface field on the substrate for a silicon solar cell. The thickness variations may be optimized so that the contact resistance for such co-fired variable-thickness multilayer stacks is equivalent to or lower than the contact resistance for approximately planar co-fired multilayer stacks. In an exemplary embodiment, when using an intercalation paste to etch through a dielectric layer, thickness variations in dry and modified metal particle layers include regions that are less than 20 µm, 10 µm, 5 µm, or 2 µm thick.

The variable thickness layer(s) described above, can be used as component(s) in any of the fired multilayer stacks described herein. Variable thickness layer(s), such as variable thickness dried and modified metal particle layers, can be used on any silicon solar cells to reduce buckling of the rear tabbing layer.

Intercalation Pastes as Drop-in Replacements in Silicon Solar Cells

In one embodiment, intercalation paste that contains 45 wt % precious metal particles, 30 wt % intercalating particles, and 25 wt % organic vehicle (Paste C in Table I above) can be used as a drop in replacement to form a rear tabbing layer in a silicon solar cell. Fabrication of p-n junction silicon solar cells is well known in the art. Goodrich et al. provide a full process flow to fabricate a back surface field silicon solar cell, which is referred to as "standard c-Si solar cell." See Goodrich et al. "A wafer-based monocrystalline silicon photovoltaics road map: Utilizing known technology improvement opportunities for further reductions in manufacturing costs", Solar Energy Materials and Solar Cells (2013) pp. 110-135, which is incorporated by reference herein. In one embodiment, a method for fabricating a solar cell electrode includes the steps of providing a silicon wafer with a portion of the front surface covered in at least one dielectric layer, applying an aluminum particle layer onto the back surface of the silicon wafer, drying the aluminum particle layer, applying an intercalation paste (rear tabbing) layer onto a portion of the aluminum particle layer, drying the intercalation paste layer, applying a plurality of fine grid lines and at least one front busbar layer onto the dielectric layer on the front surface of the silicon wafer, drying and co-firing the silicon wafer. Methods such as screen printing, gravure printing, spray deposition, slot coating, 3D printing and/or inkjet printing can be used to apply the various layers. As an example, Ekra or Baccini screen printers can be used to deposit the aluminum particle layer, intercalation paste layer and front side grid lines and busbar layers. In another embodiment, the solar cell has at least one dielectric layer covering at least a portion of the rear surface of the silicon wafer. For a PERC (passivated emitter rear cell) architecture, two dielectric layers (i.e., alumina and silicon nitride) are applied to the rear side of the silicon solar cell prior to the application of the aluminum particle layer. Drying various layers may be done in a belt furnace at temperatures between 150° C. and 300° C. for 30 seconds to 15 minutes. In one arrangement, a Despatch CDF 7210 belt furnace is used to dry and co-fire the silicon solar cells that contain fired multilayer stacks as described herein. In one arrangement, co-firing is done using a rapid heating technique and heating to a temperature greater than 760° C. for between 0.5 and 3 seconds in air, which are common temperature profiles for aluminum back-surface field silicon solar cells. The temperature profile of a wafer is often calibrated using a DataPaq® system with a thermocouple attached to the bare wafer.

Figure 26:
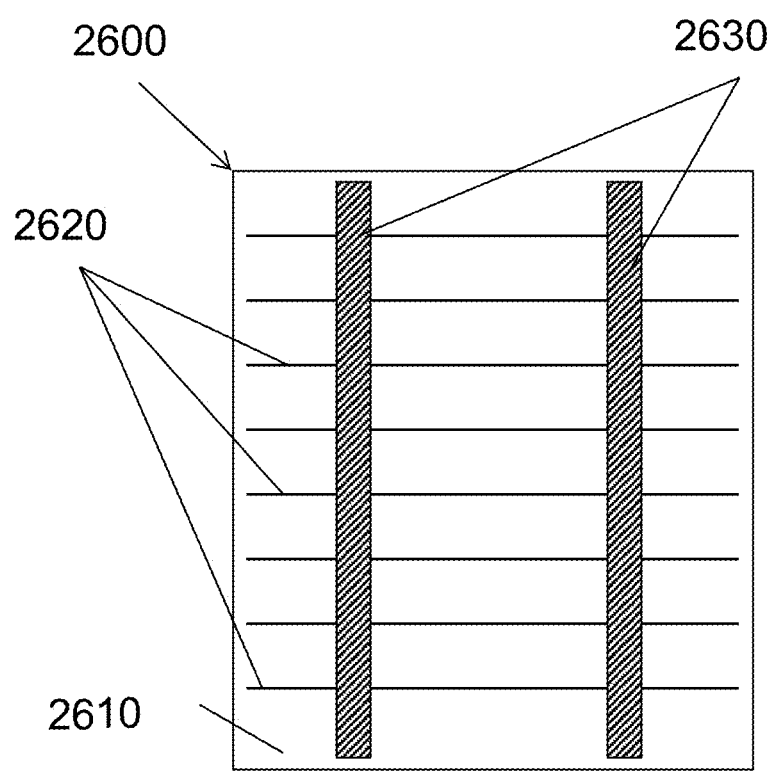
FIG. 26 is a schematic drawing that shows the front (or illuminated) side of a silicon solar cell.

FIG. 26 is a schematic drawing that shows the front (or illuminated) side of a silicon solar cell 2600. The silicon solar cell 2600 has a silicon wafer 2610 with at least one dielectric layer (not shown), on top of which there are fine grid lines 2620 and front side busbars lines 2630. In one embodiment, the dielectric layer on the front side of the silicon wafer contains at least one material selected from the group consisting of silicon, nitrogen, aluminum, oxygen, germanium, hafnium, gallium, composites, and combinations thereof. In another embodiment the dielectric layer on the front side of the silicon wafer is silicon nitride and is less than 200 nm thick. Commercially-available front-side silver metallization pastes that are known in the art can be used to form the fine grid lines 2620 and the front busbar lines 2630. It should be noted that the front side silver layers (i.e., fine grid lines 2620 and front busbar lines 2630 made from silver metallization pastes) may etch through the dielectric layer during co-firing and make direct contact with the silicon wafer 2610. In one embodiment, the silicon wafer 2610 is monocrystalline and doped either n-type or p-type. In another embodiment, the silicon wafer 2610 is multicrystalline and doped either n-type or p-type. In an exemplary embodiment, the substrate is a multicrystalline, p-type silicon wafer with an n-type emitter.

Figure 27:
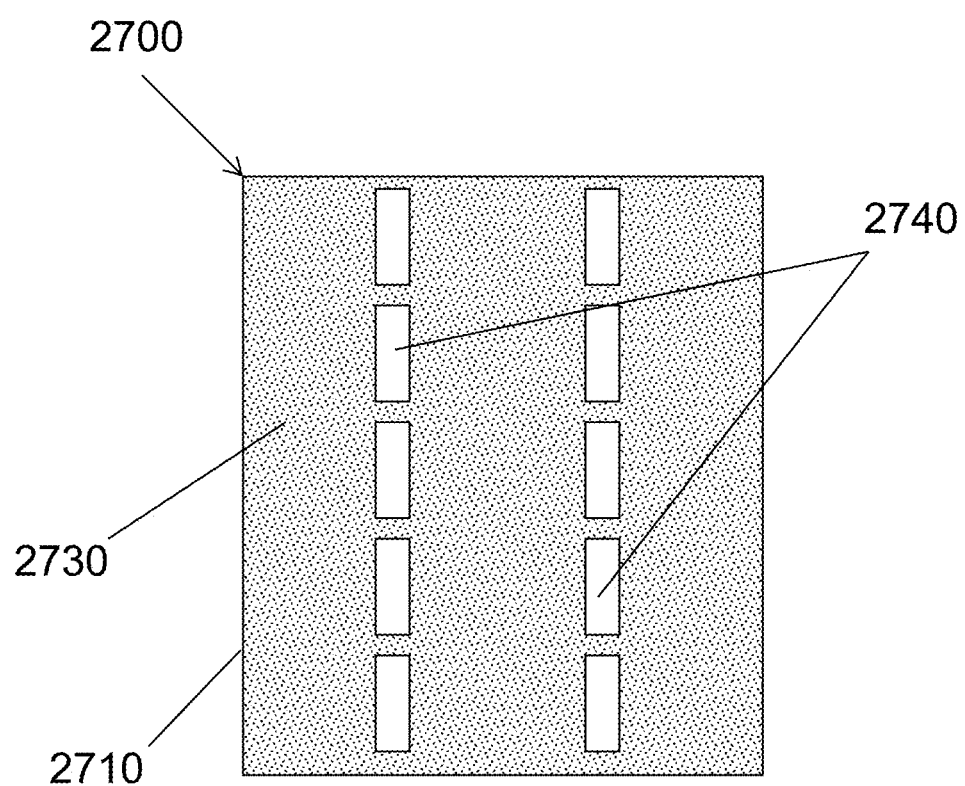
FIG. 27 is a schematic drawing that shows the rear side of a silicon solar cell.

FIG. 27 is a schematic drawing that shows the rear side of a silicon solar cell 2700. The rear side is coated with an aluminum particle layer 2730 and has rear side tabbing layers 2740 distributed over a silicon wafer 2710. In one embodiment, the dielectric layer on the rear side comprises at least one material selected from the group consisting of silicon, nitrogen, aluminum, oxygen, germanium, hafnium, gallium, composites, and combinations thereof on the front surface of the silicon wafer. In another exemplary embodiment the dielectric layer on the front surface of the silicon wafer is silicon nitride and less than 200 nm thick. In one embodiment there is no dielectric layer on the rear side of the silicon wafer. Commercially available aluminum paste that is known in the art can be printed on at least 85%, or at least 90% or at least 95%, or at least 97% of the total surface area of the back of the silicon wafer before firing, which can be described as full Al coverage. The aluminum particle layer (after co-firing) 2730 has an average thickness between 20 and 30 µm. In various embodiments, the aluminum particle layer 2730 has a porosity between 3 and 20%, between 10 and 18%, or any range subsumed therein. For conventional BSF (back surface field) solar cell architectures the rear tabbing layer is applied directly to the silicon wafer. However, to improve power conversion efficiency of the solar cell, it can be useful to print a rear tabbing layer on the aluminum particle layer. In one embodiment, an intercalation layer is applied directly onto a portion of the dried aluminum particle layer to form a rear tabbing layer 2740. FIG. 27 shows one possible pattern for a rear tabbing layer 2740. The intercalation layer and underlying aluminum particle layer are eventually co-fired to form a fired multilayer stack as described herein. In various arrangements, the modified intercalation layer (or rear tabbing layer) 2740 has an average thickness between 1 µm and 20 µm, or between 2 µm and 10 µm, or between 2.5 µm and 8 µm.

A variable thickness metal (aluminum) particle layer, previously described above, can be used on the back side of silicon solar cells to reduce buckling of the rear tabbing layer and to improve adhesion and electrical contact. In one embodiment of the invention, a portion of the rear tabbing layer has variable thickness. In another embodiment of the invention, a portion of the modified aluminum particle layer has variable thickness. In one arrangement, the rear tabbing layer on the surface of such a variable-thickness modified aluminum particle layer is soldered to a tin-based tabbing ribbon, resulting in a peel strength greater than 0.7 N/mm, greater than 1.5 N/mm, greater than 2 N/mm, or greater than 3 N/mm. The thickness variations can be optimized to provide a continuous metal particle layer and back-surface field on the substrate for a silicon solar cell. In another embodiment, in the rear tabbing layer regions, a portion of the combined layer (modified aluminum particle layer and rear tabbing layer) in that region has a thickness that is at least 20%, 30%, or 40% greater than the average combined layer thickness measured over a 1×1 mm area. In another embodiment, in the rear tabbing layer regions, a portion of the combined layer (modified aluminum particle layer and rear tabbing layer) in that region has a thickness that is at least 20%, 30%, or 40% less than the average combined layer thickness as measured over a 1×1 mm area.

In one embodiment of the invention, solar cells that include any of the fired multilayer stacks discussed herein can be incorporated into solar modules. There are many possible solar module designs in which such solar cells be used, as would be known to a person with ordinary skill in the art. The number of solar cells in a module is not intended to be limited. Typically, 60 or 72 solar cells are incorporated into commercially available modules, but it is possible to incorporate more or less depending on the application (i.e., consumer electronics, residential, commercial, utility, etc.). Modules typically contain bypass diodes (not shown), junction boxes (not shown) and a supporting frame (not shown) that do not directly contact the solar cell. Bypass diodes and the junction box may also be considered part of cell interconnects.

Figure 28:
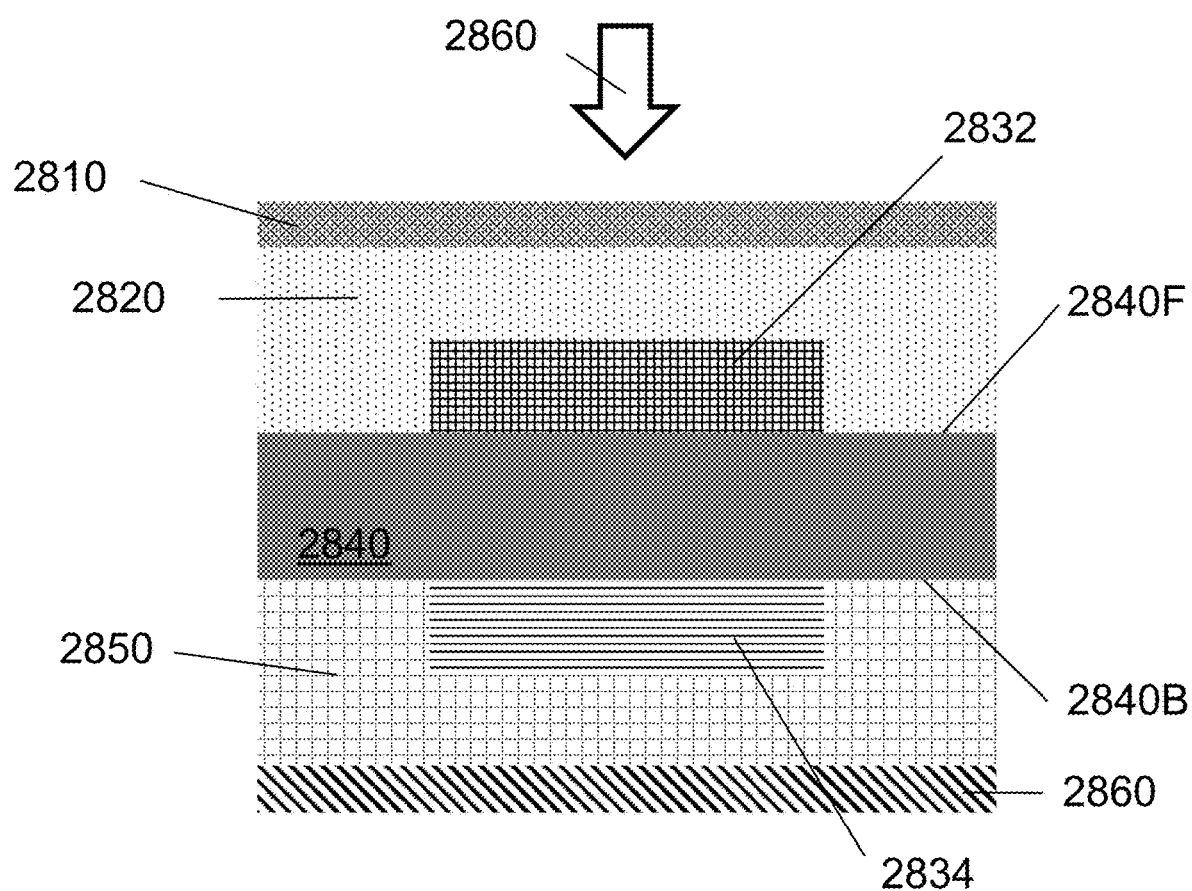
FIG. 28 is a schematic cross-section drawing of a solar cell module that includes a fired multilayer stack, according to an embodiment of the invention.

FIG. 28 is a schematic cross-section drawing that shows a portion of a solar cell module, according to an embodiment of the invention. The solar cell module contains at least one silicon solar cell 2840. A front side 2840F of the silicon solar cell 2840, is attached to a first tabbing ribbon 2832 (which runs into and out of the page), over which there is a front encapsulation layer 2820 and a front sheet 2810. A backside 2840B of the silicon solar cell 2840, is attached to a second tabbing ribbon 2834, over which there is a rear encapsulation layer 2850 and a back sheet 2860. The tabbing ribbons 2832, 2834 contact adjacent solar cells electrically through soldered connections to a front side (i.e., front busbar on the front side) of one cell and to a back side (i.e., rear tabbing layer on the back side) of an adjacent solar cell. Large numbers of solar cells in a solar module can be electrically coupled together using tabbing ribbons as cell interconnects.

Typical cell interconnects include metal tabbing ribbons that are soldered onto solar cells and metal bus ribbons that connect tabbing ribbons. In one embodiment of the invention, a tabbing ribbon is a metal ribbon that has a solder coating. Such a solder-coated tabbing ribbon may have a thickness range of 20 to 1000 µm, 100 to 500 µm, 50 to 300 µm or any range subsumed therein. The width of the solder-coated tabbing ribbon may be between 0.1 and 10 mm, between 0.2 and 1.5 mm, or any range subsumed therein. The length of the tabbing ribbon is determined by application, design, and substrate dimensions. The solder coating may have a thickness between 0.5 and 100 μm, between 10 and 50 μm, or any range subsumed therein. The solder coating may contain tin, lead, silver, bismuth, copper, zinc, antimony, manganese, indium, or alloys, composites, or other combinations thereof. The metal tabbing ribbon may have a thickness between 1 μm and 1000 μm, between 50 and 500 μm, between 75 and 200 μm, or any range subsumed therein. The metal tabbing ribbon may contain copper, aluminum, silver, gold, carbon, tungsten, zinc, iron, tin or alloys, composites, or other combinations thereof. The width of the metal tabbing ribbon may be between 0.1 and 10 mm, between 0.2 and 1.5 mm, or any range subsumed therein. In one embodiment, a tabbing ribbon is a copper ribbon that is 200 μm-thick and 1 mm wide and is coated on all sides with a 20 μm thick tin:lead (60:40 wt %) solder coating.

The front sheet 2810 in FIG. 28 provides some mechanical support to the module and has good optical transmission properties over the portion of the solar spectrum the solar cell 2840 is designed to absorb. Solar modules are positioned so that the front sheet 2810 faces a source of illumination, such as sunlight 2860. The front sheet 2810 is typically made of low-iron content soda-lime glass. The front encapsulant layer 2820 and the back encapsulant layer 2850 protect the solar cell 2840 from electrical, chemical and physical stressors during operation. Encapsulants are typically in the form of polymeric sheets. Examples of materials that can be used as encapsulants include, but are not limited to, ethylene vinyl acetate (EVA), poly-ethylene-co-methacrylic acid (ionomer), polyvinyl butyral (PVB), thermoplastic urethane (TPU), poly-α-olefin, poly-dimethylsiloxan (PDMS), other polysiloxanes (i.e., silicone), and combinations thereof.

The back sheet 2860 provides protection to the solar cell 2840 from the rear side and may or may not be optically transparent. Solar modules are positioned so that the back sheet 2860 faces away from a source of illumination, such as sunlight 2860. A back sheet 2860 may be a multilayer structure made of three polymeric films. DuPont™ Tedlar® polyvinyl fluoride (PVF) films are typically used in the back sheet. Fluoropolymers and polyethylene terephthalates (PET) can also be used in the back sheet. A glass sheet may also be used as the back sheet, which can aid in providing structural support to the solar module. A supporting frame (not shown) may also be used to improve structure support; supporting frames are typically made of aluminum.

In one embodiment of the invention, a method for forming a solar cell module is provided. Solder tabs are applied to individual solar cells (that contain any of the fired multilayer stacks described herein) either manually or by using an automated tabbing or stringing machine. Then the individual cells are electrically connected in series by directly soldering them to a tabbing ribbon. The resulting structure is referred to as a "cell string". Often multiple cell strings are arranged onto a front encapsulation layer that has been applied to a front sheet. These multiple cell strings are connected to one another using bus ribbons to create an electrical circuit. The bus ribbons are wider than the tabbing ribbons used in the cell strings. When the electrical circuit between all cell strings is complete, the rear encapsulation material is applied to the back of the connected cell strings and the back sheet is placed on the rear encapsulation material. The assembly is then sealed using a vacuum lamination process and heated (typically below 200° C.) to polymerize the encapsulating material. A frame is typically attached around the front sheet to provide structural support. Finally, a junction box is connected to the cell interconnects and is attached to the solar module. Bypass diodes may be in the junction box or may be attached inside the module during cell interconnection processing.

In one embodiment of the invention, a method of forming a solar module includes: a) providing at least one solar cell that has a front surface and a back surface; wherein, the back surface comprises a fired multilayer stack, b) soldering a portion of a tabbing ribbon onto a portion of a rear tabbing layer and front busbar layer creating a cell string, c) optionally, soldering tabbing ribbons to bus ribbons to complete the electrical circuit, d) arranging cell strings onto a front encapsulation layer that has been applied to a front sheet, e) applying a rear encapsulation layer to the cell strings and attaching a back sheet to the rear encapsulation layer to form a module assembly, f) laminating the module assembly, g) electrically connecting and physically attaching a junction box.

Figure 29:
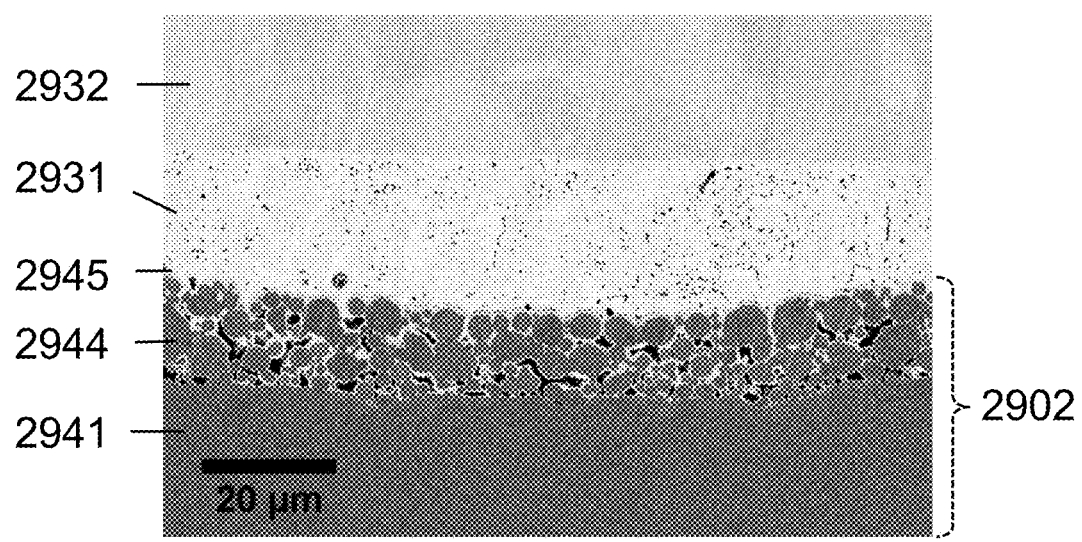
FIG. 29 is a scanning electron micrograph (SEM) cross-section of the back side of a solar cell that includes a fired multilayer stack and a soldered tabbing ribbon, according to an embodiment of the invention.

It is possible to disassemble a solar module to determine if a fired multilayer stack, as described herein, has been incorporated using the following steps. Remove the back sheet and rear encapsulant to expose the tabbed, rear surface of the solar cells. Apply a fast curing epoxy on a tabbing ribbon and surrounding rear surface of the solar cell. Remove the cell from the module after the epoxy has cured and use a diamond saw to cut a section of tabbing ribbon/solar cell. Use an ion mill previously described to polish the cross-section, and perform SEM/EDX to determine if the structure is as described in the embodiments of the invention. FIG. 29 is a polished cross-section SEM image of a back (non-illuminated) side of a solar cell. The sample is from a solar cell (that includes a novel fired multilayer stack) which had been incorporated into a solar module and was then removed as described above. The image shows a metal tabbing ribbon 2932 and its solder coating 2931, which are soldered to a fired multilayer stack 2902. The constituent layers of the fired multilayer stack 2902 are clearly visible. Just below the solder coating 2931 is a modified intercalation layer 2945, a modified metal particle layer 2944, and a silicon substrate 2941. The layers identified in the figure can be more easily identified using EDX.

Other PV Cell Architectures

Intercalation pastes can be used to create a variety of fired multilayer stacks that can be used as metallization layers on the front and back side of many different solar cell architectures. Intercalation pastes and fired multilayer stacks, as disclosed herein, can be used in solar cell architectures that include, but are not limited to, BSF silicon solar cells, passivated emitter and rear contact (PERC) solar cells, and bifacial and interdigitated back contact solar cells.

PERC solar cell architecture improves upon BSF solar cell architecture by reducing back contact surface recombination through the use of a dielectric barrier between the silicon substrate and the back contact. In a PERC cell, a portion of the back side (i.e., non-illuminated) of a silicon wafer is passivated with at least one dielectric layer to reduce electrical current carrier recombination. The novel fired multilayer stacks disclosed herein can be used in PERC solar cells. In one embodiment, a dielectric layer on the back side of a silicon wafer contains at least one of silicon, nitrogen, aluminum, oxygen, germanium, hafnium, gallium, composites, or combinations thereof. In another embodiment, a dielectric layer on the back side of a silicon wafer includes a 10 nm thick alumina layer on the silicon surface and a 75 nm thick silicon nitride layer on the alumina layer. Commonly-used aluminum pastes (e.g., Monocrystal EFX- 39, EFX-85) designed for PERC cells do not penetrate through the dielectric layer(s). In order for an aluminum particle layer to chemically interact and make ohmic contact to silicon, small some regions of the dielectric layer are removed via laser ablation prior to deposition of the aluminum particle layer.

PERL (passivated emitter with rear locally diffused) and PERT (passivated emitter, rear totally diffused) are two variations of PERC cell architecture that further improve device performance. Both of these variations rely on doping the rear part of the silicon substrate to further suppress recombination at the rear contact, which serves a role analogous to the back surface field in BSF cells. In a PERL cell, the backside of the silicon substrate is doped around the opening in the dielectric that makes contact with the rear aluminum layer. Doping is usually achieved by diffusing a dopant through the dielectric openings using a boron compound or aluminum from the aluminum particles that make up the rear contact, similar to the BSF fabrication process. A PERT cell is similar PERL, but the entire silicon in contact with the rear dielectric layer is doped in addition to the silicon adjacent to the dielectric openings that contact the rear contact.

In one embodiment, an intercalation paste, which contains intercalating particles that do not etch through dielectric layer(s) is used as the rear tabbing layer on PERC, PERL, or PERT cells. The "non-etching" intercalation paste is used both to provide a solderable silver surface and to mechanically strengthen the underlying (modified) aluminum particle layer. The resulting fired multilayer stack contains a silicon wafer, which is covered with at least one dielectric layer, a modified aluminum particle layer and a modified intercalation layer; for PERL or PERT, the silicon is doped only at the dielectric openings or also across the dielectric interface, respectively. Using non-etching intercalation pastes can further reduce etching of the dielectric layer(s) and reduce surface recombination. For example, busbar pastes that are conventionally used for the rear tabbing layer in PERC cells are printed directly onto the dielectric layer and partially etch through the dielectric layer, which increases the surface recombination, during co-firing.

For cells that use rear dielectric layers (i.e., PERC, PERL, PERT), intercalation pastes can be modified to etch through the dielectric layers and assist in the diffused doping of silicon regions at the dielectric openings, according to an embodiment of the invention. The "etching" intercalation paste (e.g., intercalation paste D in Table I) is used to provide a solderable silver surface, mechanically strengthen the underlying (modified) aluminum particle layer, and etch through the dielectric layer, exposing the silicon surface to the aluminum particles, which can lead to aluminum doping of the exposed silicon. The resulting fired multilayer stack contains the silicon wafer, a modified aluminum particle layer and a modified intercalation layer. The fired multilayer stack may further include an Al-doped region near the silicon surface (similar to the back-surface field in BSF cells) and a solid silicon-aluminum eutectic layer at the interface between the silicon wafer and the modified aluminum particle layer. Using intercalation pastes to etch through the dielectric layer(s) has several advantages. First, it is an inexpensive alternative to a laser ablation step, which has proven to be costly and unreliable in the past. Second, laser ablation can often remove tens to hundreds of microns of silicon substrate material and can result in large void formation between the silicon substrate and the aluminum particle layer when the wafer is co-fired. The etching intercalation paste does not cause changes in the wafer surface prior to co-firing, which results in better bond formation, reduced void formation, and better reproducibility than when laser ablation is used.

Intercalation pastes can be used to provide a solderable surface for cell architectures that depend on aluminum particle layers to make ohmic contact to p-type silicon, according to an embodiment of the invention. Examples of these architectures include interdigitated back contact solar cells, n-type BSF cell architectures and bifacial solar cells. In one embodiment, intercalation paste C (from Table I) is applied to an Al layer on interdigitated back contact solar architecture, such as a Zebra cell. For n-type BSF architectures, which have obtained 20% power conversion efficiencies for fully Al covered cells, intercalation pastes can replace conventional rear tabbing Ag pastes that directly contact silicon, thereby reducing the $V_{oc}$ of the solar cell. In several n-type wafer based solar cell architectures, the intercalation paste may be used on the front side (i.e., illuminated side). Intercalation pastes can also be used in conjunction with Al pastes to reduce the cost of bifacial solar cells. Currently bifacial solar cell architectures use Ag pastes that contain a small quantity of aluminum (i.e., less than 5 wt % Al) to make ohmic contact to p-type silicon layer. The current bifacial architecture uses almost twice the amount of silver as the BSF architecture, which can be cost prohibitive. It can be useful to use pure aluminum pastes in bifacial architectures, but Al is not solderable. Intercalation paste containing silver (e.g., Paste C in Table I) can be printed on Al pastes in the bifacial design and provide both mechanical stability and a solderable surface while reducing the amount of Ag used.

Materials Properties of Fired Multilayer Stacks and Impact on Silicon Solar Cells Material properties of interest in fired multilayer stacks for use in solar cells and other electronic devices include solderability, peel strength, and contact resistance.

Solderability is the ability to form a strong physical bond between two metal surfaces by the flow of a molten metal solder between them at temperatures below 400° C. Soldering on the modified intercalation layer of a fired multilayer stack may be performed after heating in air to over 650° C. Soldering involves the use of flux, which is any chemical agent that cleans or etches one or both of the surfaces prior to reflow of the molten solder. Solder fluxes typically used for solar cells, designated as either RMA (e.g., Kester® 186) or R (e.g., Kester® 952), are deposited on the tabbing ribbon and dried at 70° C. These fluxes are not effective at etching many metal oxides such as alumina ($Al_2O_3$), which forms on aluminum particles when fired in air.

Peel strength is a metric of solder joint strength and an indicator of reliability for integrated circuit, light emitting diode and solar cell applications. A solder coated metal ribbon, which is between 0.8 and 20 mm wide and 100-300 μm thick can be dipped into flux and dried. It is put on the modified intercalation layer and can be soldered using a solder iron at a temperature between 200° and 400° C. The peel strength is the force required to peel a soldered ribbon, at a 180° angle from the soldering direction, divided by the width of the soldered ribbon, for a given peel rate. The solder joints formed during the soldering process have a mean peel strength that is greater than 1 N/mm (e.g., a 2 mm tabbing ribbon would require a peel force of greater than 2N to dislodge the tabbing ribbon) at 1 mm/sec. Solar cells are electrically connected by tabbing ribbons, which are soldered to the front busbars of one cell and the rear tabbing layers of an adjacent cell. It is common for the peel strength to be between 1.5 and 4 N/mm on contacts to the tabbing ribbons in commercially available solar cells. When using a fired multilayer stack as the rear tabbing layer, a primary failure mode can be near the Al—Si interface, which can be determined using plan view SEM/EDX. In an exemplary embodiment, the peel strength is greater than 1 N/mm when the silver rich sublayer layer (of the modified intercalation layer) is soldered with a tin based tabbing ribbon.

Meier et al. describe how to use a four-point probe electrical measurement to determine the resistivity of each metallization layer on a completed solar cell. See Meier et al. "Determining components of series resistance from measurements on a finished cell", IEEE (2006) pp. 2615, which is included by reference herein. The bulk resistance of a metallization layer is directly related to the bulk resistance of the material from which it is made. In one embodiment of the invention, the bulk resistance of pure Ag is $1.5 \times 10^{-8}$ $\Omega$-m; pure Ag metallization layers used on industrial solar cells have a bulk resistance that is 1.5 times to 5 times higher than the bulk resistance of pure Ag. The bulk resistance is important for fine grid lines, which must transport current over a relatively long (i.e., more than 1 cm) length. The resistance of the front busbars and rear tabbing layers are less important when the cells are tabbed in a module.

In most integrated circuits, LED and solar cell architectures, electrical current flows from a metal particle layer through a modified metal particle layer and into a modified intercalation layer. For fired multilayer stacks, the contact resistance between these three layers can play an important role in device performance. The contact resistance between these layers in the fired multilayer stack can be measured by using the transmission line measurement (TLM) (Reference: Meier et al. "Cu Backside Busbar Tape: Eliminating Ag and Enabling Full Al coverage in Crystalline Silicon Solar Cells and Modules", IEEE PVSC (2015) pp. 1-6). The TLM is plotted as resistance versus distance between electrodes. TLM was used specifically to measure the contact resistance 1) between a metal particle layer and a modified metal particle layer and 2) between a modified metal particle layer and a modified intercalation layer. The contact resistance of a fired multilayer stack is the sum of contact resistances 1) and 2) above. The contact resistance of a fired multilayer stack is half of the y-intercept value of a linear fit of the resistance vs. distance measurements. The electrical resistance between busbars was measured using a Keithley 2410 Sourcemeter in a four-point probe setup that sourced current between −0.5 A and +0.5 A and measured the voltage. In various embodiments, the contact resistance of a fired multilayer stack is between 0 and 5 mOhm, 0.25 and 3 mOhm, 0.3 and 1 mOhm, or any range subsumed therein. The sheet resistance of a metal particle layer is determined by the slope of the line times the length of the electrodes. The contact resistance and sheet resistance are used to numerically determine the transfer length and subsequently the contact resistivity. The change in series resistance is determined by dividing the contact resistivity by the fractional area coverage of the modified intercalation layer. In various embodiments the change in series resistance is less than 0.200 $\Omega$-cm$^2$, less than 0.100 $\Omega$-cm$^2$, less than 0.050 $\Omega$-cm$^2$, less than 0.010 $\Omega$-cm$^2$, or less than 0.001 $\Omega$-cm$^2$.

Figure 30:
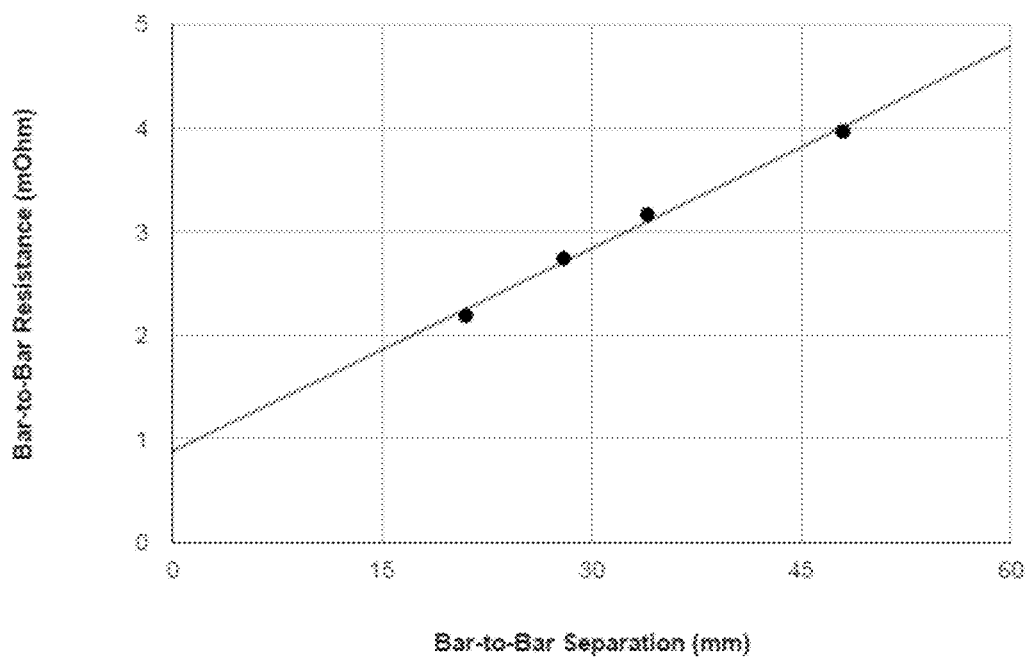
FIG. 30 is a transmission line measurement plot of a conventional silver rear tabbing layer on silicon.
Figure 31:
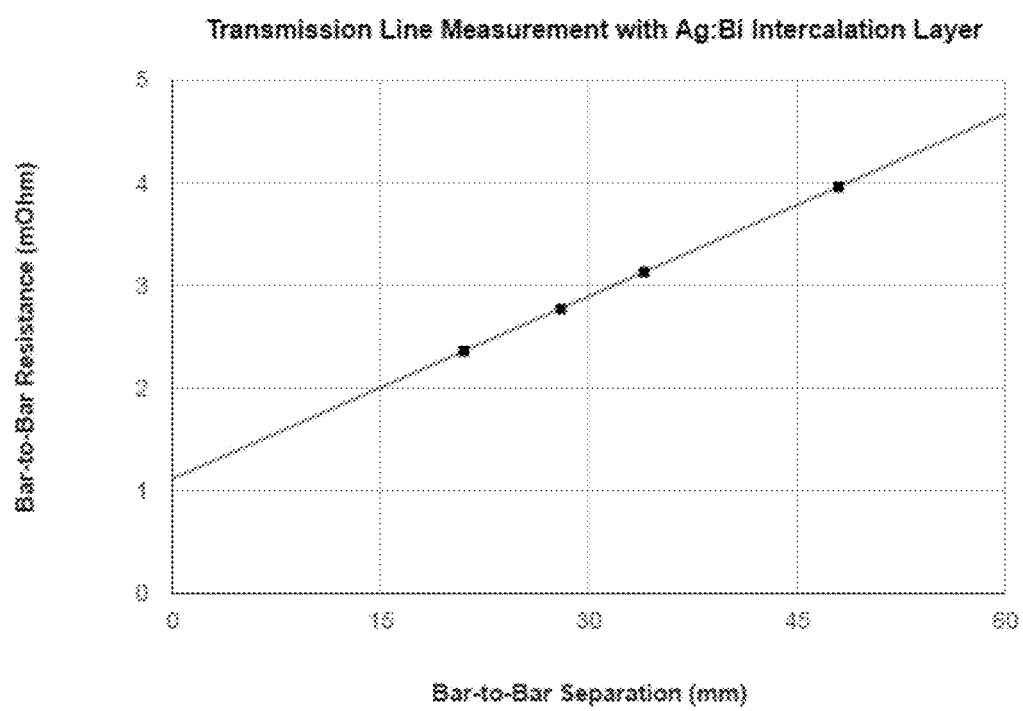
FIG. 31 is a transmission line measurement plot of an silver-bismuth intercalation layer on an aluminum particle layer that can be used as a rear tabbing layer on silicon.

The contact resistance between a rear tabbing layer and an aluminum particle layer can affect the series resistance and power conversion efficiency of a solar cell. Such contact resistances can be measured by transmission line measurements. A transmission line plot of a conventional silver rear tabbing layer on silicon with 300 μm overlap with an aluminum particle layer is shown in FIG. 30. A transmission line plot of a modified intercalation layer, used as a rear tabbing layer, on an aluminum particle layer is shown in FIG. 31. The y-intercept value in FIG. 31 is 1.11 mOhm as compared with a y-intercept value of 0.88 in FIG. 30. The contact resistance between a rear tabbing (intercalation) layer and an aluminum particle layer is 0.56 mOhm. The contact resistance for a conventional rear tabbing architecture is 0.44 mOhm. In various embodiments, the contact resistance between a rear tabbing (intercalation) layer and an aluminum particle layer is between 0 and 5 mOhm, between 0.25 and 3 mOhm, or between 0.3 and 1 mOhm, or any range subsumed therein. The sheet resistance of an aluminum layer is determined by the slope of the line times the length of the electrode and is approximately 9 mOhm/square in FIGS. 30 and 31.

Although TLM is a preferred method to accurately extract the contact resistance of a fired multilayer stack (i.e., rear tabbing layer and aluminum particle layer), it is possible to determine the contact resistance on a complete solar cell by using a four-point probe method. The method is used by first measuring the resistance between two rear tabbing layers ($R_{Ag-to-Ag}$) and subsequently by moving the probes on to the Al particle layer (within 1 mm of the rear tabbing layer) to get $R_{Al-to-Al}$. The contact resistance is determined by subtracting $R_{Ag-to-Ag}$ from $R_{Al-to-Al}$ and dividing by two. This is not as accurate as TLM measurements but it can be approximate to within 0.50 mOhm when averaging over measurements from multiple solar cells.

Contact resistance and sheet resistance are used to determine numerically the transfer length and subsequently the contact resistivity. In FIG. 31, the transfer length of a co-fired multilayer stack is 5 mm and the contact resistance is 2.2 m$\Omega$. The change in series resistance can be estimated by dividing this number by the fractional area coverage of the intercalation layer. In FIG. 31, the estimated change in series resistance is 0.023 $\Omega$-cm$^2$, which is equivalent to an estimated change in series resistance of 0.020 $\Omega$-cm$^2$ calculated for the conventional rear tabbing layer that was measured in FIG. 30. The change in series resistance can be directly measured by fabricating a control BSF (back surface field) silicon solar cell with full Al coverage and no rear tabbing layer and fabricating a BSF silicon solar cell with full Al coverage and the Ag:Bi intercalation layer. The series resistance of the cells can be derived through the current-voltage curves under various light intensities and the difference in series resistances can be ascribed to the increased contact resistance between the rear tabbing and the fired aluminum particle layer. In various embodiments, the change in series resistance in the solar cell is less than 0.200 $\Omega$-cm$^2$, less than 0.100 $\Omega$-cm$^2$, less than 0.050 $\Omega$-cm$^2$, less than 0.010 $\Omega$-cm$^2$, or less than 0.001 $\Omega$-cm$^2$.

One benefit of using an intercalation layer on a silicon solar cell is the improvement in open-circuit voltage ($V_{oc}$) caused by continuous back surface field formation in the silicon wafer. The $V_{oc}$ gain can be directly measured by comparing a conventional BSF solar cell to the BSF solar cell containing the Ag:Bi intercalation paste, as described herein, when both devices have the same rear busbar surface area. The conventional BSF silicon solar cell is fabricated with the silver based rear tabbing paste printed directly onto a silicon wafer and surrounded by the aluminum particle layer. The intercalation layer (e.g., fabricated using intercalation paste C) can be used on silicon solar cells that have full Al surface coverage. The $V_{oc}$ of both solar cells are measured through the current-voltage testing under one sun light intensity. For solar cells that have more than 5 cm$^2$ of rear tabbing surface area, the $V_{oc}$ may be increased by at least 0.5 mV, by at least 1 mV, by at least 2 mV, or by at least 4 mV when using an intercalation layer versus a conventional, rear tabbing layer on silicon architecture. Finally, the short-circuit current density ($J_{sc}$) and the fill factor may also be improved when using the intercalation layer architecture instead of the conventional rear tabbing design. Silver does not make ohmic contact to p-type silicon. A silver tabbing layer directly on p-type silicon reduces current collection which can estimated by performing electroluminescence or photoluminescence measurements on complete or incomplete solar cells. The increase in $J_{sc}$ can also be measured by testing cells with the intercalation architecture versus the rear tabbing layer directly on silicon. Another benefit is an increase in the fill factor, which can be positively changed due to an increase in the $V_{oc}$, a reduction in contact resistance, and/or changes in the recombination dynamics on the rear side of the solar cell.

It is to be understood that the inventions described herein can be carried out by different equipment, materials and devices, and that various modifications, both as to the equipment and operating procedures, can be accomplished without departing from the scope of the invention itself.

We claim:

1. A sintering paste consisting essentially of:
   between 10 wt % and 70 wt % precious metal particles;
   at least 12.5 wt % intercalating particles consisting of low temperature base metal particles and/or crystalline metal oxide particles; and
   organic vehicle;
   wherein a weight ratio of the intercalating particles to the precious metal particles is at least 1:4 (0.25); and
   wherein the wt % is based on the total weight of the paste.

2. The paste of claim 1, wherein the precious metal particles comprise at least one material selected from the group consisting of gold, silver, platinum, palladium, rhodium, and alloys, composites, and other combinations thereof.

3. The paste of claim 1, wherein the precious metal particles have a D50 between 100 nm and 50 μm.

4. The paste of claim 1, wherein the precious metal particles have a specific surface area between 0.4 and 7.0 m²/g.

5. The paste of claim 1, wherein a portion of the precious metal particles has a shape selected from the group consisting of spherical shapes, flake shapes, and elongated shapes.

6. The paste of claim 1, wherein at least one of the precious metal particles and the intercalating particles has a unimodal size distribution.

7. The paste of claim 1, wherein at least one of the precious metal particles and the intercalating particles has a multimodal size distribution.

8. The paste of claim 1, wherein at least some of the precious metal particles are silver and have a D50 between 300 nm and 2.5 μm and a specific surface area between 1.0 and 3.0 m²/g.

9. The paste of claim 1, wherein the intercalating particles have a D50 between 100 nm and 50 μm.

10. The paste of claim 1, wherein the intercalating particles have a specific surface area between 0.1 and 6.0 m²/g.

11. The paste of claim 1, wherein a portion of the intercalating particles has a shape selected from the group consisting of spherical shapes, flake shapes, and elongated shapes.

12. The paste of claim 1, wherein the low temperature base metal particles comprise a material selected from the group consisting of bismuth, tin, tellurium, antimony, lead, and alloys, composites, and other combinations thereof.

13. The paste of claim 12, wherein the low temperature base metal particles comprise bismuth and have a D50 between 1.5 and 4.0 μm and a specific surface area between 1.0 and 2.0 m²/g.

14. The paste of claim 1, wherein the intercalating particles comprise low temperature base metal particles, and at least one of the low temperature base metal particles comprises a bismuth core particle surrounded by a single shell that comprises a material selected from the group consisting of silver, nickel, nickel-boron, tin, tellurium, antimony, lead, molybdenum, titanium, and alloys, composites, and other combinations thereof.

15. The paste of claim 1, wherein the intercalating particles comprise low temperature base metal particles, and at least one of the low temperature base metal particles comprises a bismuth core particle surrounded by a single shell that comprises a material selected from the group consisting of silicon oxides, magnesium oxides, boron oxides, and any combination thereof.

16. The paste of claim 1, wherein the crystalline metal oxide particles comprise oxygen and a metal selected from the group consisting of bismuth, tin, tellurium, antimony, lead, vanadium, chromium, molybdenum, boron, manganese, cobalt, and alloys, composites and other combinations thereof.

17. The paste of claim 1, wherein the paste has a solids loading between 30 wt % and 80 wt %.

18. The paste of claim 1, wherein the intercalating particles comprise at least 15 wt % of the paste.

19. The paste of claim 1, wherein the paste has a viscosity between 10,000 and 200,000 cP at 25° C. at a sheer rate of 4 sec⁻¹.

20. A paste comprising:
   45 wt % Ag particles;
   30 wt % bismuth particles; and
   25 wt % organic vehicle;
   wherein a weight ratio of the bismuth particles to the Ag particles is at least 1:4 (0.25); and
   wherein the wt % is based on the total weight of the paste.

21. A paste comprising:
   30 wt % Ag particles;
   20 wt % bismuth particles; and
   50 wt % organic vehicle;
   wherein a weight ratio of the bismuth particles to the Ag particles is at least 1:4 (0.25); and
   wherein the wt % is based on the total weight of the paste.

22. A sintering paste consisting essentially of:
   between 10 wt % and 70 wt % silver particles;
   at least 10 wt % bismuth metal particles; and
   organic vehicle;
   wherein a weight ratio of the bismuth metal particles to the silver particles is at least 1:4 (0.25); and
   wherein the wt % is based on the total weight of the paste.

23. A sintering paste consisting essentially of:
   between 10 wt % and 70 wt % silver particles;
   at least 10 wt % crystalline bismuth oxide particles; and
   organic vehicle;
   wherein the wt % is based on the total weight of the paste.

24. A sintering paste comprising:
   between 10 wt % and 70 wt % precious metal particles;
   at least 12.5 wt % intercalating particles consisting of low temperature base metal particles and/or crystalline metal oxide particles; and
   organic vehicle;
   wherein a weight ratio of the intercalating particles to the precious metal particles is at least 1:4 (0.25);

wherein the wt % is based on the total weight of the paste; and wherein the paste contains no photosensitive species.

25. The sintering paste of claim 24, further comprising glass frit particles.

26. The paste of claim 25, wherein the glass frit particles comprise a material selected from the group consisting of antimony, arsenic, barium, bismuth, boron, cadmium, calcium, cerium, cesium, chromium, cobalt, fluorine, gallium, germanium, hafnium, indium, iodine, iron, lanthanum, lead, lithium, magnesium, manganese, molybdenum, niobium, potassium, rhenium, selenium, silicon, sodium, strontium, tellurium, tin, vanadium, zinc, zirconium, alloys thereof, oxides thereof, composites thereof, and other combinations thereof.

* * * * *